(12) United States Patent
Gocho et al.

(10) Patent No.: US 12,389,647 B2
(45) Date of Patent: *Aug. 12, 2025

(54) SEMICONDUCTOR DEVICE INCLUDING A FIELD EFFECT TRANSISTOR WITH NANOSTRUCTURE BASED LAMINATED CHANNEL STRUCTURE AND A FIELD EFFECT TRANSISTOR WITH A SINGLE CHANNEL STRUCTURE

(71) Applicant: SONY SEMICONDUCTOR SOLUTIONS CORPORATION, Kanagawa (JP)

(72) Inventors: Tetsuo Gocho, Kanagawa (JP); Yuzo Fukuzaki, Kanagawa (JP); Shinichi Miyake, Kanagawa (JP); Kazuyuki Tomida, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/618,329

(22) Filed: Mar. 27, 2024

(65) Prior Publication Data
US 2024/0243173 A1 Jul. 18, 2024

Related U.S. Application Data

(63) Continuation of application No. 17/943,337, filed on Sep. 13, 2022, now Pat. No. 11,961,885, which is a
(Continued)

(30) Foreign Application Priority Data

Jul. 26, 2018 (JP) ................................ 2018-140217

(51) Int. Cl.
*H10D 62/10* (2025.01)
*H10D 30/43* (2025.01)
(Continued)

(52) U.S. Cl.
CPC ........... *H10D 62/121* (2025.01); *H10D 30/43* (2025.01); *H10D 62/235* (2025.01); *H10D 84/83* (2025.01)

(58) Field of Classification Search
CPC ........... H01L 29/0673; H01L 29/78696; H01L 29/66545; H01L 27/0922; H01L 29/42392;
(Continued)

(56) References Cited

U.S. PATENT DOCUMENTS 11,476,329 B2 * 10/2022 Gocho ................ H01L 29/0649
2011/0062417 A1 3/2011 Iwayama et al.
(Continued)

FOREIGN PATENT DOCUMENTS

JP 2011-006151 1/2011
JP 2015-195405 11/2015
(Continued)

OTHER PUBLICATIONS

International Search Report and Written Opinion for International (PCT) Patent Application No. PCT/JP2019/024075, dated Aug. 20, 2019, 7 pages.
(Continued)

*Primary Examiner* — Changhyun Yi
(74) *Attorney, Agent, or Firm* — Sheridan Ross PC

(57) ABSTRACT

A semiconductor device includes a base, a first FET that includes at least two channel structure portions laminated, the channel structure portions each including a channel portion having a nanowire structure, a gate insulation film, and a gate electrode, and a second FET that includes a channel forming layer, a gate insulation layer, and a gate electrode. The first FET and the second FET are provided above the base. The channel portions of the first FET are disposed apart from each other in a laminating direction of
(Continued)

the channel structure portions. Assuming that each of a distance between the channel portions of the first FET is a distance L1 and that a thickness of the gate insulation layer of the second FET is a thickness T2, $T2 \geq (L1/2)$ is satisfied.

15 Claims, 50 Drawing Sheets

Related U.S. Application Data continuation of application No. 17/261,226, filed as application No. PCT/JP2019/024075 on Jun. 18, 2019, now Pat. No. 11,476,329.

(51) Int. Cl.
*H10D 62/17* (2025.01)
*H10D 84/83* (2025.01)

(58) Field of Classification Search
CPC .......... H01L 2029/7858; H01L 27/088; H01L 29/775; H01L 21/823462; H01L 29/1033; H01L 21/823857; H01L 29/66439; H10D 62/121; H10D 30/6735; H10D 62/235; H10D 84/83
See application file for complete search history.

(56) References Cited

U.S. PATENT DOCUMENTS

| | | |
|---|---|---|
| 2013/0270512 A1 | 10/2013 | Radosavljevic et al. |
| 2014/0151639 A1 | 6/2014 | Chang et al. |
| 2018/0082902 A1 | 3/2018 | Balakrishnan et al. |
| 2018/0097088 A1 | 4/2018 | Seo |
| 2018/0151452 A1 | 5/2018 | Doornbos et al. |
| 2023/0006042 A1 | 1/2023 | Gocho et al. |

FOREIGN PATENT DOCUMENTS

| | | |
|---|---|---|
| KR | 20150033496 A | 4/2015 |
| KR | 20170102701 A | 9/2017 |
| TW | 201736249 | 10/2017 |
| WO | WO 2013/095341 | 6/2013 |

OTHER PUBLICATIONS

Official Action for U.S. Appl. No. 17/261,226, dated Mar. 1, 2022, 9 pages.
Notice of Allowance for U.S. Appl. No. 17/261,226, dated Jun. 10, 2022, 8 pages.
Official Action for U.S. Appl. No. 17/943,337, dated Aug. 7, 2023, 9 pages.
Notice of Allowance for U.S. Appl. No. 17/943,337, dated Dec. 15, 2023, 8 pages.

* cited by examiner

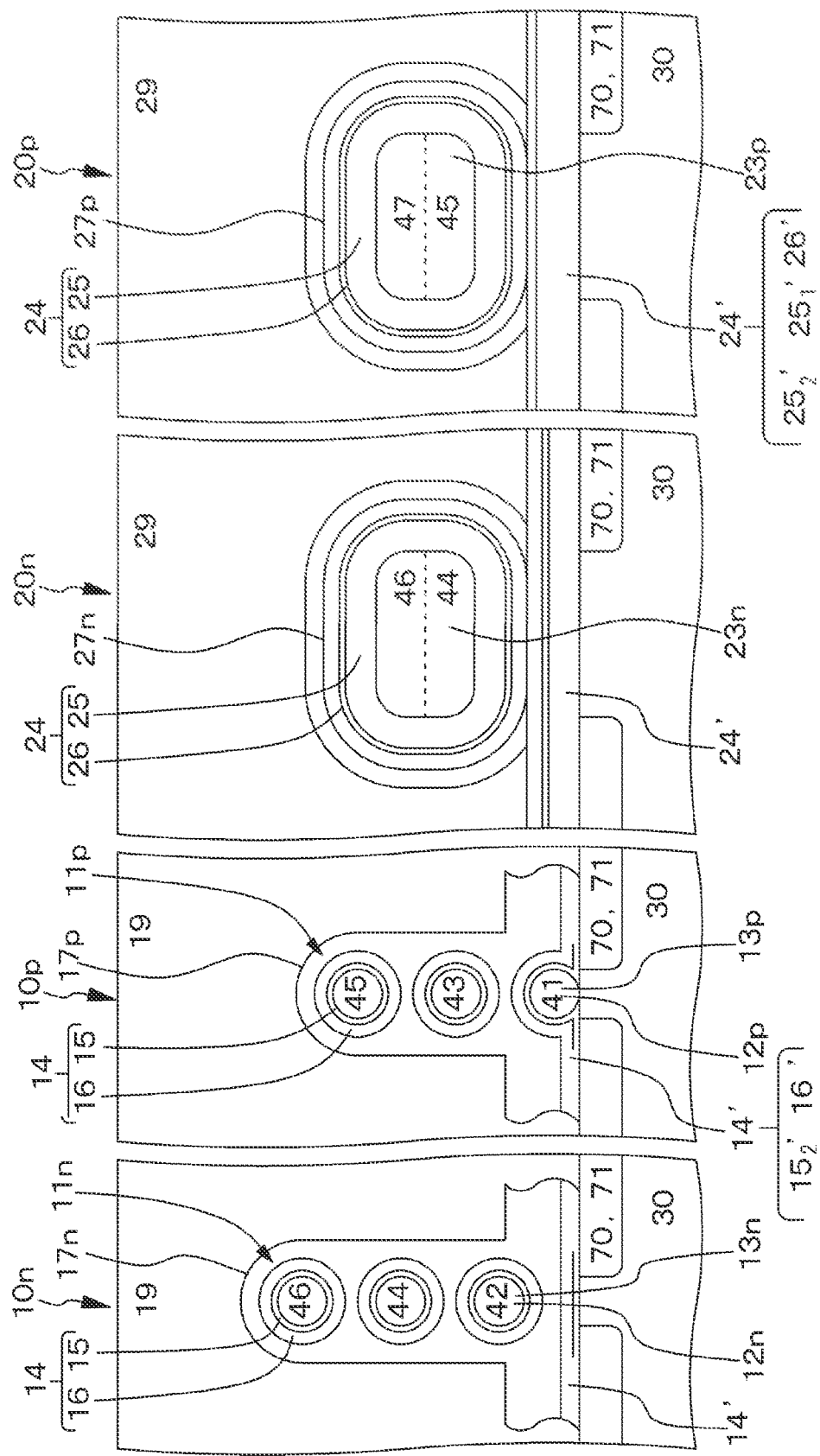

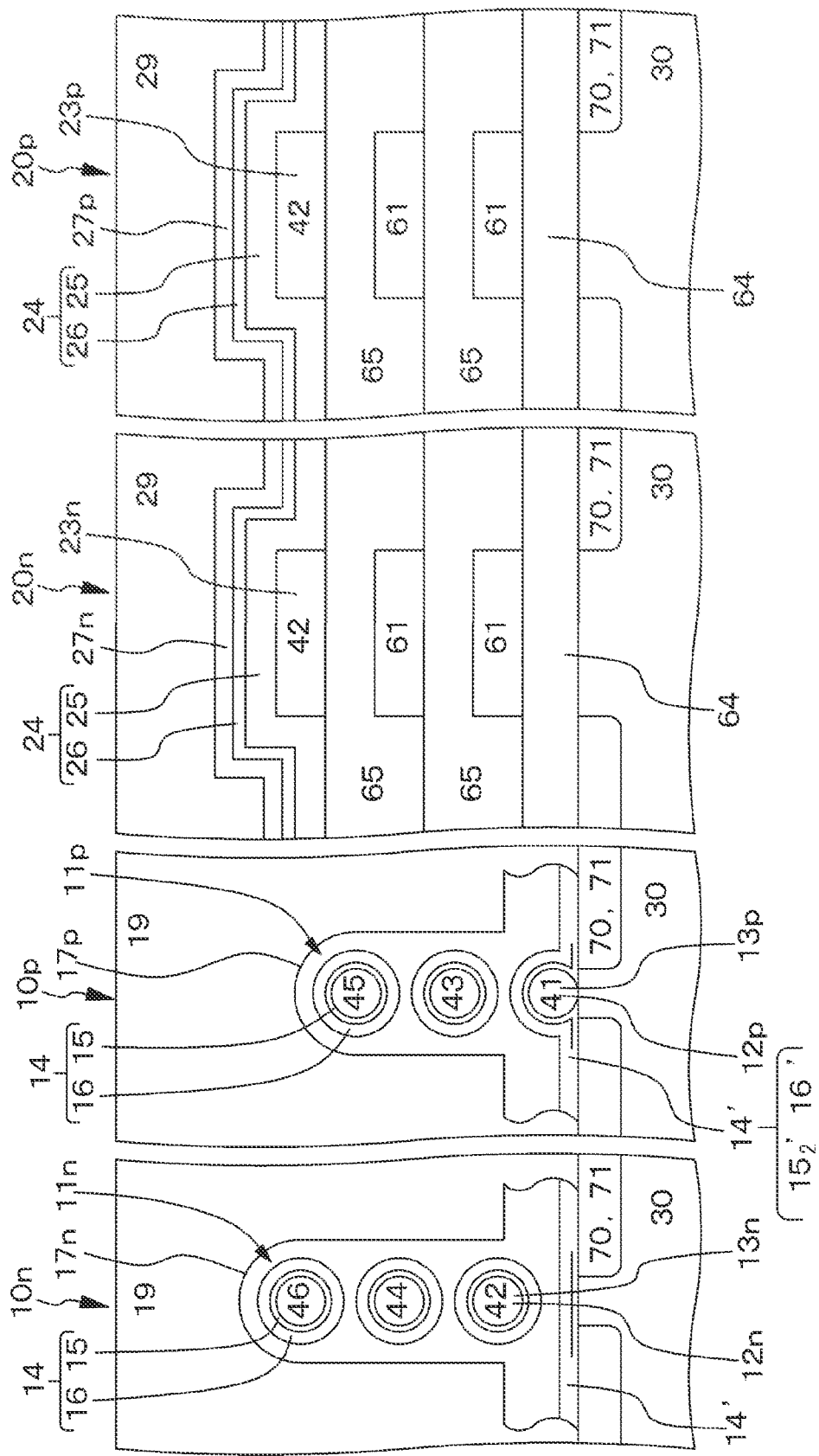

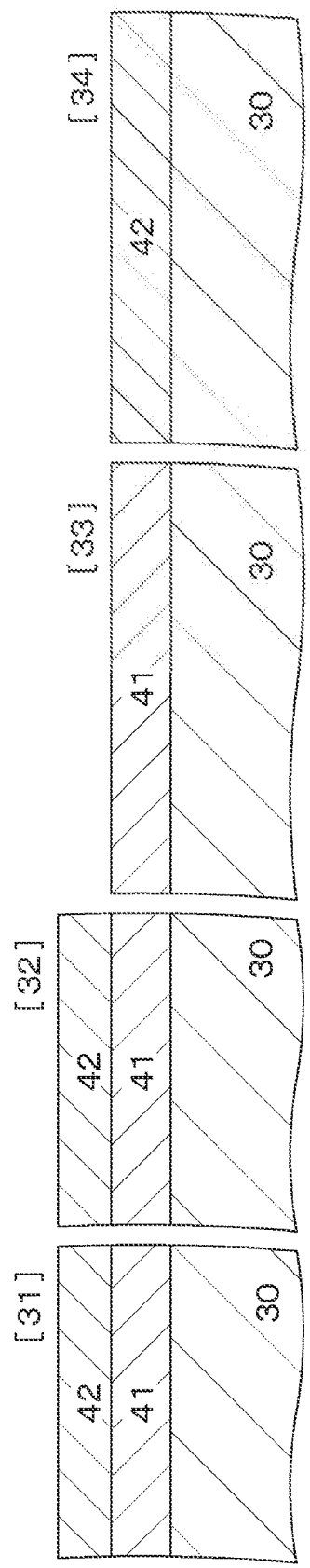
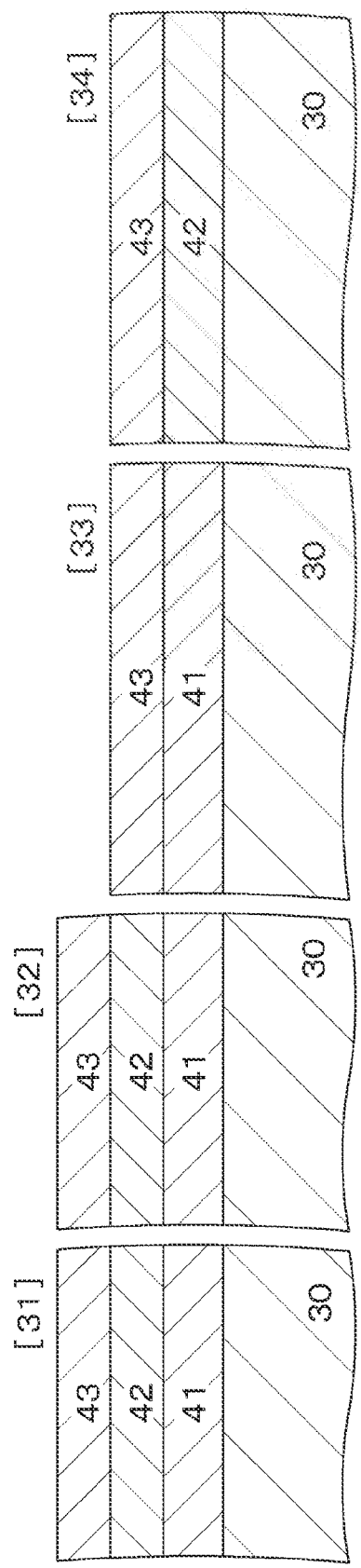
FIG. 9A
FIG. 9B

FIG.19
(A)
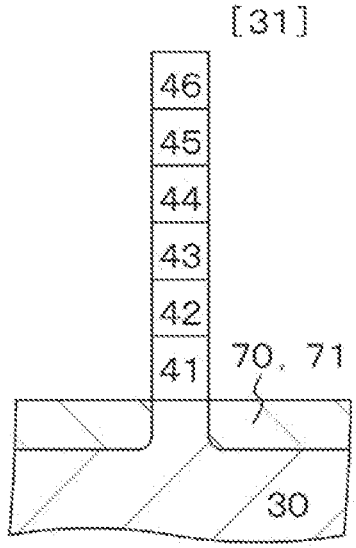
(B)
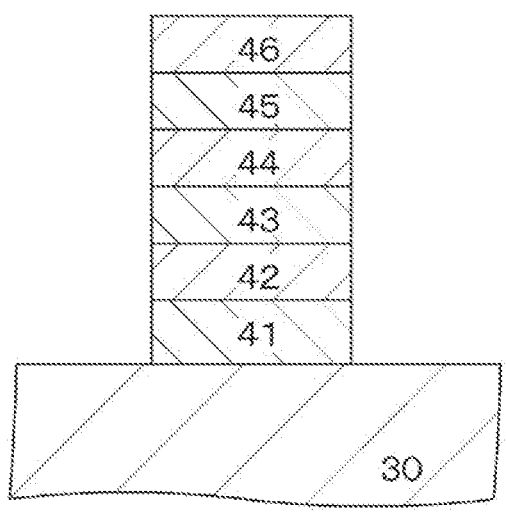
(C)
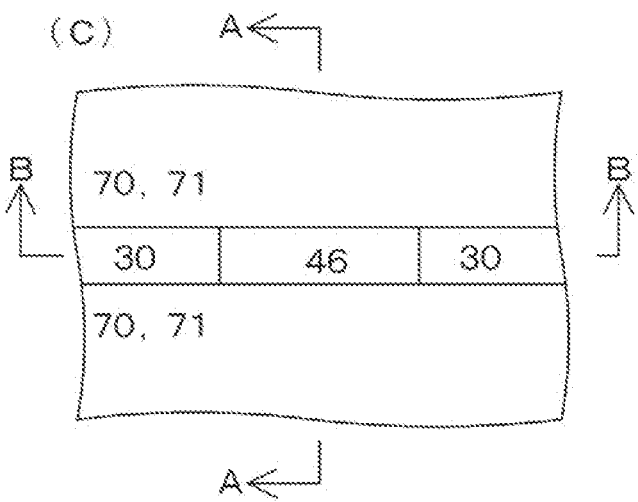

FIG.20
(A)
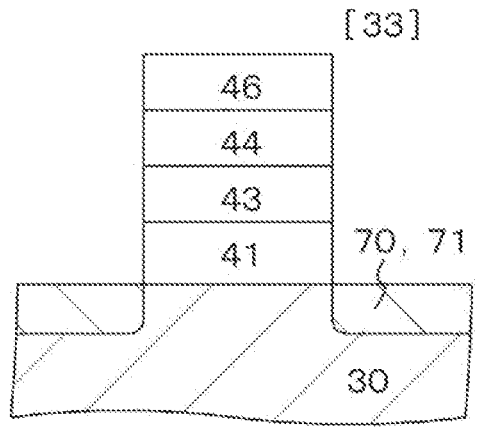
[33]
(B)
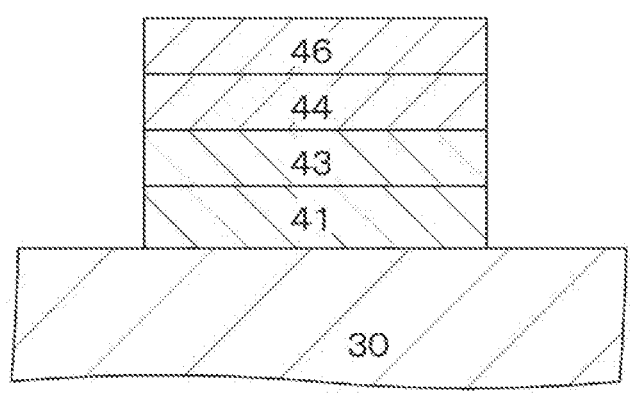
(C)
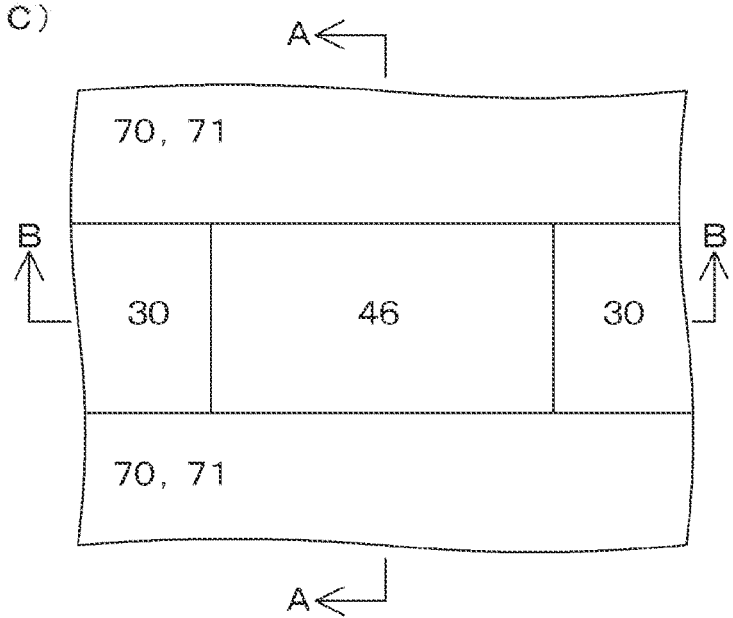

FIG.21
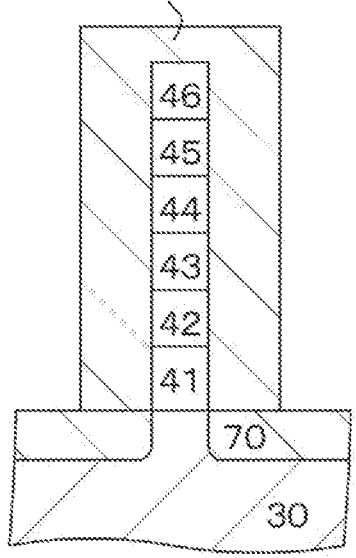
(A)
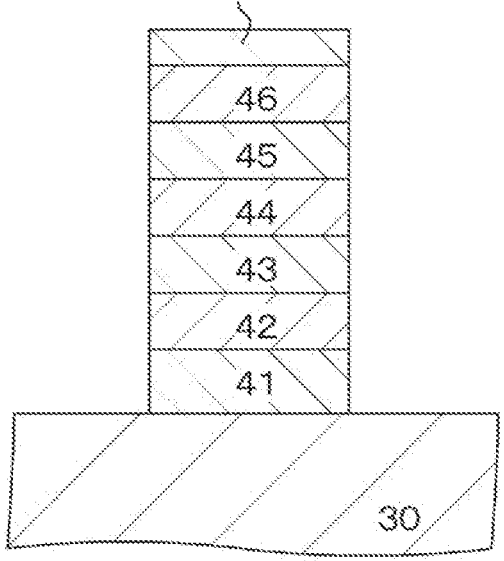
(B)
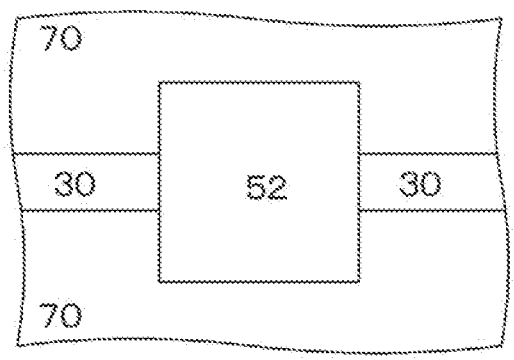
(C)

FIG.27
(A) [31]
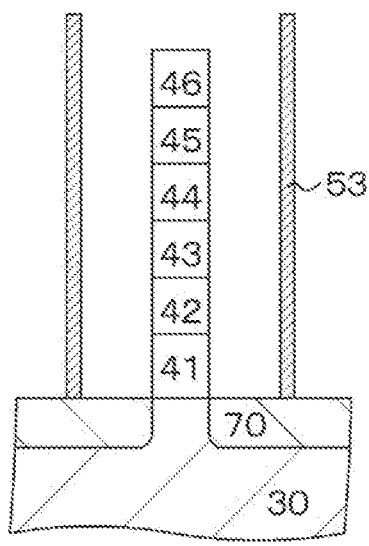
(B)
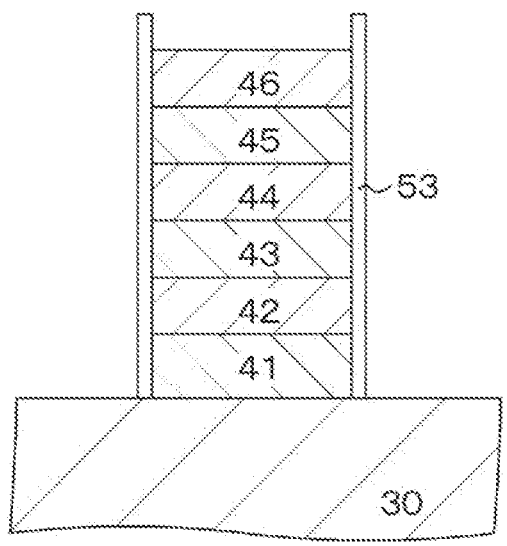
(C)
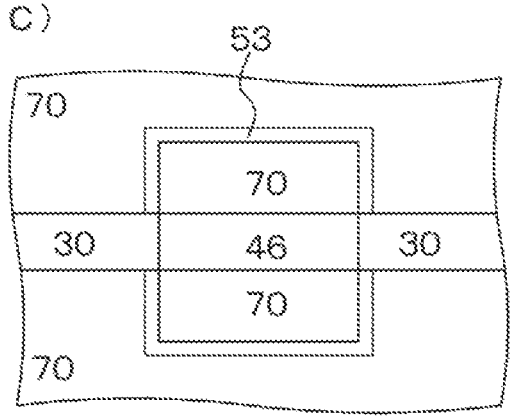

FIG.28
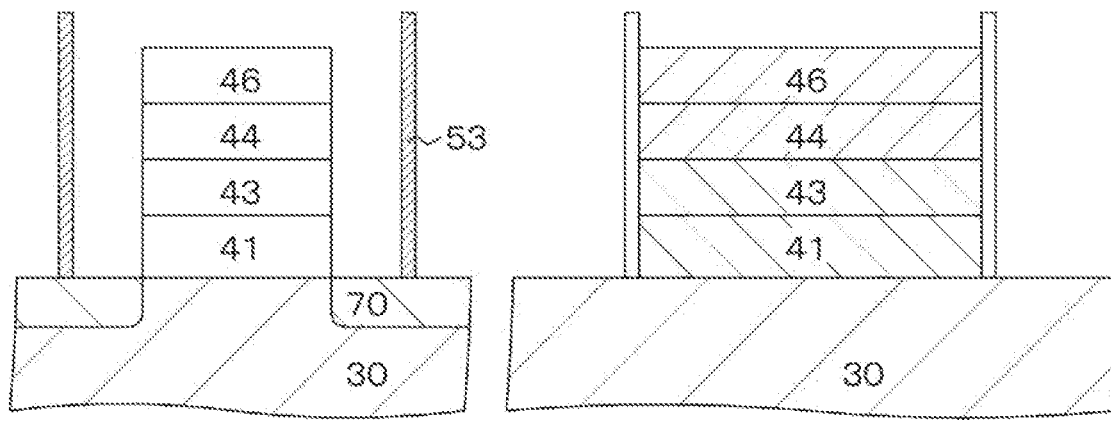
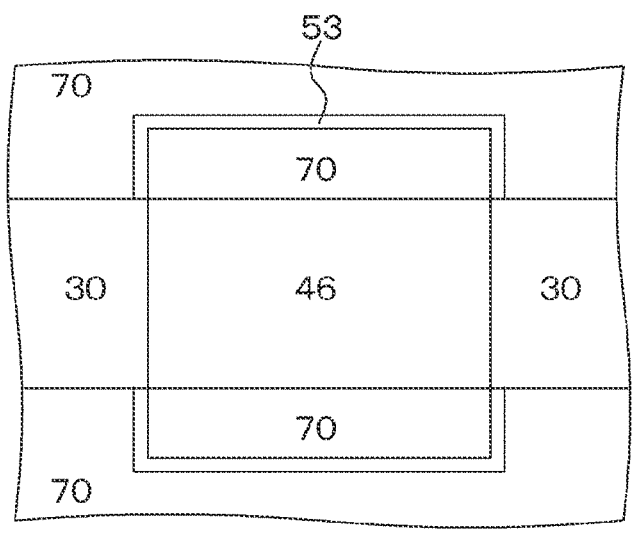

FIG.31
(A) [32]
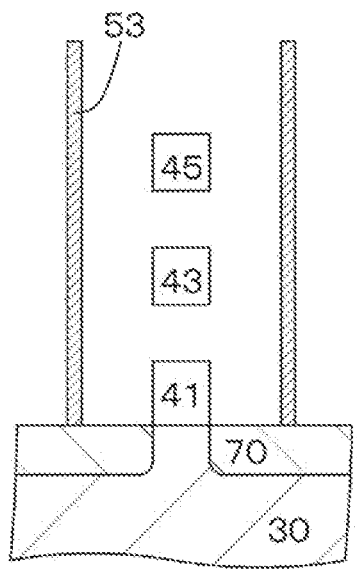
(B)
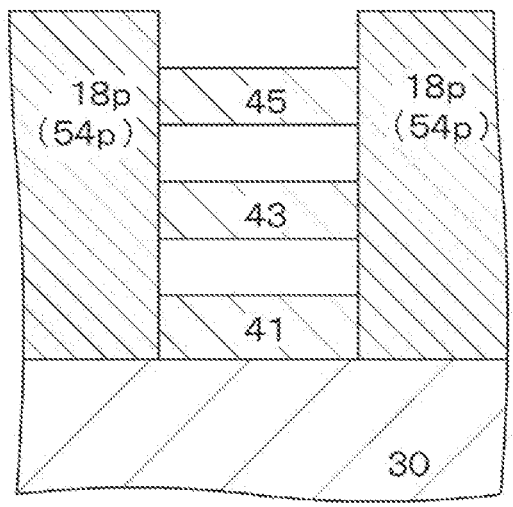
(C)
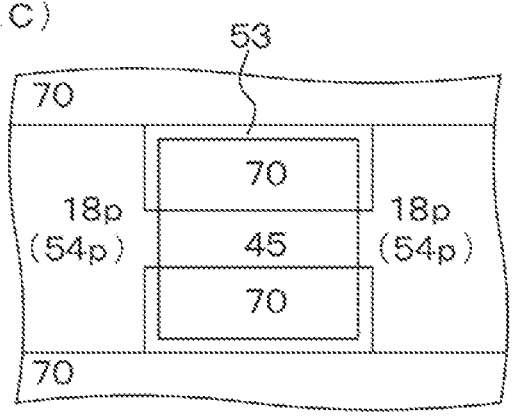

FIG.33
(A) [31]
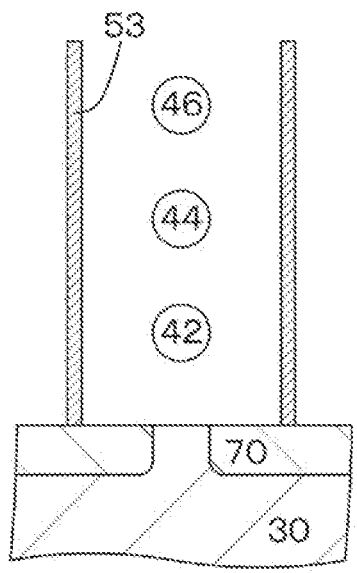
(B)
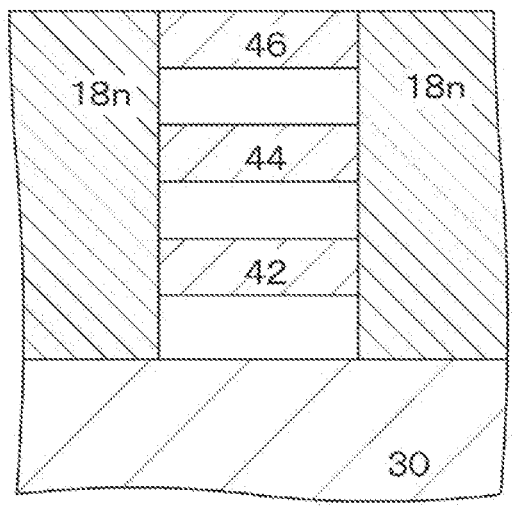
(C)
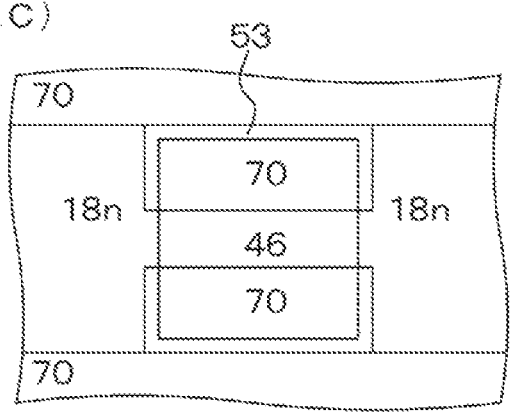

FIG.44
(A) [33]
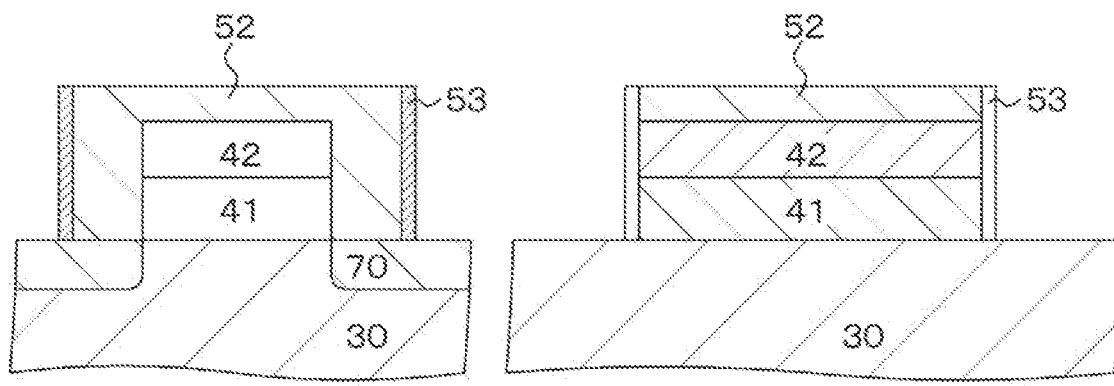
(B)
(C)
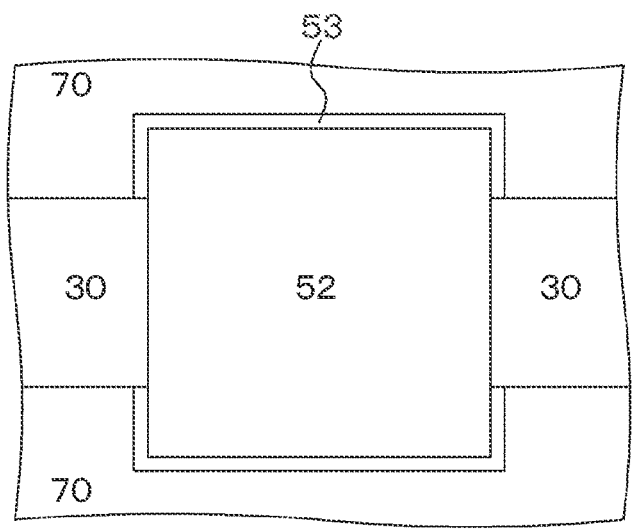

SEMICONDUCTOR DEVICE INCLUDING A FIELD EFFECT TRANSISTOR WITH NANOSTRUCTURE BASED LAMINATED CHANNEL STRUCTURE AND A FIELD EFFECT TRANSISTOR WITH A SINGLE CHANNEL STRUCTURE

CROSS REFERENCE TO RELATED APPLICATIONS

This application is a continuation of U.S. patent application Ser. No. 17/943,337, filed Sep. 13, 2022, which is a continuation of U.S. patent application Ser. No. 17/261,226, filed Jan. 19, 2021, now U.S. Pat. No. 11,476,329, which is a national stage application under 35 U.S.C. 371 and claims the benefit of PCT Application No. PCT/JP2019/024075, having an international filing date of Jun. 18, 2019, which designated the United States, which PCT application claimed the benefit of Japanese Patent Application No. 2018-140217, filed Jul. 26, 2018, the entire disclosures of each of which are incorporated herein by reference.

TECHNICAL FIELD

The present disclosure relates to a semiconductor device, and specifically to a semiconductor device which includes a field effect transistor having a nanowire structure or a nanosheet structure.

BACKGROUND ART

Regarding scaling trends of advanced MOS transistors after 2012, a MOSFET having a bulk-planar structure was dominant until 20 nm generation. After 14 nm generation, however, a FET having a Fin structure (referred to as a "Fin-FET" for convenience) or a FET having an FD-SOI (Fully Depleted-Silicon On Insulator) structure (referred to as an "FD-SOI-FET" for convenience) has been thoroughly adopted. Meanwhile, a thickness of a silicon layer having a close relation with scaling of a gate length, i.e., a thickness of the Fin structure in a Fin-FET, and a thickness of a silicon layer in an FD-SOI-FET are important factors for size reduction of an FET. It is considered that a minimum thickness of the silicon layer is limited to 5 nm.

As a technology for eliminating this limitation on the thickness of the silicon layer constituting a channel forming region of a FET, a field effect transistor (referred to as a "nanowire-FET" for convenience) having a nanowire structure in a channel forming region has been studied (for example, see Japanese Patent Laid-open No. 2015-195405). The nanowire-FET has at least two nanowire structures. In addition, the nanowire-FET thus configured is driven in a range from 0.5 to 0.8 volts, for example.

On the other hand, a semiconductor device is often required to have not only the nanowire-FET, but also a field effect transistor driven in a range from 1.5 to 3.3 volts (referred to as a "second FET" for convenience), for example.

CITATION LIST

Patent Literature

[PTL 1]
Japanese Patent Laid-open No. 2015-195405

SUMMARY

Technical Problem

Meanwhile, the nanowire-FET and the second FET are simultaneously formed during manufacture of a typical semiconductor device. In this case, a space between nanowire structures of the nanowire-FET is so small that it is difficult to form a thick gate insulation film on the second FET. Moreover, there has been a strong demand for applying reverse bias to the second FET to control a threshold voltage $V_{th}$.

Accordingly, a first object of the present disclosure is to provide a semiconductor device which includes both a nanowire-FET and a second FET having a gate insulation film relatively thick with respect to the nanowire-FET. Moreover, a second object of the present disclosure is to provide a semiconductor device which includes both a nanowire-FET and a second FET having a configuration and a structure to which reverse bias is applicable.

Solution to Problem

A semiconductor device according to a first aspect of the present disclosure for achieving the above first object includes:
  a base,
  a first field effect transistor that includes at least two channel structure portions laminated, the channel structure portions each including a channel portion that has a nanowire structure or a nanosheet structure, a gate insulation film that surrounds the channel portion, and a gate electrode that surrounds at least a part of the gate insulation film, and
  a second field effect transistor that includes a channel forming layer, a gate insulation layer surrounding the channel forming layer, and a gate electrode surrounding at least a part of the gate insulation layer, in which
  the first field effect transistor and the second field effect transistor are provided above the base,
  the channel portions of the first field effect transistor are disposed apart from each other in a laminating direction of the channel structure portions, and
  assuming that each of a distance between the channel portions of the first field effect transistor is a distance $L_1$ and that a thickness of the gate insulation layer of the second field effect transistor is a thickness $T_2$, $$T_2 \geq (L_1/2),$$

preferably, $$T_2 \geq 1.1 \times (L_1/2),$$

more preferably, $$T_2 \geq 1.2 \times (L_1/2),$$

is satisfied.

A semiconductor device according to a second aspect of the present disclosure for achieving the above second object includes a base,
a first field effect transistor that includes at least two channel structure portions laminated, the channel structure portions each including a channel portion that has a nanowire structure or a nanosheet structure, a gate insulation film that surrounds the channel portion, and a gate electrode that surrounds at least a part of the gate insulation film, and
a second field effect transistor that includes a channel forming layer, a gate insulation layer formed on a top surface and a side surface of the channel forming layer, and a gate electrode formed on at least a top surface of the gate insulation layer, in which
the first field effect transistor and the second field effect transistor are provided above the base,
the channel portions of the first field effect transistor are disposed apart from each other in a laminating direction of the channel structure portions, and
an insulation material layer is formed between a surface of the base and a bottom surface of the channel forming layer constituting the second field effect transistor.

BRIEF DESCRIPTION OF DRAWINGS

FIG. 4 is a schematic partial cross-sectional diagram of a semiconductor device of a modification (Modification 1) of Embodiment 1.

FIG. 7 is a schematic partial cross-sectional diagram of a semiconductor device of a modification of Embodiment 2.

FIGS. 9A and 9B are schematic partial cross-sectional diagrams of the base and the like continuing from FIG. 8C, for explaining the manufacturing method of the semiconductor device of Embodiment 1, the diagrams being similar to the cross-sectional diagrams taken along the arrows A-A in FIG. 3A and the arrows B-B in FIG. 3B.

FIG. 19 (A), (B), and (C) of FIG. 19 are schematic partial cross-sectional diagrams and a schematic partial plan diagram of the first field effect transistor included in the semiconductor device of Embodiment 1 in a midway of a manufacturing step of the semiconductor device of Embodiment 1.

FIG. 20 (A), (B), and (C) of FIG. 20 are schematic partial cross-sectional diagrams and a schematic partial plan diagram of the second field effect transistor included in the semiconductor device of Embodiment 1 in a midway of a manufacturing step of the semiconductor device of Embodiment 1.

FIG. 21 (A), (B), and (C) of FIG. 21 are schematic partial cross-sectional diagrams and a schematic partial plan diagram continuing from (A), (B), and (C) of FIG. 19 and depicting the first field effect transistor included in the semiconductor device of Embodiment 1 in a midway of a manufacturing step of the semiconductor device of Embodiment 1.

FIG. 27 (A), (B), and (C) of FIG. 27 are schematic partial cross-sectional diagrams and a schematic partial plan diagram continuing from (A), (B), and (C) of FIG. 25 and depicting the first field effect transistor included in the semiconductor device of Embodiment 1 in a midway of a manufacturing step of the semiconductor device of Embodiment 1.

FIG. 28 (A), (B), and (C) of FIG. 28 are schematic partial cross-sectional diagrams and a schematic partial plan diagram continuing from (A), (B), and (C) of FIG. 26 and depicting the second field effect transistor included in the semiconductor device of Embodiment 1 in a midway of a manufacturing step of the semiconductor device of Embodiment 1.

FIG. 31 (A), (B), and (C) of FIG. 31 are schematic partial cross-sectional diagrams and a schematic partial plan diagram continuing from (A), (B), and (C) of FIG. 27 and depicting the first field effect transistor included in the semiconductor device of Embodiment 1 in a midway of a manufacturing step of the semiconductor device of Embodiment 1.

FIG. 33 (A), (B), and (C) of FIG. 33 are schematic partial cross-sectional diagrams and a schematic partial plan diagram continuing from (A), (B), and (C) of FIG. 29 and depicting the first field effect transistor included in the semiconductor device of Embodiment 1 in a midway of a manufacturing step of the semiconductor device of Embodiment 1.

FIG. 44 (A), (B), and (C) of FIG. 44 are schematic partial cross-sectional diagrams and a schematic partial plan diagram continuing from FIG. 43 and depicting the second field effect transistor included in the semiconductor device of Embodiment 2 in a midway of a manufacturing step of the semiconductor device of Embodiment 2.

DESCRIPTION OF EMBODIMENTS

Figure 1:
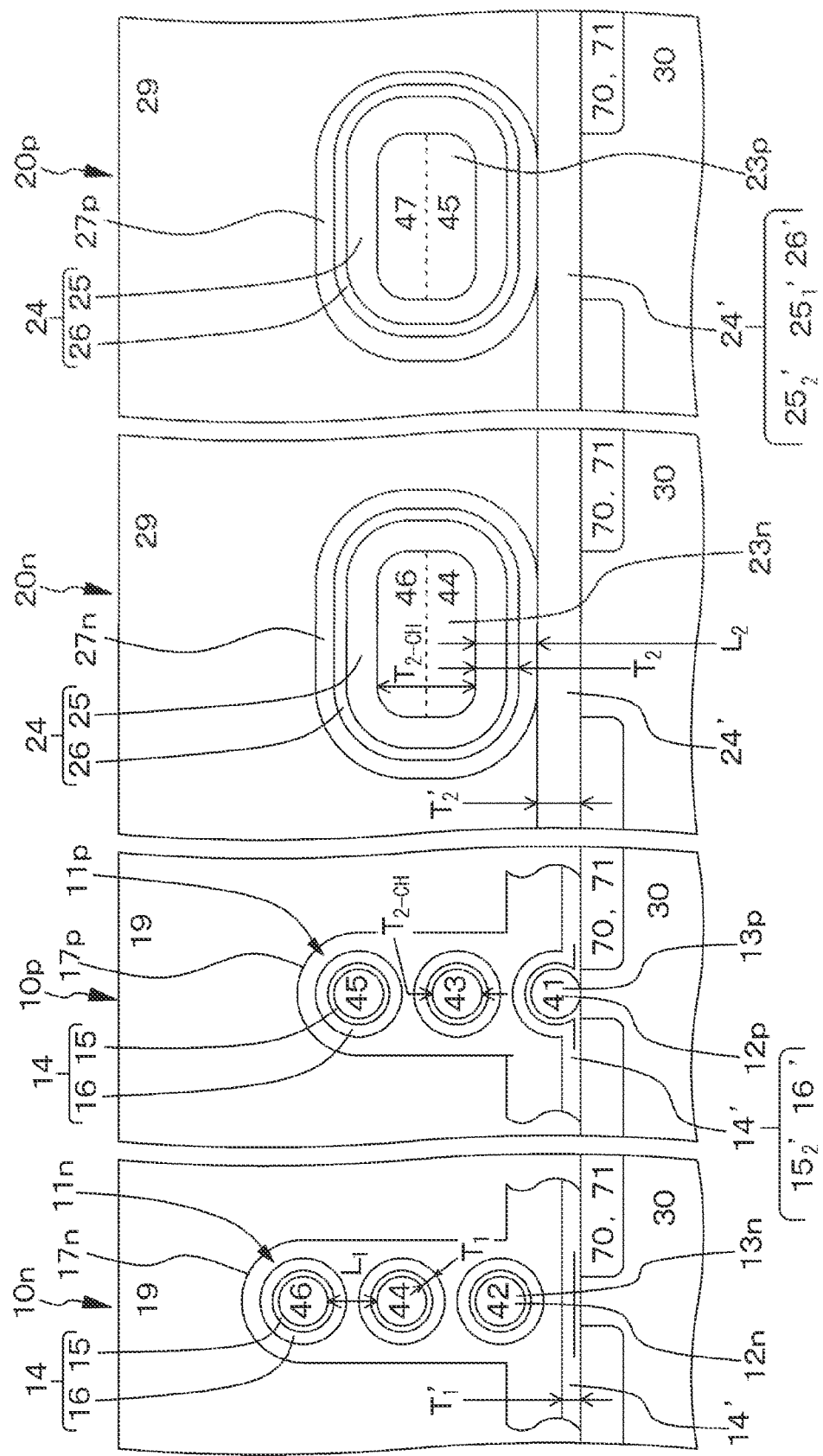
FIG. 1 is a schematic partial cross-sectional diagram of a semiconductor device of Embodiment 1.

The present disclosure will hereinafter be described with reference to the drawings while presenting embodiments. However, the present disclosure is not limited to the embodiments presented herein, and various numerical values and materials included in the embodiments are given only by way of example. Note that the description will proceed in the following order.
1. General description of semiconductor device according to first and second aspects of present disclosure
2. Embodiment 1 (semiconductor device according to first aspect of present disclosure)
3. Embodiment 2 (semiconductor device according to second aspect of present disclosure)
4. Others General Description of Semiconductor Device According to First and Second Aspects of Present Disclosure In a semiconductor device of a first aspect of the present disclosure, assuming that a distance between a surface of a base and a channel forming layer of a second field effect transistor is a distance $L_2$, a mode satisfying the following relation may be adopted.

$$L_2 \geq L_1$$
$$L_2 \geq T_2$$

In this case, a preferable mode satisfying the following relation may be adopted.

$$L_2 \geq 2 \times L_1$$

In the semiconductor device of the first aspect of the present disclosure including the above preferable mode, assuming that a thickness of a gate insulation film of a first field effect transistor is $T_1$, a mode satisfying the following relation may be adopted.

$$T_2 \geq 2 \times T_1$$

A preferable mode satisfying the following relation may be adopted.

$$T_2 \geq 3 \times T_1$$

By adopting such mode, the second field effect transistor having a gate insulation film relatively thick with respect to the first field effect transistor can be obtained reliably.

Moreover, in the semiconductor device of the first aspect of the present disclosure including the respective preferable modes described above, assuming that a thickness of a channel portion is $T_{1-CH}$ and that a thickness of a channel forming layer is $T_{2-CH}$, a mode satisfying the following relation may be adopted.

$$T_{2\text{-}CH} \geq 2 \times T_{1\text{-}CH}$$

A preferable mode satisfying the following relation may be adopted.

$$T_{2\text{-}CH} \geq 3 \times T_{1\text{-}CH}$$

By adopting such mode, lowering of resistance of the channel forming layer of the second field effect transistor, raising of transconductance $g_m$, and reduction of parasitic capacitance are achievable.

Further, in the semiconductor device of the first aspect of the present disclosure including the respective preferable modes described above, at least a part of a channel portion in a lowermost layer constituting the first field effect transistor is surrounded by a first gate electrode, and a channel portion other than this channel portion is surrounded by a second gate electrode in an adoptable mode. In a case where the channel portion in the lowermost layer constituting the first field effect transistor is surrounded by the first gate electrode, an insulation layer (referred to as a "first insulation layer" in some cases for convenience) is formed between the first gate electrode and the surface of the base.

A structure formed such that at least a part of the channel portion in the lowermost layer constituting the first field effect transistor is surrounded by the first gate electrode and that the channel portion other than this channel portion is surrounded by the second gate electrode is applicable to a first field effect transistor of a semiconductor device according to a second aspect of the present disclosure.

As described above, the gate insulation film is formed between the first gate electrode and the channel portion of the first field effect transistors and between the second gate electrode and the channel portion of the first field effect transistor. Specifically, in the first field effect transistor, a gate insulation film (i.e., a gate insulation film formed on the outer peripheral portion of the channel portion) surrounding the channel portion located below and a gate insulation film (i.e., a gate insulation film formed on the outer peripheral portion of the channel portion) surrounding the channel portion located above are formed between the channel portions. Moreover, a gate electrode is provided between the respective gate insulation films. In such manner, a space between the channel portions is filled with the gate insulation film and the gate electrode. The total height of the channel portion is the sum total of diameters of materials (e.g., Si, SiGe, Ge, and InGaAs) constituting a nanowire structure forming the channel portion except for the gate insulation film and the gate electrode or the sum total of thicknesses of materials (e.g., Si, SiGe, Ge, and InGaAs) constituting a nanosheet structure except for the gate insulation film and the gate electrode. The foregoing discussion is applicable to the first field effect transistor of the semiconductor device according to the second aspect of the present disclosure.

In the following description, a gate electrode constituting the second field effect transistor will be referred to as a "third gate electrode" in some cases for convenience. In addition, in the second field effect transistor of the semiconductor device of the first aspect of the present disclosure, the third gate electrode surrounds at least a part of the gate insulation layer. In this case, the third gate electrode surrounds the gate insulation layer in one mode or surrounds a part of the gate insulation layer in another mode. In the former case, the third gate electrode is formed between the surface of the base and the gate insulation layer via an insulation layer (referred to as a "second insulation layer" in some cases for convenience). A thickness of the second insulation layer is larger than a thickness of the first insulation layer described above. On the other hand, in the latter case, the third gate electrode is formed on a top surface and a side surface of the channel forming layer via the gate insulation layer, but not between the surface of the base and the gate insulation layer in a state of $L_2 = T_2$.

Further, in the semiconductor device according to the first aspect of the present disclosure including the respective preferable modes and configurations described above or the semiconductor device according to the second aspect of the present disclosure, the following mode may be adopted.

The second field effect transistor includes an n-channel type field effect transistor and a p-channel type field effect transistor.

A channel forming layer of the n-channel type field effect transistor is made of silicon (Si).

A channel forming layer of the p-channel type field effect transistor is made of silicon (Si) or silicon-germanium (SiGe).

Further, in the semiconductor device according to the first aspect of the present disclosure including the respective preferable modes and configurations described above or the semiconductor device according to the second aspect of the present disclosure including the preferable mode described above, the following mode may be adopted.

The first field effect transistor includes an n-channel type field effect transistor and a p-channel type field effect transistor.

A channel portion of the n-channel type field effect transistor is made of silicon (Si).

A channel portion of the p-channel type field effect transistor is made of silicon-germanium (SiGe), germanium (Ge), or InGaAs.

However, this mode is not required to be adopted, and the following mode may be adopted.

The channel portion of the n-channel type field effect transistor is made of silicon-germanium (SiGe).

The channel portion of the p-channel type field effect transistor is made of silicon (Si), germanium (Ge), or InGaAs.

Another mode is adoptable. Specifically, the channel portion of the n-channel type field effect transistor is made of germanium (Ge).

The channel portion of the p-channel type field effect transistor is made of silicon (Si), silicon-germanium (SiGe), or InGaAs.

A further mode is adoptable. Specifically, the channel portion of the n-channel type field effect transistor is made of InGaAs.

The channel portion of the p-channel type field effect transistor is made of silicon (Si), silicon-germanium (SiGe), or germanium (Ge).

In the semiconductor device according to the second aspect of the present disclosure including the respective preferable modes described above, the following mode may be adopted. Reverse bias is applied to the base at a portion facing the bottom surface of the channel forming layer via the insulation material layer.

According to the semiconductor device of the second aspect of the present disclosure including the respective preferable modes described above, assuming that a thickness of the channel portion is $T_{1\text{-}CH}$ and that a thickness of the insulation material layer is $T_{Ins}$, a mode satisfying the following relation may be adopted.

$$0.2 \le T_{1-CH}/T_{Ins} \le 2$$

preferably, $$0.5 \le T_{1-CH}/T_{Ins} \le 1$$

Further, in the semiconductor device according to the second aspect of the present disclosure including the preferable modes described above, the following configuration may be adopted. At least one semiconductor layer is formed between the channel forming layer and the insulation material layer in the second field effect transistor. In addition, in this case, adoptable is a configuration where an interlayer insulation layer is formed between the channel forming layer and the semiconductor layer and between the semiconductor layers. In this manner, reverse bias is applicable by applying appropriate potential to the semiconductor layer. Further, in these cases, the semiconductor layer may have a conductivity type opposite to a conductivity type of the channel forming layer. According to a MOSFET having a GAA (Gate-All-Around) structure where an entire outer periphery of a channel forming region is surrounded by a gate electrode, a threshold voltage $V_{th}$ is normally determined only by a work function of a material constituting the gate electrode. However, the threshold voltage $V_{th}$ is controllable by applying reverse bias, and thus, a desired threshold voltage $V_{th}$ optimum for a circuit is allowed to be set. For example, a circuit speed can be raised by lowering the threshold voltage $V_{th}$, and a low leak current can be achieved by increasing the threshold voltage $V_{th}$.

According to the semiconductor device of the first and second aspects of the present disclosure including the preferred modes and configurations described above (hereinafter collectively referred to as the "semiconductor device of the present disclosure" in some cases), the following configuration may be adopted. The first field effect transistor is a low withstand voltage field effect transistor, while the second field effect transistor is a high withstand voltage field effect transistor. In addition, in this case, the following configuration may be adopted. Voltage applied to the gate electrode of the first field effect transistor is in a range from 0.5 to 0.8 volts, for example, while voltage applied to the gate electrode of the second field effect transistor is in a range from 1.5 to 3.3 volts, for example. Note here that whether a field effect transistor is suited for a low withstand voltage field effect transistor or for a high withstand voltage field effect transistor is greatly dependent on the sum total of cross-sectional areas of a channel portion and a channel forming layer and on each thickness of a gate insulation film and a gate insulation layer.

Whether the first field effect transistor is of an n-channel type or of a p-channel type is determined by a work function of a material constituting the gate electrode, for example. Whether the second field effect transistor is of an n-channel type or of a p-channel type is also determined by a work function of a material constituting the gate electrode, for example.

In a case where the channel portion or the channel forming layer is made of Si in the semiconductor device of the present disclosure, the gate electrode is made of such material as TiN, TaN, Al, TiAl, and W to form the respective field effect transistors of the n-channel type. On the other hand, in a case where the channel portion or the channel forming layer is made of SiGe, the gate electrode is made of material such as TiN and W to form the respective field effect transistors of the p-channel type.

In addition, the gate insulation film and the gate insulation layer may be made of such material as SiON and $SiO_2$ or such high dielectric constant material (what is generally called a High-k material) as $HfO_2$, HfAlON, and $Y_2O_3$.

The base included in the semiconductor device of the present disclosure may be constituted by a silicon semiconductor substrate or an SOI substrate, for example. The channel portion and the channel forming layer preferably have a crystalline nature, but may have a polycrystalline configuration, or may have an amorphous configuration depending on cases. The semiconductor layer may be made of the material constituting the channel portion or the channel forming layer, specifically, silicon (Si), silicon-germanium (SiGe), germanium (Ge), and InGaAs. The channel portion, the channel forming layer, and the semiconductor layer may be formed by such a forming method as epitaxial CVD, plasma CVD, and atomic layer CVD.

According to the semiconductor device of the present disclosure, it is sufficient if the number of the channel structure portions provided in a thickness direction of the first field effect transistor is two or more. In addition, it is sufficient if the number of the channel structure portions provided in the direction perpendicular to the thickness direction of the first field effect transistor is one or two or more. The nanowire structure constituting the semiconductor device of the present disclosure is formed such that both ends of a wire structure that is made of Si, SiGe or the like, for example, and that has a diameter ranging from 5 to 10 nm, for example, are supported by source/drain regions constituting the first field effect transistor. In addition, the nanosheet structure constituting the semiconductor device of the present disclosure is formed such that both ends of a material that has a substantially rectangular cross-sectional shape, is made of Si, SiGe or the like, for example, and has a size of a width by a thickness of (10 to 50 nm) by (5 to 10 nm), for example, are supported by source/drain regions constituting the first field effect transistor. Whether the nanowire structure is adopted or the nanosheet structure is adopted is dependent on a thickness and a width of a material constituting the nanowire or nanosheet structure. In addition, the channel forming layer constituting the second field effect transistor is supported by a source/drain region constituting the second field effect transistor.

An arrangement of the first field effect transistor and the second field effect transistor in the semiconductor device is dependent on required specifications of the semiconductor device, and is thus difficult to specify here. Arrangement examples include a configuration which has a first field effect transistor constituting such a digital circuit as a logic circuit, a SRAM circuit, and a CMOS circuit, for example, and a second field effect transistor constituting a transistor for transmitting and receiving signals or the like to and from the outside; a configuration which has a second field effect transistor for controlling an imaging element (light receiving element) of an imaging device such as a transistor constituting an analog-digital converter and a first field effect transistor constituting a logic circuit controlling the imaging device or a driving circuit of the imaging element (light receiving element) constituting the imaging device; and a configuration which has a first field effect transistor constituting a CPU, a GPU, or the like and a second field effect transistor constituting a transistor for transmitting and receiving signals or the like to and from the outside. However, other configurations may be adopted.

Embodiment 1

Embodiment 1 relates to a semiconductor device according to a first aspect of the present disclosure.

Figure 2A:
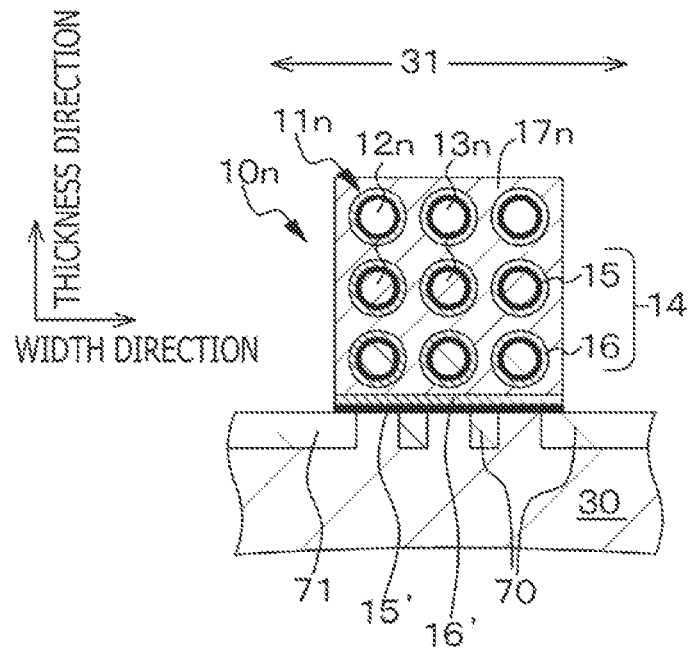
FIGS. 2A and 2B are schematic partial cross-sectional diagrams of a first field effect transistor included in the semiconductor device of Embodiment 1.
Figure 2B:
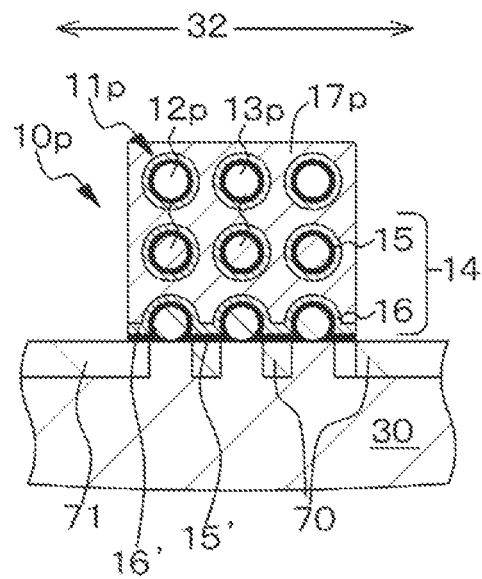
Figure 3A:
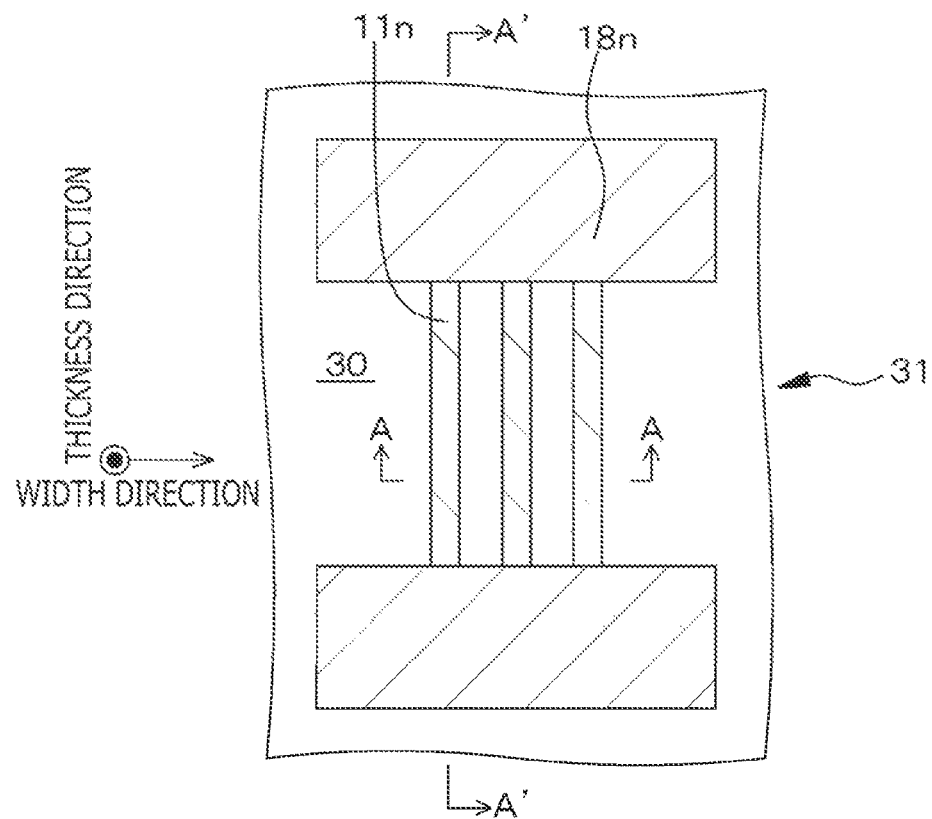
FIG. 3A is a diagram which depicts a schematic arrangement state of channel portions, a channel forming layer, and source/drain regions of the first field effect transistor included in the semiconductor device of the present disclosure.
Figure 3B:
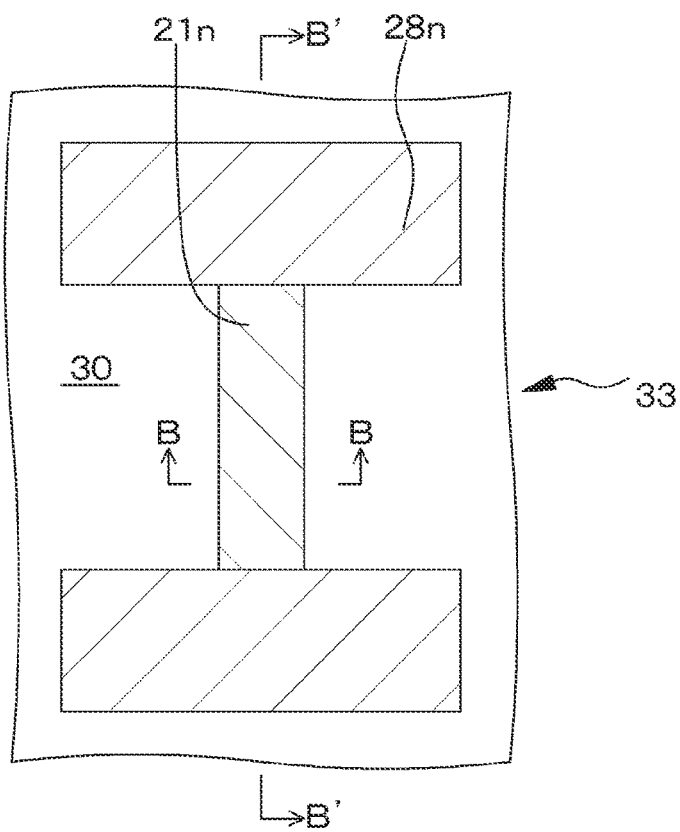
FIG. 3B is a diagram which depicts a schematic arrangement of channel portions, a channel forming layer, and source/drain regions of a second field effect transistor included in the semiconductor device of the present disclosure.

FIGS. 1, 2A, and 2B each depict a schematic partial cross-sectional diagram of a semiconductor device according to Embodiment 1, FIG. 3A depicts a schematic arrangement state of channel portions, a channel forming layer, and source/drain regions of a first field effect transistor in the semiconductor device of Embodiment 1, and FIG. 3B depicts a schematic arrangement of channel portions, a channel forming layer, and source/drain regions of a second field effect transistor in the semiconductor device of Embodiment 1. FIG. 1 is a schematic partial cross-sectional diagram taken along arrows A-A in FIG. 3A and arrows B-B in FIG. 3B, while FIGS. 2A and 2B are schematic partial cross-sectional diagrams taken along the arrows A-A in FIG. 3A. Note that FIG. 1 includes a schematic partial cross-sectional diagram of one channel structure portion in an n-channel type first field effect transistor, a schematic partial cross-sectional diagram of one channel structure portion in a p-channel type first field effect transistor, and schematic partial cross-sectional diagrams of an n-channel type second field effect transistor and a p-channel type second field effect transistor. In addition, FIG. 2A is a schematic partial cross-sectional diagram of the n-channel type first field effect transistor, while FIG. 2B is a schematic partial cross-sectional diagram of the p-channel type first field effect transistor. FIG. 1 is a cross-sectional diagram in which hatching lines are omitted.

The semiconductor device of Embodiment 1 includes a base 30, first field effect transistors 10n and 10p where at least two channel structure portions 11n and two channel structure portions 11p (three for each in a laminating direction of the channel structure portions 11n and 11p in the depicted example) are laminated, each of the channel structure portions 11n and each of the channel structure portions 11p including a channel portion 13n and a channel portion 13p, respectively, the channel portion 13n and the channel portion 13p each having a nanowire structure or a nanosheet structure (having a nanowire structure 12n and a nanowire structure 12p, respectively, in the depicted example), a gate insulation film 14 surrounding the channel portion 13n and a gate insulation film 14 surrounding the channel portion 13p, respectively, and a gate electrode 17n and a gate electrode 17p, respectively, the gate electrode 17n and the gate electrode 17p each surrounding at least a part of the gate insulation film 14, and second field effect transistors 20n and 20p which include a channel forming layer 23n and a channel forming layer 23p, respectively, a gate insulation layer 24 surrounding the channel forming layer 23n and a gate insulation layer 24v surrounding the channel forming layer 23p, respectively, and a gate electrode 27n and a gate electrode 27p, respectively, each surrounding at least a part of the gate insulation layer 24 (surrounding the gate insulation layer 24 in the depicted figure).

The first field effect transistors 10n and 10p and the second field effect transistors 20n and 20p are provided above the base 30.

The channel portions 13n of the first field effect transistors 10n are disposed apart from each other in the laminating direction of the channel structure portions 11n, and the channel portions 13p of the first field effect transistors 10p are disposed apart from each other in the laminating direction of the channel structure portions 11p.

In addition, assuming that each of a distance between the channel portions 13n of the first field effect transistors 10n and a distance between the channel portions 13p of the first field effect transistor 10p is a distance $L_1$ and that a thickness of the gate insulation layer 24 of each of the second field effect transistors 20n and 20p is a distance $T_2$, the following relation is satisfied.

$$T_2 \geq (L_1/2)$$

preferably, $$T_2 \geq 1.1 \times (L_1/2)$$

more preferably, $$T_2 \geq 1.2 \times (L_1/2)$$

According to an example depicted in FIGS. 2A and 2B, the three channel structure portions 11n and the three channel structure portions 11p are provided in a width direction. Meanwhile, FIG. 1 depicts one of the channel structure portions 11n and one of the channel structure portion 11p. FIG. 1 depicts a cross-sectional shape of the one channel structure portion of the first field effect transistor. Accordingly, FIG. 1 is different from each of FIGS. 2A and 2B. This is also applicable to Embodiment 2 described below.

In addition, assuming that each of a distance between a surface of the base 30 and the channel forming layer 23n of the second field effect transistor 20n and a distance between the surface of the base 30 and the channel forming layer 23p of the second field effect transistor 20p is a distance $L_2$, the following relations are satisfied.

$$L_2 \geq L_1$$
$$L_2 \geq T_2$$

preferably, $$L_2 \geq 2 \times L_1$$

Moreover, assuming that a thickness of the gate insulation film 14 of each of the first field effect transistors 10n and 10p is $T_1$, the following relation is satisfied.

$$T_2 \geq 2 \times T_1$$

preferably, $$T_2 \geq 3 \times T_1$$

Further, assuming that a thickness of each of the channel portions 13n and 13p is $T_{1\text{-}CH}$ and that a thickness of the channel forming layers 23n and 23p is $T_{2\text{-}CH}$, the following relation is satisfied.

$$T_{2-CH} \geq 2 \times T_{1-CH}$$

preferably, $$T_{2-CH} \geq 3 \times T_{1-CH}$$

Specifically, the following values are set.

$$T_2/(L_1/2) = 1.5$$
$$L_2/L_1 = 2.0$$
$$L_2/T_2 = 2.7$$
$$T_2/T_1 = 3.0$$
$$T_{2-CH}/T_{1-CH} = 2.0$$

However, these values are not required to be set. Here, the following values are designated.

$$T_{1-CH} = 8 \text{ nm}$$
$$T_{2-CH} = 16 \text{ nm}$$
$$T_1 = 2 \text{ nm}$$
$$T_2 = 6 \text{ nm}$$
$$L_1 = 8 \text{ nm}$$
$$L_2 = 16 \text{ nm}$$

Moreover, at least a part of a channel portion in a lowermost layer constituting the first field effect transistor is surrounded by a first gate electrode, while channel portions other than this channel portion are each surrounded by a second gate electrode. Specifically, in the depicted example, the channel portion 13n in the lowermost layer constituting the first field effect transistor 10n is surrounded by a gate electrode 17n, while the channel portions 13n other than this channel portion (channel portions 13n in the second layer and the uppermost layer) are also surrounded by the gate electrode 17n. The first field effect transistors 10n and 10p included in a semiconductor device of Embodiment 2 describe below may be configured similarly. On the other hand, a part of a channel portion 13p in a lowermost layer constituting the first field effect transistor 10p is surrounded by a gate electrode 17p, while the channel portions 13p other than this channel portion (channel portions 13p in the second layer and the uppermost layer) are surrounded by the gate electrode 17p. Furthermore, each of gate electrodes (third gate electrodes) 27n and 27p constituting the second field effect transistor 20n and 20p, respectively, surrounds at least a part of the gate insulation layer 24 (in the depicted example, an entire outer peripheral portion of the gate insulation layer 24).

The channel portion 13n in the lowermost layer constituting the first field effect transistor 10n is surrounded by the first gate electrode 17n, and a first insulation layer 14' is formed between the first gate electrode 17n and the surface of the base 30. Moreover, gate electrodes 27n and 27p are provided between the surface of the base 30 and the gate insulation layers 24 constituting the second field effect transistors 20n and 20p, respectively, via second insulation layers 24'. A thickness of each of the second insulation layers 24' is larger than a thickness of each of the first insulation layers 14'. For example, the following relation may be adopted as a relation between a thickness $T_2'$ of the second insulation layer 24' and a thickness $T_1'$ of the first insulation layer 14'

$$T_2'/T_1' \geq 3$$

The gate insulation film 14 is formed between the channel portion 13n of the first field effect transistor 10n and the first gate electrode 17n and between the channel portion 13p of the first field effect transistor 10p and the first gate electrode 17p, and further between the channel portion 13n of the first field effect transistor 10n and the second gate electrode 17n and between the channel portion 13p of the first field effect transistor 10p and the second gate electrode 17p. Specifically, in the first field effect transistors 10n and 10p, the gate insulation films (i.e., gate insulation films formed on the outer peripheral portions of the channel portions 13n and 13p) 14 surrounding the channel portions located below and the gate insulation films (i.e., gate insulation films formed on the outer peripheral portions of the channel portions) 14 surrounding the channel portions 13n and 13p located above are formed between the channel portions 13n and between the channel portion 13p, respectively. Moreover, the gate electrodes 17n and 17p are provided between the respective gate insulation films 14. In such manner, spaces between the channel portions 13n and between the channel portions 13p are filled with the gate insulation films 14 and the gate electrodes 17n and 17p. The total heights (thicknesses) of the channel portions 13n and 13p are the sum totals of materials constituting the nanowire structures 12n and 12p forming the channel portions 13n and 13p except for the gate insulation films 14 and the gate electrodes 17n and 17p, respectively. This is also applicable to Embodiment 2 described below.

Each of the third gate electrodes 27n and 27p of the second field effect transistors 20n and 20p surrounds at least a part of the gate insulation layer 24. In this case, as depicted in the figure, the third gate electrodes 27n and 27p may be configured to surround the gate insulation layers 24, or the third gate electrodes 27n and 27p may be configured to surround a part of the gate insulation layers 24 as described below. According to the depicted example, the third gate electrodes 27n and 27p are provided between the surface of the base 30 and the gate insulation layers 24.

Further, according to the semiconductor device of Embodiment 1, the second field effect transistor includes the n-channel type field effect transistor 20n and the p-channel type field effect transistor 20p. The channel forming layer 23n of the n-channel type field effect transistor 20n is made of silicon (Si), while the channel forming layer 23p of the p-channel type field effect transistor 20p is made of silicon-germanium (SiGe). The first field effect transistor includes the n-channel type field effect transistor 10n and the p-channel type field effect transistor 10p. The channel portion 13n of the n-channel type field effect transistor 10n is made of silicon (Si), while the channel portion 13p of the p-channel type field effect transistor 10*p* is made of silicon-germanium (SiGe). Such configuration of the first field effect transistor is also applicable to Embodiment 2 described below.

Moreover, examples of the material forming the gate electrodes 17*n*, 17*p*, 27*n*, and 27*p* include TiN, TaN, Al, TiAl, and W. Specifically, the gate electrodes 17*n*, 17*p*, 27*n*, and 27*p* are made of TiN, for example. Gate insulation films 15 and gate insulation layers 25 constituting a part (lower layers) of the gate insulation films 14 and the gate insulation layers 24 are made of $SiO_2$, while gate insulation films 16 and gate insulation layers 26 constituting a remaining part (upper layers) of the gate insulation films 14 and the gate insulation layers 24 are made of a high dielectric constant material, specifically $HfO_2$, for example. The base 30 is constituted by a silicon semiconductor substrate. The base 30 includes an element separation region 70 made of an insulation material 71. This is also applicable to Embodiment 2 described below.

Both ends of the channel portions 13*n* and 13*p* are supported by source/drain regions 18*n* and 18*p* constituting the first field effect transistors 10*n* and 10*p*, respectively, while both ends of the channel forming layers 23*n* and 23*p* are supported by source/drain regions 28*n* and 28*p* constituting the second field effect transistors 20*n* and 20*p*. This is also applicable to Embodiment 2 described below.

According to the semiconductor device of Embodiment 1, each of the first field effect transistors 10*n* and 10*p* is a low withstand voltage field effect transistor, while each of the second field effect transistors 20*n* and 20*p* is a high withstand voltage field effect transistor. Voltage applied to the gate electrodes 17*n* and 17*p* of the first field effect transistors 10*n* and 10*p* is in a range from 0.5 to 0.8 volts, while voltage applied to the gate electrodes 27*n* and 27*p* of the second field effect transistors 20*n* and 20*p* is in a range from 1.5 to 3 volts. This is also applicable to Embodiment 2 described below.

A manufacturing method of the semiconductor device of Embodiment 1 will hereinafter be described with reference to FIGS. 8A, 8B, 8C, 9A, 9B, 10A, 10B, 11A, 11B, 12, 13, 14, 15, 16, 17, and 18 each of which is a schematic partial cross-sectional diagram similar to the cross-sectional diagram taken along the arrows A-A in FIG. 3A or the arrows B-B in FIG. 3B, FIGS. 19, 21, 23, 25, 27, 29, 31, 33, 35, 37, 39, and 41 each of which includes a schematic partial cross-sectional diagram of the first field effect transistor similar to the cross-sectional diagram taken along the arrows A-A in FIG. 3A (indicated by (A) in each of the figures; see arrows A-A in (C) of FIG. 19 as well), a schematic partial cross-sectional diagram of the first field effect transistor similar to the cross-sectional diagram taken along the arrows A'-A' in FIG. 3 (indicated by (B) in each of the figures; see arrows B-B in (C) of FIG. 19 as well), and a schematic partial plan diagram of the first field effect transistor (indicated by (C) in each of the figures), and FIGS. 20, 22, 24, 26, 28, 30, 32, 34, 36, 38, 40, and 42 each of which includes a schematic partial cross-sectional diagram of the second field effect transistor similar to the cross-sectional diagram taken along the arrows B-B in FIG. 3B (indicated by (A) in each of the figures; see arrows A-A in (C) of FIG. 20 as well), a schematic partial cross-sectional diagram of the second field effect transistor similar to the cross-sectional diagram taken along the arrows B'-B' in FIG. 3B (indicated by (B) in each of the figures; see arrows B-B in (C) of FIG. 20 as well), and a schematic partial plan diagram of the second field effect transistor (indicated by (C) in each of the figures). Note that, in the following description, a region where the first field effect transistor 10*n* is to be formed in the base 30 will be referred to as a first region 31, a region where the first field effect transistor 10*p* is to be formed in the base 30 will be referred to as a second region 32, a region where the second field effect transistor 20*n* is to be formed in the base 30 will be referred to as a third region 33, and a region where the second field effect transistor 20*p* is to be formed in the base 30 will be referred to as a fourth region 34 in some cases. In addition, in the figures, the first region 31, the second region 32, the third region 33, and the fourth region 34 are indicated by reference numbers [31], [32], [33], and [34], respectively. Moreover, hatching lines in a first Si—Ge layer 41, a first Si layer 42, a second Si—Ge layer 43, a second Si layer 44, a third Si—Ge layer 45, a third Si layer 46, and a fourth Si—Ge layer 47 are not depicted in (A) of each of FIGS. 19, 20, 21, 22, 23, 24, 25, 26, 27, 28, 29, 30, 31, 32, 33, 34, 35, 36, 37, 38, 39, 40, 41, and 42. Furthermore, in a case where respective types of processing or the like in a certain region have an undesired effect on another region, it is sufficient if a mask layer or the like is provided in the affected other region as needed. Description of such a mask layer is omitted.

[Step-100A]

Figure 8A:
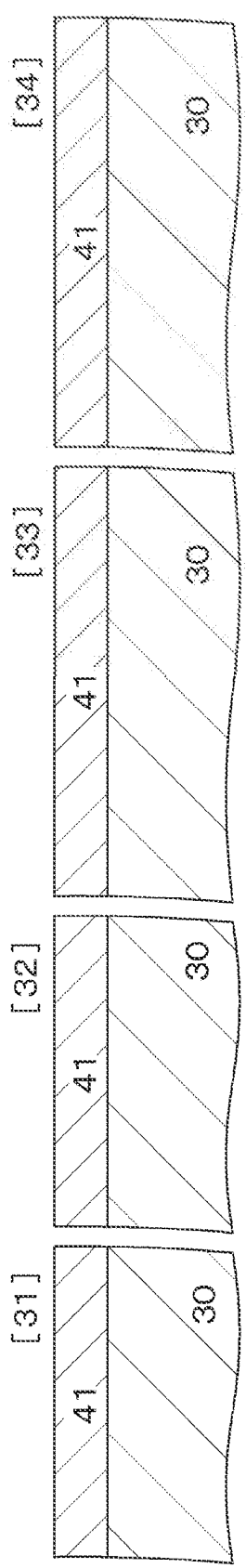
FIGS. 8A, 8B, and 8C are schematic partial cross-sectional diagrams of a base and the like for explaining a manufacturing method of the semiconductor device of Embodiment 1, the diagrams being similar to the cross-sectional diagrams taken along the arrows A-A in FIG. 3A and the arrows B-B in FIG. 3B.
Figure 8B:
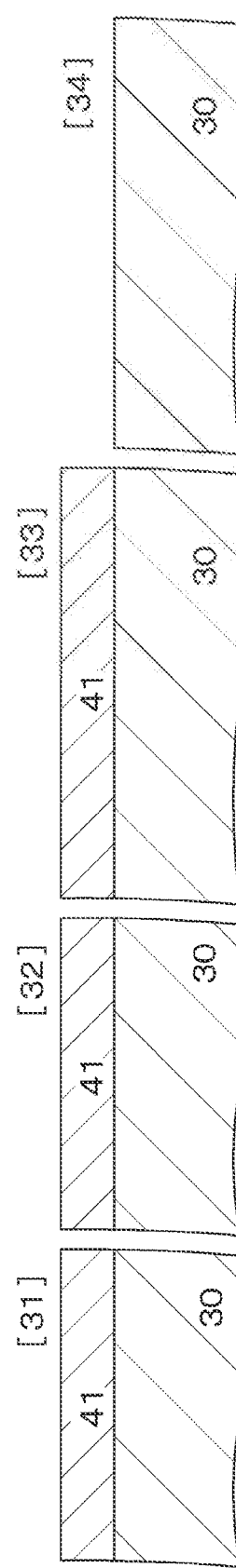
Figure 8C:
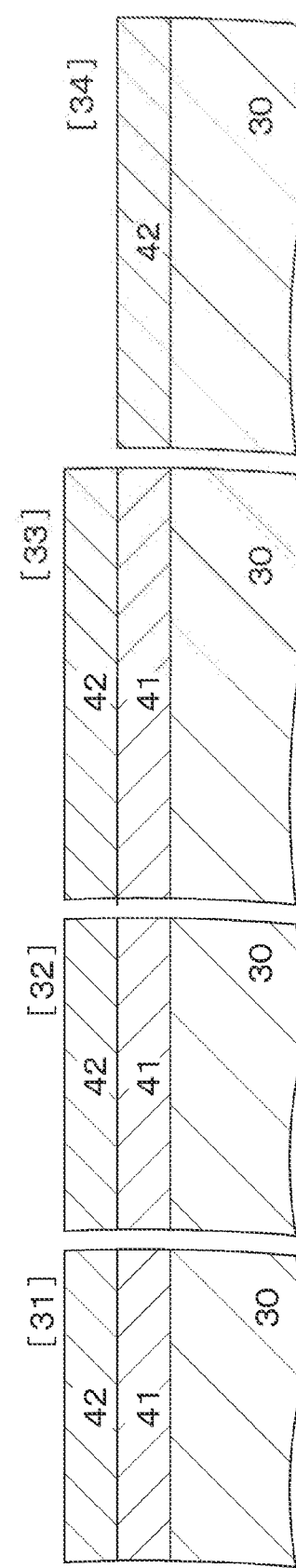

First, the first Si—Ge layer 41 is formed by a known method in each of the first region 31, the second region 32, the third region 33, and the fourth region 34 of the base 30 (see FIG. 8A), and then the first Si—Ge layer 41 on the fourth region 34 is removed by a known method. As a result, a structure depicted in FIG. 8B is obtained.

[Step-100B]

Next, the first Si layer 42 is formed on the entire surface by a known method (see FIG. 8C), and then the first Si layer 42 on the third region 33 is removed by a known method. As a result, a structure depicted in FIG. 9A is obtained.

[Step-100C]

Figure 10A:
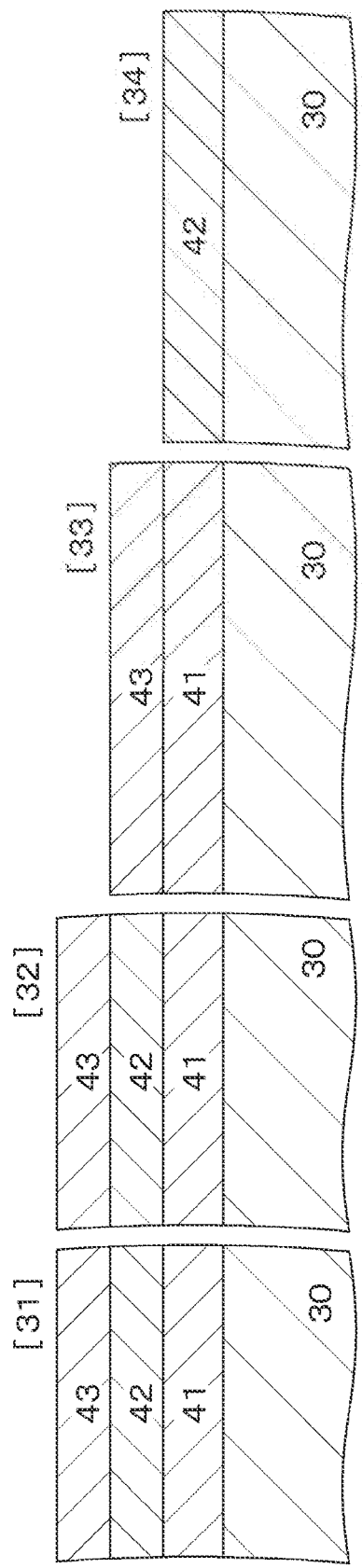
FIGS. 10A and 10B are schematic partial cross-sectional diagrams of the base and the like continuing from FIG. 9B, for explaining the manufacturing method of the semiconductor device of Embodiment 1, the diagrams being similar to the cross-sectional diagrams taken along the arrows A-A in FIG. 3A and the arrows B-B in FIG. 3B.

Subsequently, the second Si—Ge layer 43 is formed on the entire surface by a known method (see FIG. 9B), and then the second Si-layer 43 on the fourth region 34 is removed by a known method. As a result, a structure depicted in FIG. 10A is obtained.

[Step-100D]

Figure 10B:
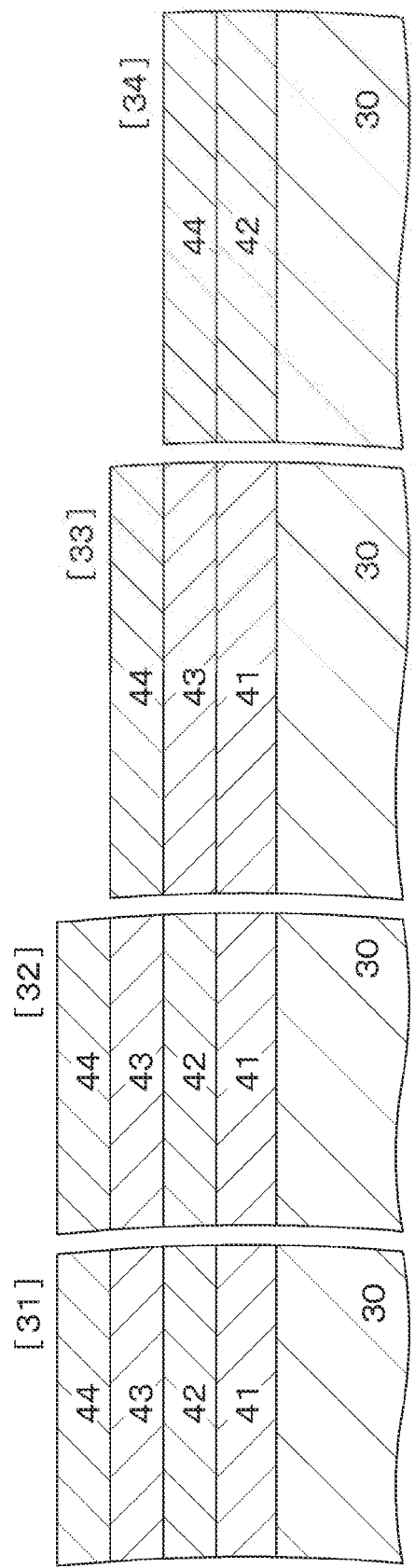

Then, the second Si layer 44 is formed on the entire surface by a known method. As a result, a structure depicted in FIG. 10B is obtained.

[Step-100E]

Figure 11A:
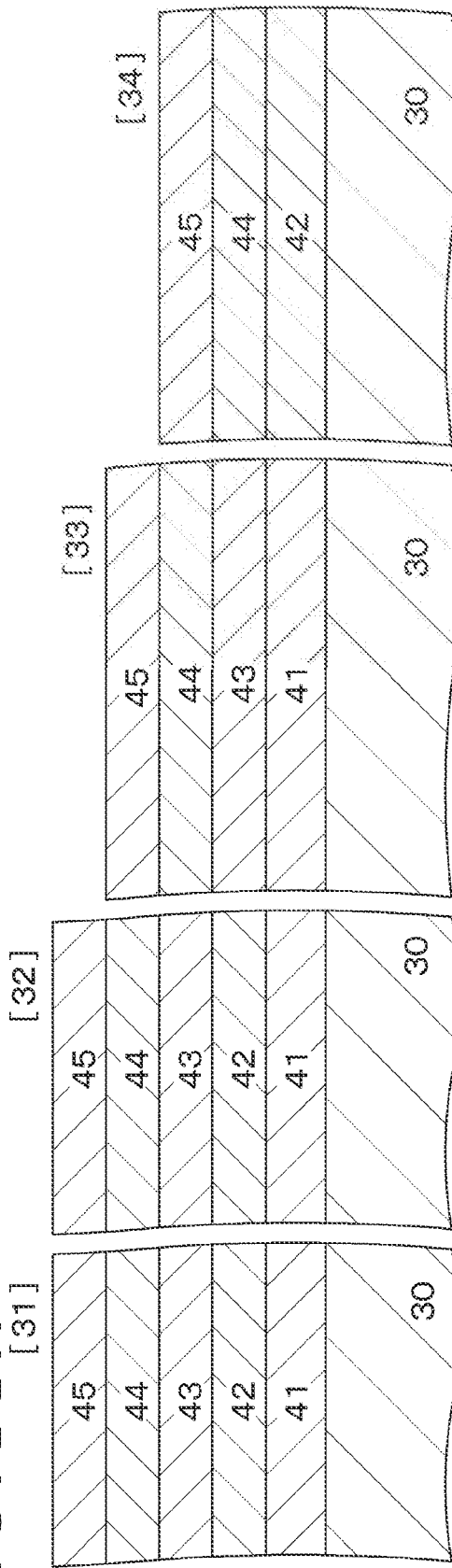
FIGS. 11A and 11B are schematic partial cross-sectional diagrams of the base and the like continuing from FIG. 10B, for explaining the manufacturing method of the semiconductor device of Embodiment 1, the diagrams being similar to the cross-sectional diagrams taken along the arrows A-A in FIG. 3A and the arrows B-B in FIG. 3B.
Figure 11B:
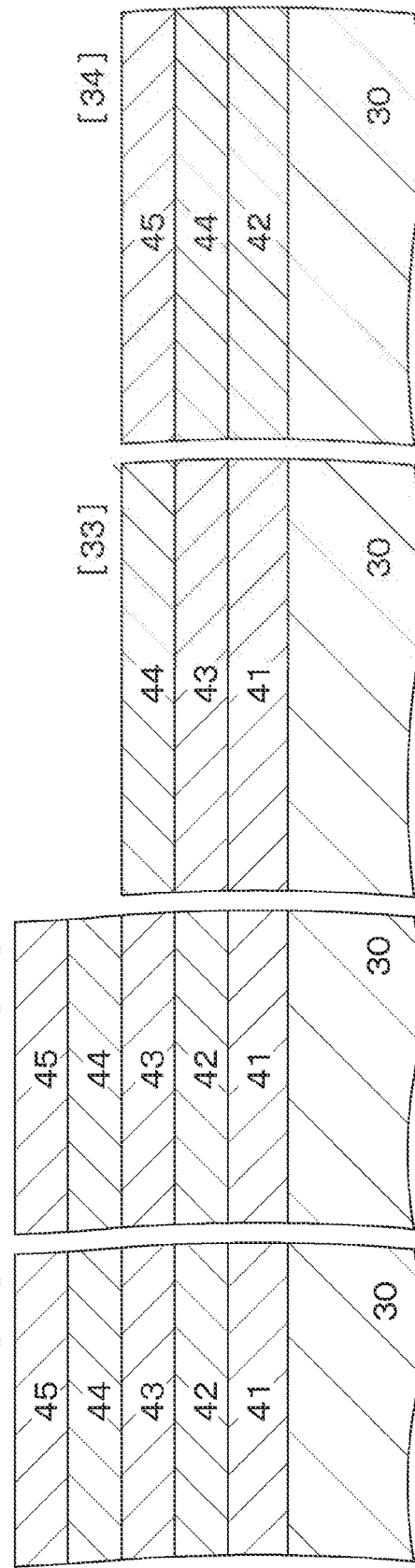
Figure 12:
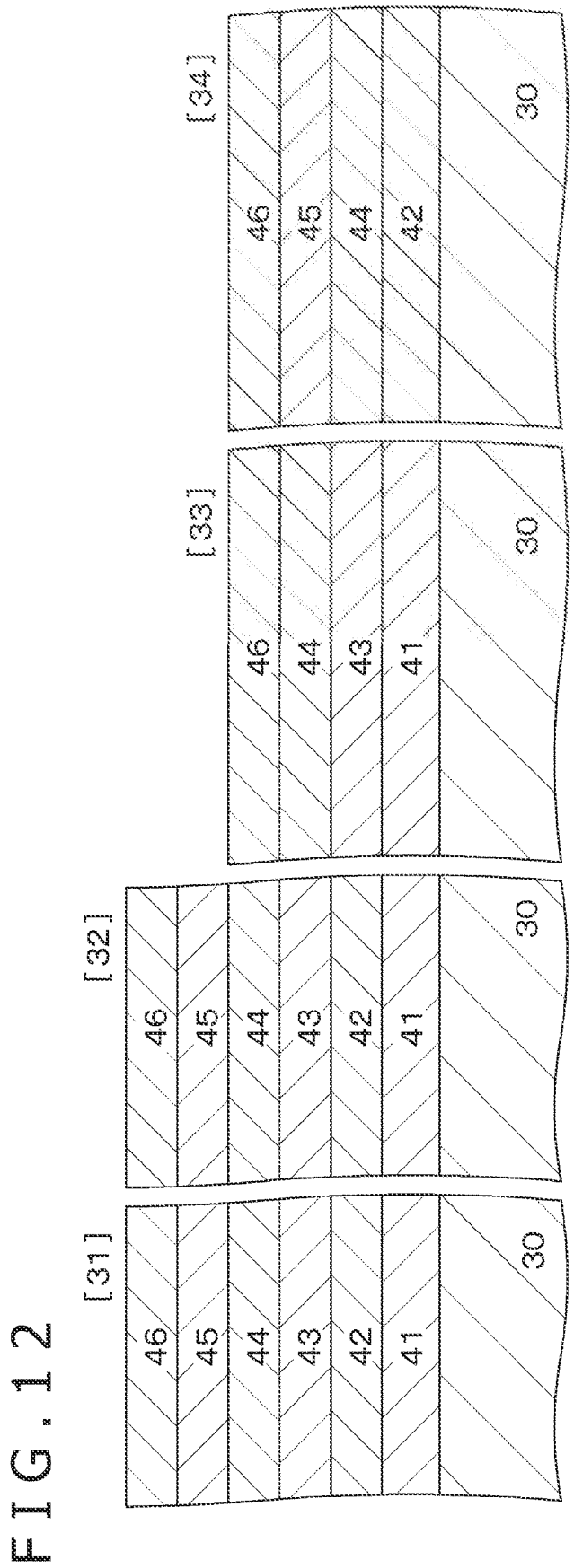
FIG. 12 is a schematic partial cross-sectional diagram of the base and the like continuing from FIG. 11B, for explaining the manufacturing method of the semiconductor device of Embodiment 1, the diagrams being similar to the cross-sectional diagrams taken along the arrows A-A in FIG. 3A and the arrows B-B in FIG. 3B.

Next, the third Si—Ge layer 45 is formed on the entire surface by a known method (see FIG. 11A), and then the third Si-layer 45 on the third region 33 is removed by a known method. As a result, a structure depicted in FIG. 11B is obtained.

[Step-100F]

Figure 13:
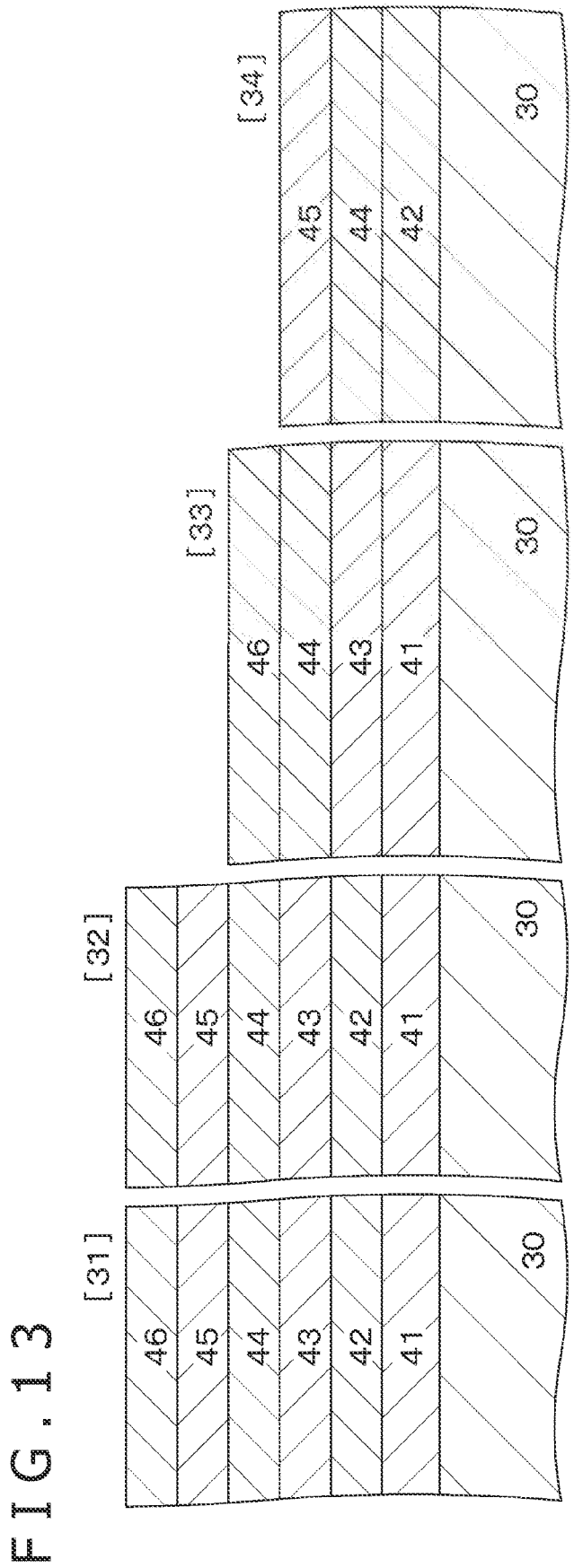
FIG. 13 is a schematic partial cross-sectional diagram of the base and the like continuing from FIG. 12, for explaining the manufacturing method of the semiconductor device of Embodiment 1, the diagrams being similar to the cross-sectional diagrams taken along the arrows A-A in FIG. 3A and the arrows B-B in FIG. 3B.
Figure 14:
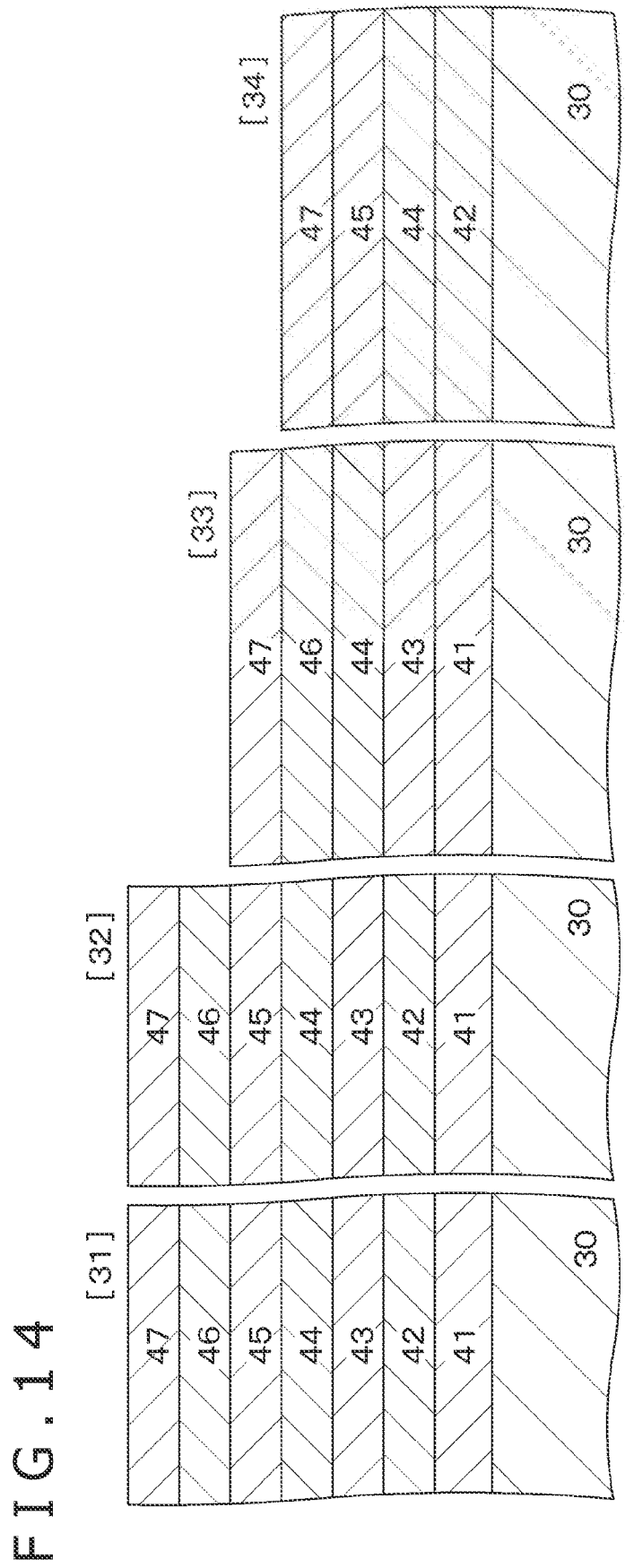
FIG. 14 is a schematic partial cross-sectional diagram of the base and the like continuing from FIG. 13, for explaining the manufacturing method of the semiconductor device of Embodiment 1, the diagrams being similar to the cross-sectional diagrams taken along the arrows A-A in FIG. 3A and the arrows B-B in FIG. 3B.

Then, the third Si layer 46 is formed on the entire surface by a known method (see FIG. 12), and then the third Si layer 46 on the fourth region 34 is removed by a known method. As a result, a structure depicted in FIG. 13 is obtained.

[Step-100G]

Figure 15:
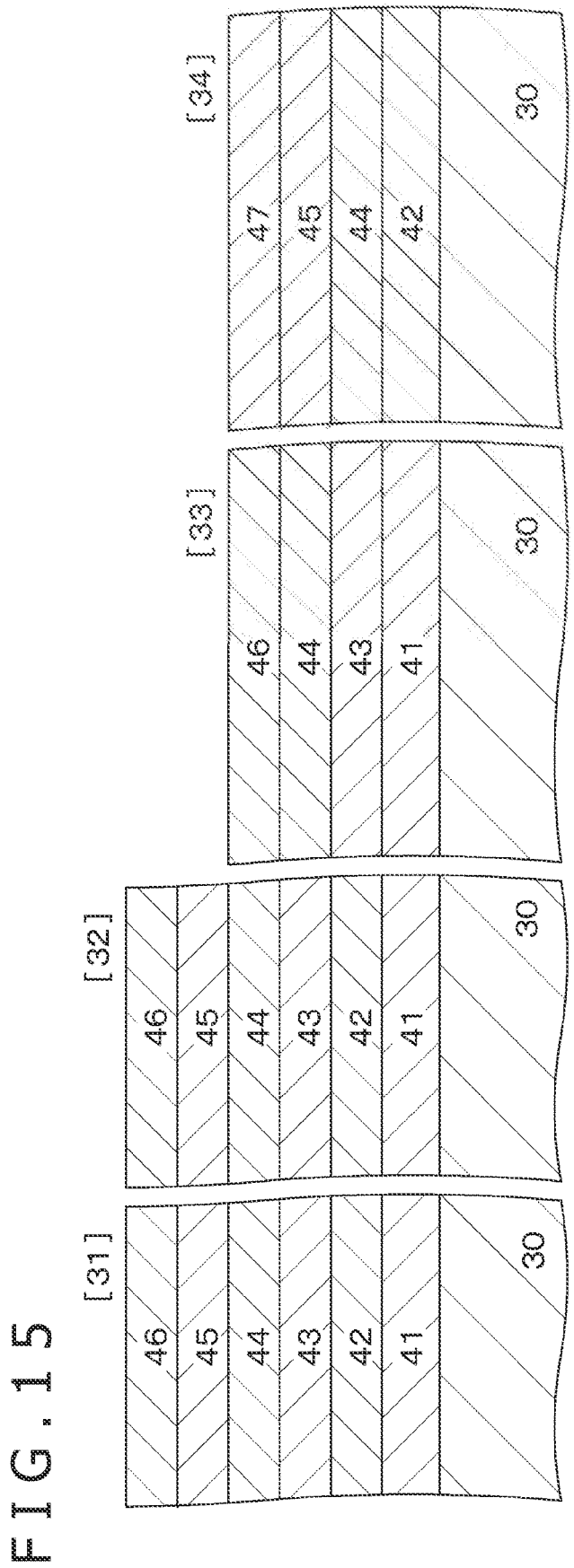
FIG. 15 is a schematic partial cross-sectional diagram of the base and the like continuing from FIG. 14, for explaining the manufacturing method of the semiconductor device of Embodiment 1, the diagrams being similar to the cross-sectional diagrams taken along the arrows A-A in FIG. 3A and the arrows B-B in FIG. 3B.
Figure 16:
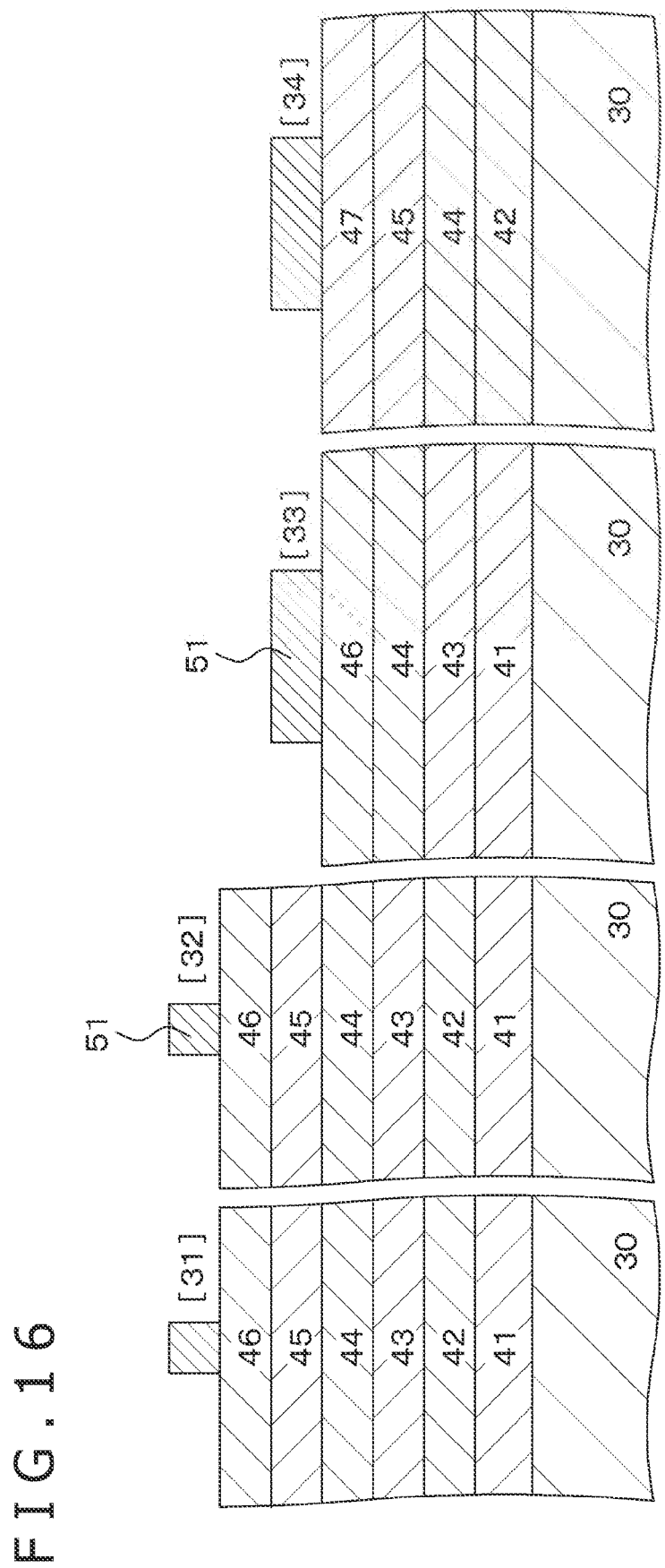
FIG. 16 is a schematic partial cross-sectional diagram of the base and the like continuing from FIG. 15, for explaining the manufacturing method of the semiconductor device of Embodiment 1, the diagrams being similar to the cross-sectional diagrams taken along the arrows A-A in FIG. 3A and the arrows B-B in FIG. 3B.

Subsequently, the fourth Si—Ge layer 47 is formed on the entire surface by a known method (see FIG. 14), and then the fourth Si—Ge layer 47 on each of the first region 31, the second region 32, and the third region 33 is removed by a known method. As a result, a structure depicted in FIG. 15 is obtained.

In such manner, a laminated structure including the first Si—Ge layer 41, the first Si layer 42, the second Si—Ge layer 43, the second Si layer 44, the third Si—Ge layer 45, and the third Si layer 46 is formed on each of the first region 31 and the second region 32, a laminated structure including the first Si—Ge layer 41, the second Si—Ge layer 43, the second Si layer 44, and the third Si layer 46 is formed on the third region 33, and a laminated structure including the first Si layer 42, the second Si layer 44, the third Si—Ge layer 45, and the fourth Si—Ge layer 47 is formed on the fourth region 34.

[Step-110]

Figure 17:
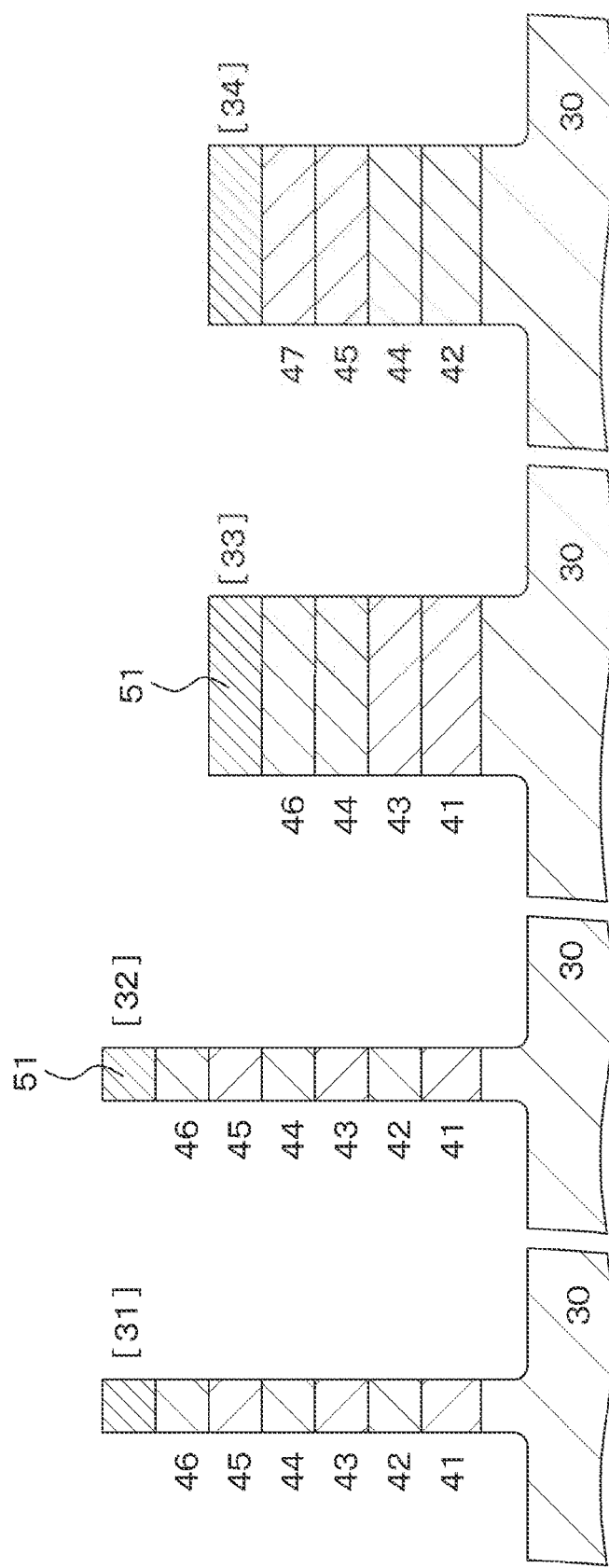
FIG. 17 is a schematic partial cross-sectional diagram of the base and the like continuing from FIG. 16, for explaining the manufacturing method of the semiconductor device of Embodiment 1, the diagrams being similar to the cross-sectional diagrams taken along the arrows A-A in FIG. 3A and the arrows B-B in FIG. 3B.
Figure 18:
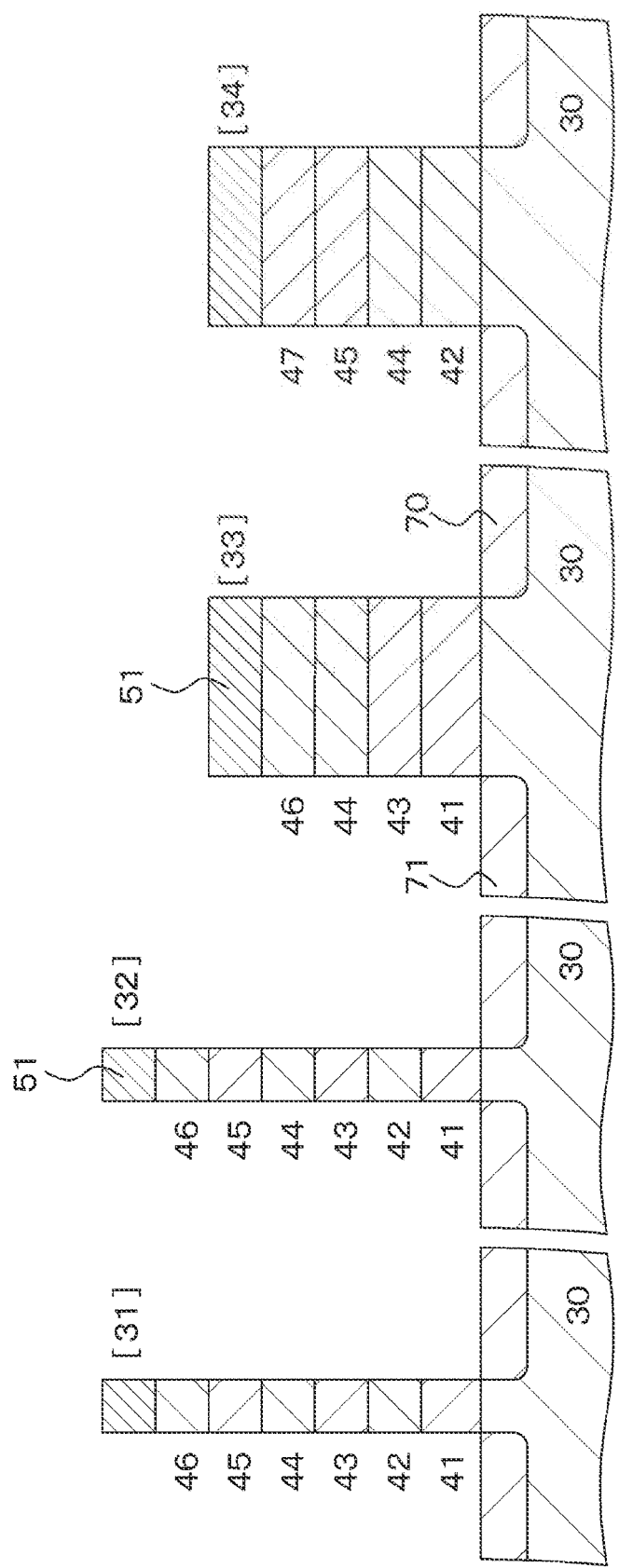
FIG. 18 is a schematic partial cross-sectional diagram of the base and the like continuing from FIG. 17, for explaining the manufacturing method of the semiconductor device of Embodiment 1, the diagrams being similar to the cross-sectional diagrams taken along the arrows A-A in FIG. 3A and the arrows B-B in FIG. 3B.

Thereafter, to form the channel structure portions 11n and 11p, a mask layer 51 made of SiN is formed by a known method on the third Si layer 46 of each of the first region 31 and the second region 32, on the third Si layer 46 of the third region 33, and on the fourth Si—Ge layer 47 of the fourth region 34 (see FIG. 16), the laminated structure in each of the first region 31, the second region 32, the third region 33, and the fourth region 34 is etched using the mask layer 51 as an etching mask, and further, a part of the exposed base 30 in a thickness direction is etched. As a result, a structure depicted in FIG. 17 is obtained. A groove for forming the element separation region 70 having a shallow-trench structure is formed in the base 30. Subsequently, a film of the insulation material 71 made of $SiO_2$ is formed on the entire surface, and a top surface is smoothed using CMP. Following this, the insulation material 71 is etched and left in the groove to form the element separation region 70 having the shallow-trench structure (see FIG. 18). Note that formation of the element separation region 70 in the first field effect transistors 10n and 10p and formation of the element separation region 70 in the second field effect transistors 20n and 20p may be performed either simultaneously or independently.

[Step-120]

Figure 22:
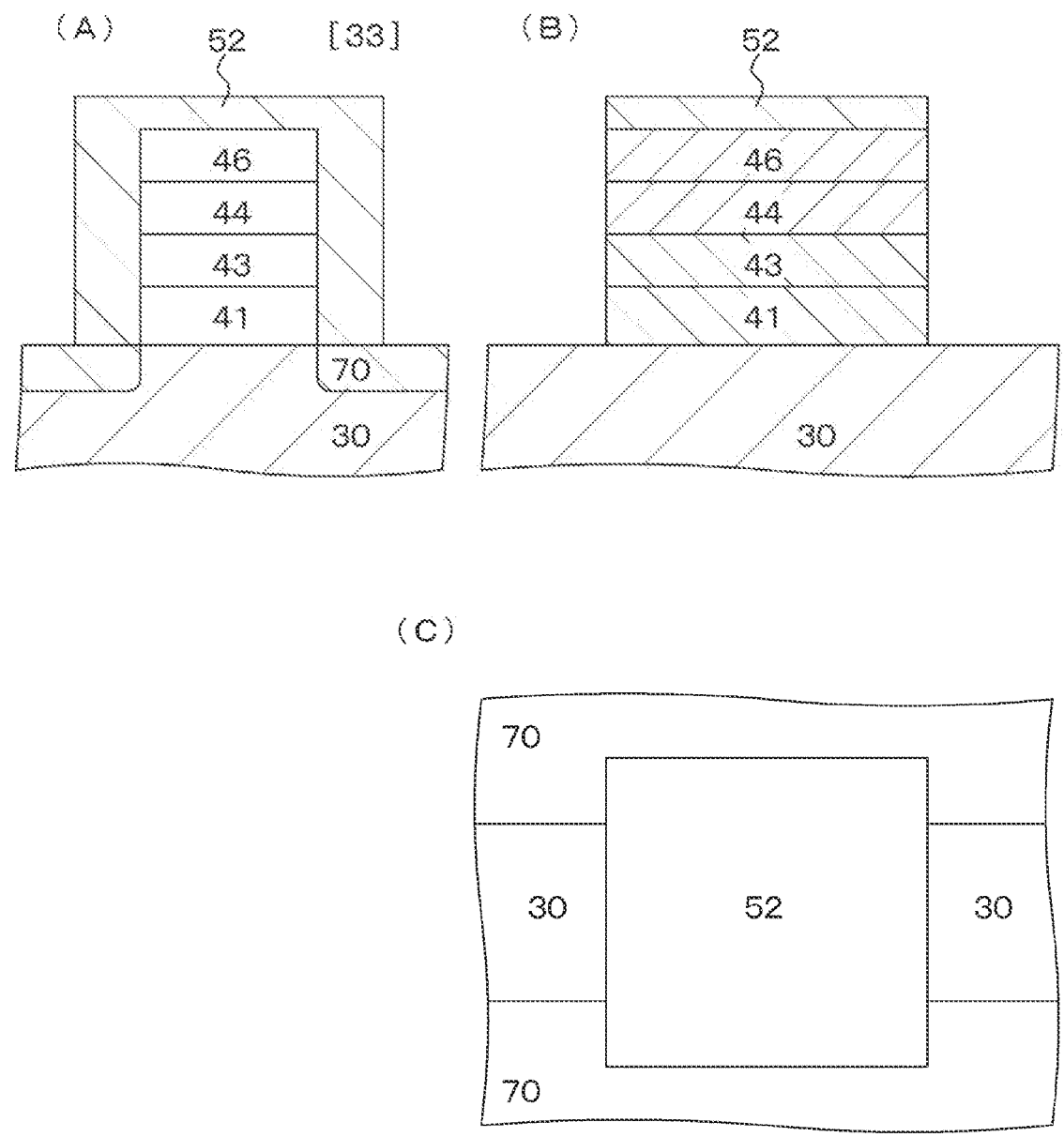
FIG. 22 (A), (B), and (C) of FIG. 22 are schematic partial cross-sectional diagrams and a schematic partial plan diagram continuing from (A), (B), and (C) of FIG. 20 and depicting the second field effect transistor included in the semiconductor device of Embodiment 1 in a midway of a manufacturing step of the semiconductor device of Embodiment 1.
Figure 23:
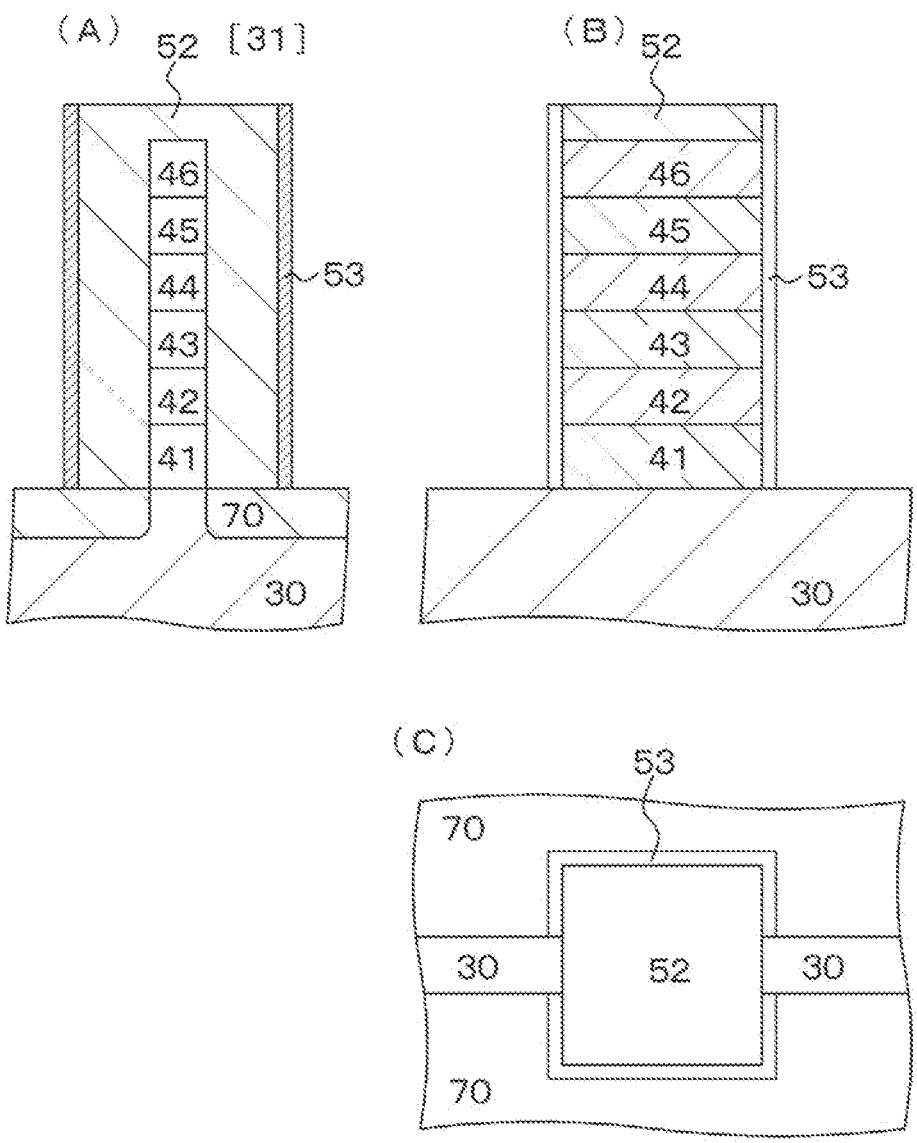
FIG. 23 (A), (B), and (C) of FIG. 23 are schematic partial cross-sectional diagrams and a schematic partial plan diagram continuing from (A), (B), and (C) of FIG. 21 and depicting the first field effect transistor included in the semiconductor device of Embodiment 1 in a midway of a manufacturing step of the semiconductor device of Embodiment 1.

Subsequently, the mask layer 51 is removed (see (A), (B), and (C) in FIGS. 19 and (A), (B), and (C) in FIG. 20), and then thermal oxidation treatment is performed to form an unillustrated dummy oxide layer on a surface of the laminated structure of each of the first region 31, the second region 32, the third region 33, and the fourth region 34. Thereafter, a dummy gate portion covering the laminated structure of the first region 31, a dummy gate portion covering the laminated structure of the second region 32, a dummy gate portion covering the laminated structure of the third region 33, and a dummy gate portion covering the laminated structure of the fourth region 34 are formed by a known method. Each of the dummy gate portions is indicated by a reference number 52. Each of the dummy gate portions 52 is made of polysilicon. Subsequently, the laminated structure on each of the first region 31, the second region 32, the third region 33, and the fourth region 34 each in an exposed state is etched using the dummy gate portion 52 as an etching mask. As a result, a structure depicted in each of (A), (B), and (C) in FIGS. 21 and (A), (B), and (C) in FIG. 22 is obtained. A similar structure is also providable in each of the second region 32 and the fourth region 34.

[Step-130]

Figure 24:
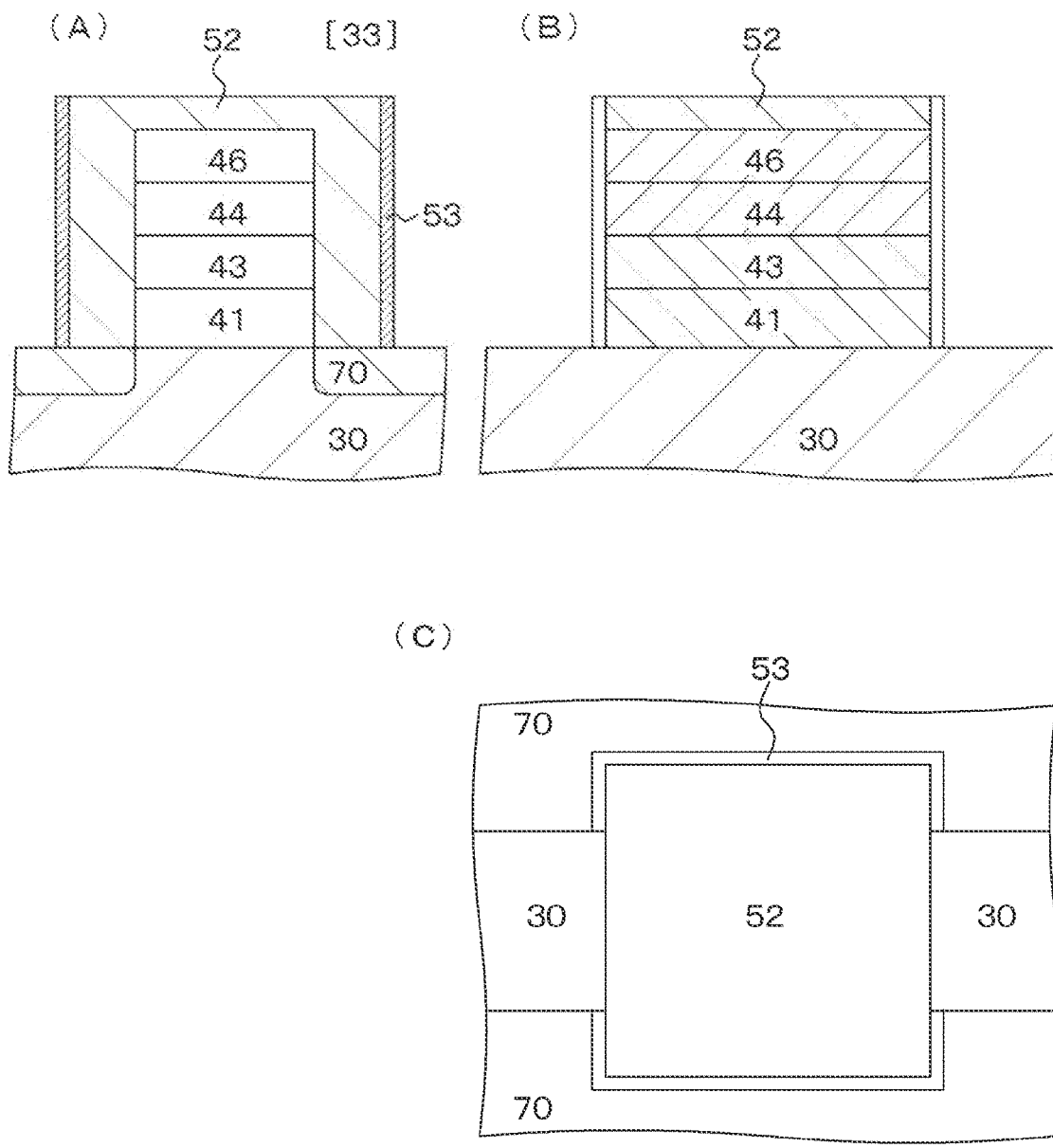
FIG. 24 (A), (B), and (C) of FIG. 24 are schematic partial cross-sectional diagrams and a schematic partial plan diagram continuing from (A), (B), and (C) of FIG. 22 and depicting the second field effect transistor included in the semiconductor device of Embodiment 1 in a midway of a manufacturing step of the semiconductor device of Embodiment 1.

Thereafter, a SiN layer is formed on the entire surface. This Sin layer is etched back to form a side wall 53 made of SiN on a side surface of the dummy gate portion 52. However, the side wall 53 is not formed on portions corresponding to both ends of the channel portions 13n and 13p and both ends of the channel forming layers 23n and 23p. As a result, a structure depicted in each of (A), (B), and (C) in FIGS. 23 and (A), (B), and (C) in FIG. 24 is obtained. A similar structure is also providable in each of the second region 32 and the fourth region 34.

[Step-140]

Thereafter, a phosphor-doped SiC layer 54n for forming the source/drain region 18n constituting the first field effect transistor 10n and the source/drain region 28n constituting the second field effect transistor 20n is epitaxially grown from the surface of the exposed base 30 by a known method, and then patterned by a known method. As a result, the source/drain region 18n constituting the first field effect transistor 10n and the source/drain region 28n constituting the second field effect transistor 20n are obtained. Similarly, a boron-doped Si—Ge layer 54p for forming the source/drain region 18p constituting the first field effect transistor 10p and the source/drain region 28p constituting the second field effect transistor 20p is epitaxially grown from the surface of the exposed base 30 by a known method, and then patterned by a known method. In this manner, the source/drain region 18p constituting the first field effect transistor 10p and the source/drain region 28p constituting the second field effect transistor 20p are obtained.

Figure 25:
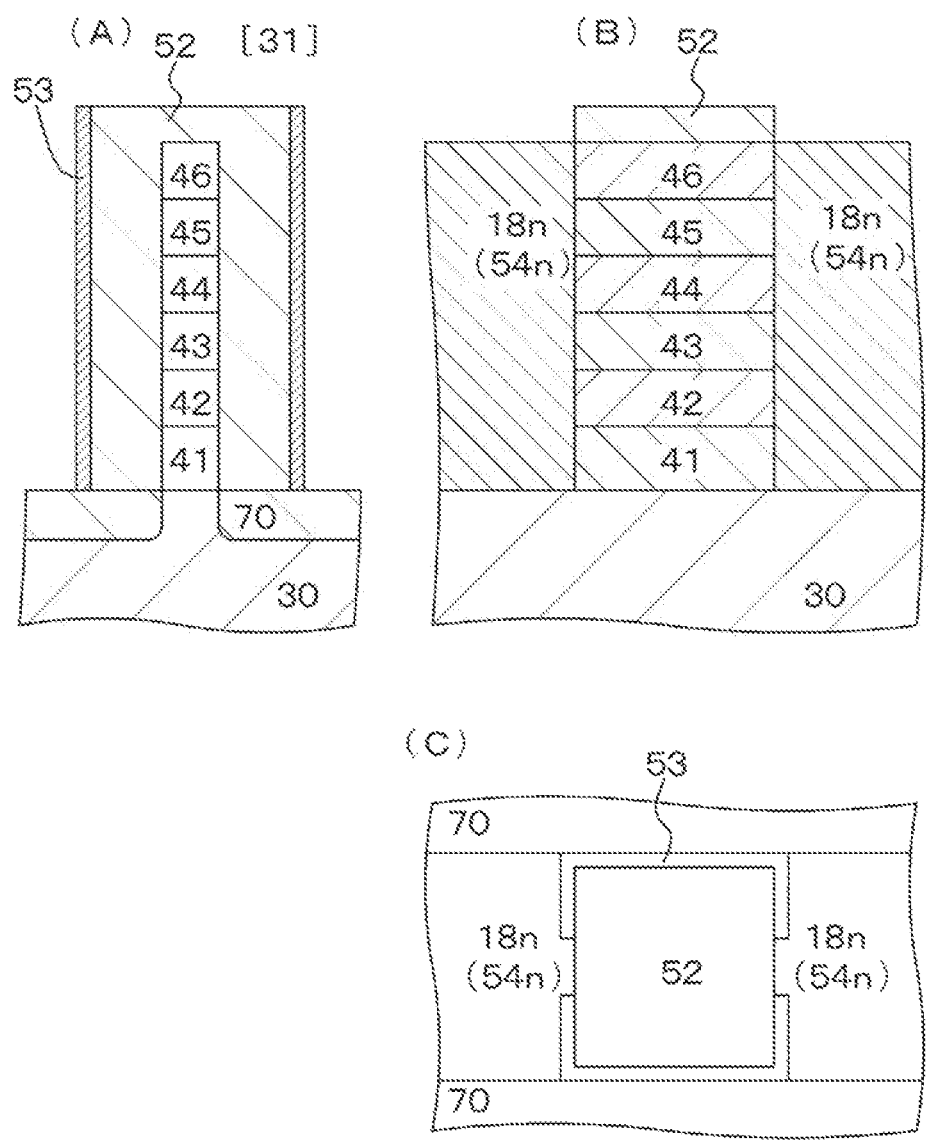
FIG. 25 (A), (B), and (C) of FIG. 25 are schematic partial cross-sectional diagrams and a schematic partial plan diagram continuing from (A), (B), and (C) of FIG. 23 and depicting the first field effect transistor included in the semiconductor device of Embodiment 1 in a midway of a manufacturing step of the semiconductor device of Embodiment 1.
Figure 26:
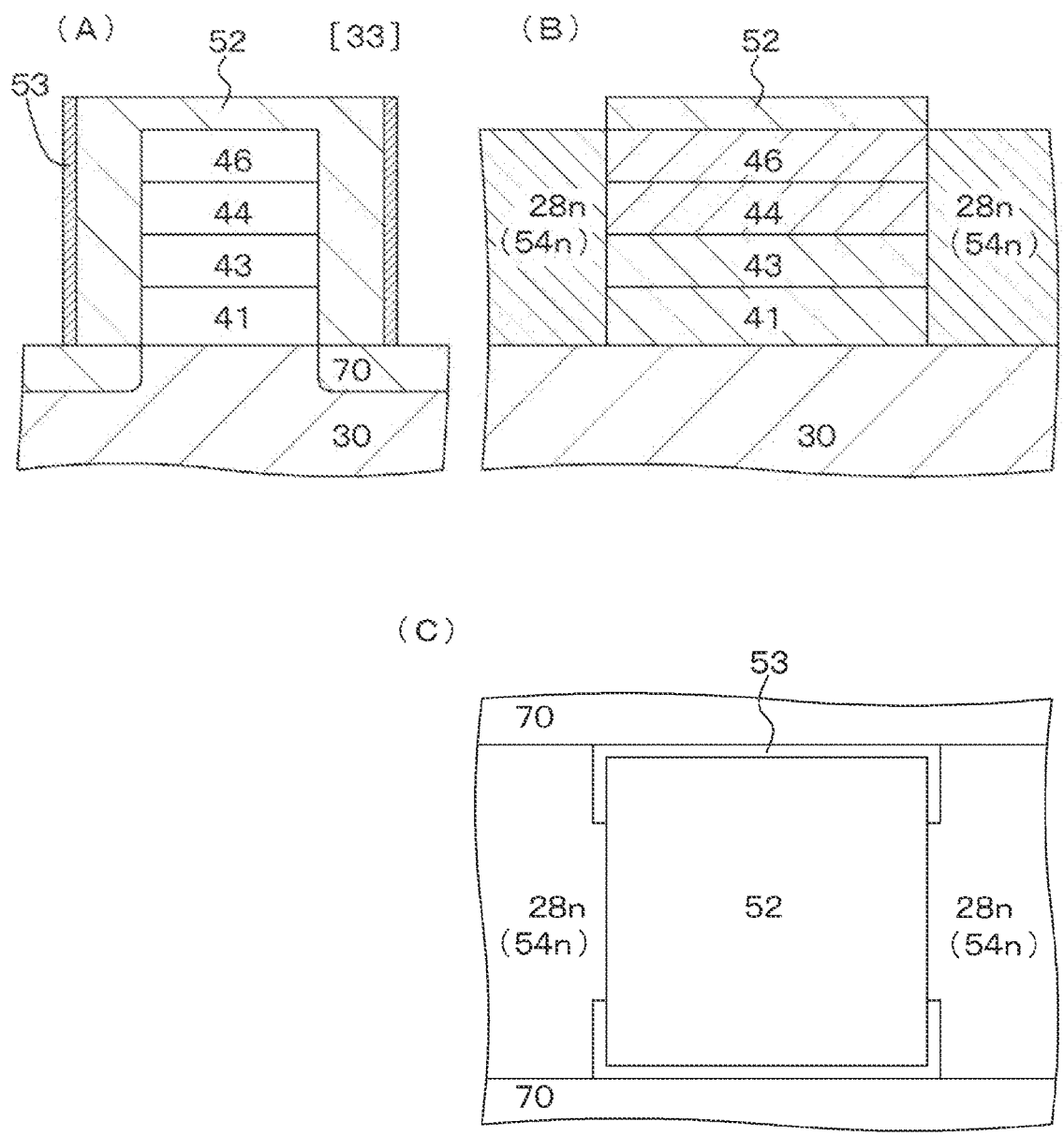
FIG. 26 (A), (B), and (C) of FIG. 26 are schematic partial cross-sectional diagrams and a schematic partial plan diagram continuing from (A), (B), and (C) of FIG. 24 and depicting the second field effect transistor included in the semiconductor device of Embodiment 1 in a midway of a manufacturing step of the semiconductor device of Embodiment 1.
Figure 29:
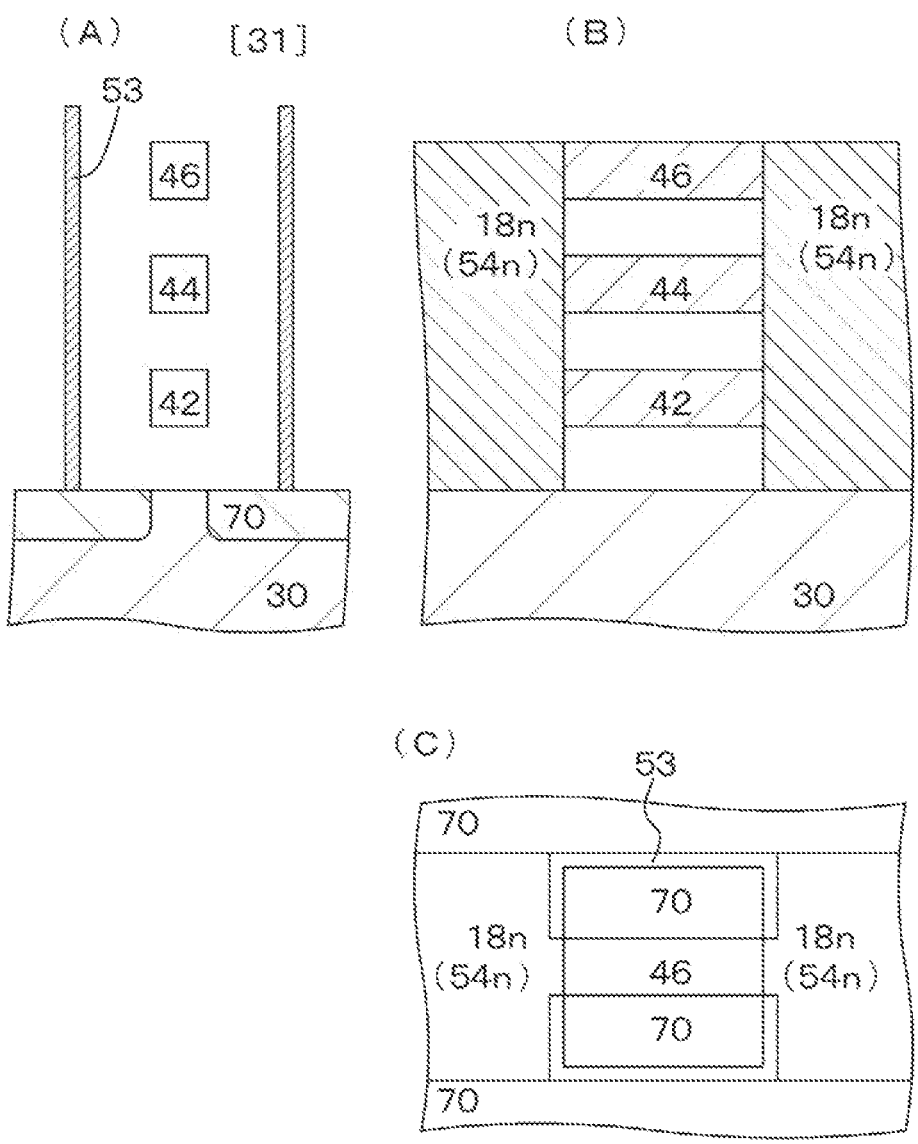
FIG. 29 (A), (B), and (C) of FIG. 29 are schematic partial cross-sectional diagrams and a schematic partial plan diagram continuing from (A), (B), and (C) of FIG. 27 and depicting the first field effect transistor included in the semiconductor device of Embodiment 1 in a midway of a manufacturing step of the semiconductor device of Embodiment 1.
Figure 30:
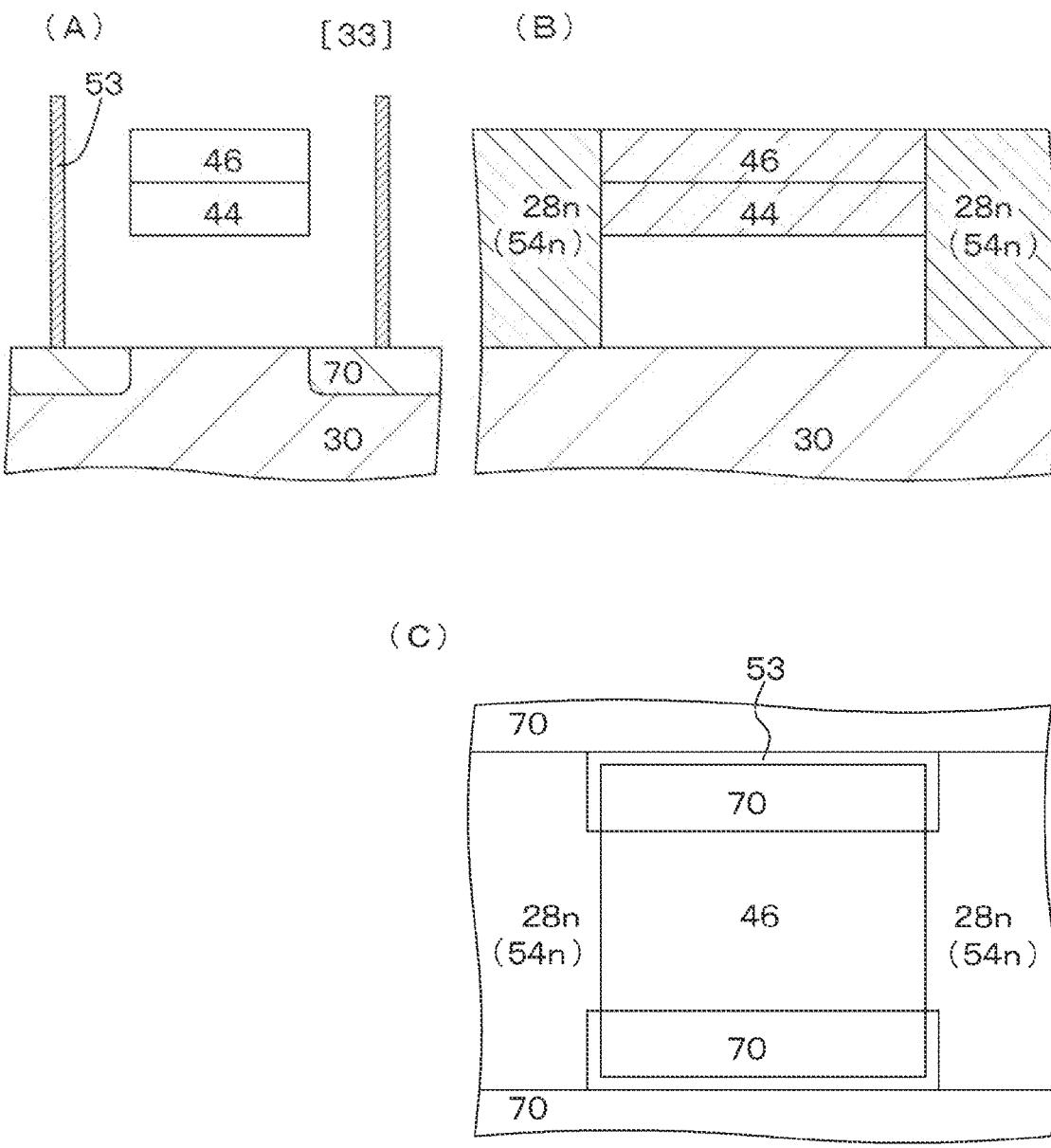
FIG. 30 (A), (B), and (C) of FIG. 30 are schematic partial cross-sectional diagrams and a schematic partial plan diagram continuing from (A), (B), and (C) of FIG. 28 and depicting the second field effect transistor included in the semiconductor device of Embodiment 1 in a midway of a manufacturing step of the semiconductor device of Embodiment 1.

As a result, a structure depicted in each of (A), (B), and (C) in FIGS. 25 and (A), (B), and (C) in FIG. 26 is obtained. A similar structure is also providable in each of the second region 32 and the fourth region 34. A part of the source/drain region 18n is in contact with the side surface of the laminated structure in the first region 31, while the remaining part is in contact with the side wall 53. Similarly, a part of the source/drain region 18p is in contact with the side surface of the laminated structure in the second region 32, while the remaining part is in contact with the side wall. A part of the source/drain region 28n is in contact with the side surface of the laminated structure in the third region 33, while the remaining part is in contact with the side wall 53. A part of the source/drain region 28p is in contact with the side surface of the laminated structure in the fourth region 34, while the remaining part is in contact with the side wall.

[Step-150]

Figure 32:
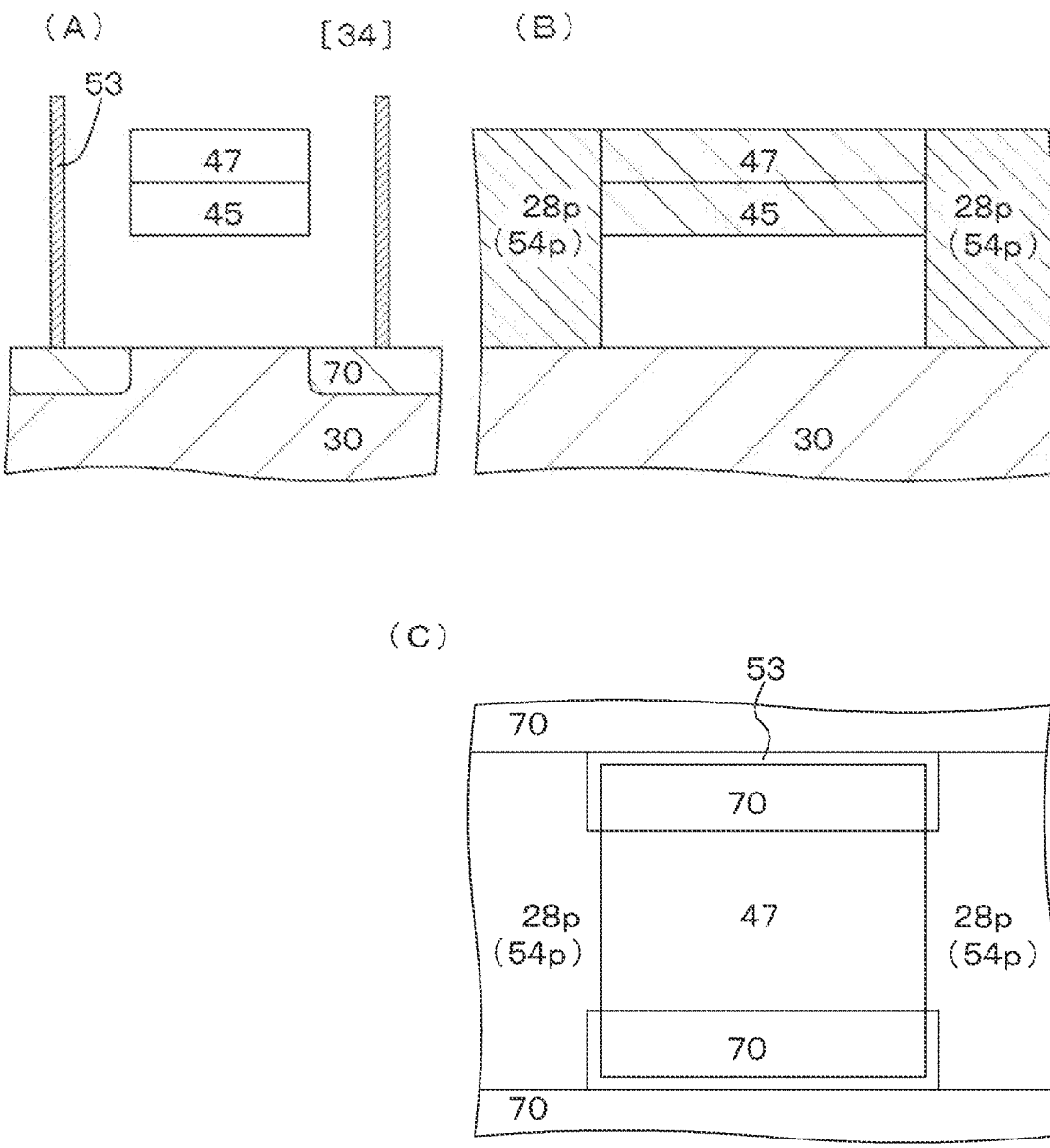
FIG. 32 (A), (B), and (C) of FIG. 32 are schematic partial cross-sectional diagrams and a schematic partial plan diagram continuing from (A), (B), and (C) of FIG. 28 and depicting the second field effect transistor included in the semiconductor device of Embodiment 1 in a midway of a manufacturing step of the semiconductor device of Embodiment 1.

Subsequently, the dummy gate portion 52 is removed by a known method [see (A), (B), and (C) of FIGS. 27 and (A), (B), and (C) of FIG. 28], and an unillustrated dummy oxide layer is further removed by a known method. Then, the third Si—Ge layer 45, the second Si—Ge layer 43, and the first Si—Ge layer 41 in the laminated structure of the first region 31 are selectively removed, and the second Si—Ge layer 43 and the first Si—Ge layer 41 in the laminated structure of the third region 33 are selectively removed. Moreover, the third Si layer 46, the second Si layer 44, and the first Si layer 42 in the laminated structure of the second region 32 are selectively removed, and the second Si layer 44 and the first Si layer 42 in the laminated structure of the fourth region 34 are selectively removed. As a result, a structure depicted in each of (A), (B), and (C) in FIGS. 29, (A), (B), and (C) in FIGS. 30, (A), (B), and (C) in FIG. 31, and (A), (B), and (C) in FIG. 32 is obtained.

[Step-160]

Figure 34:
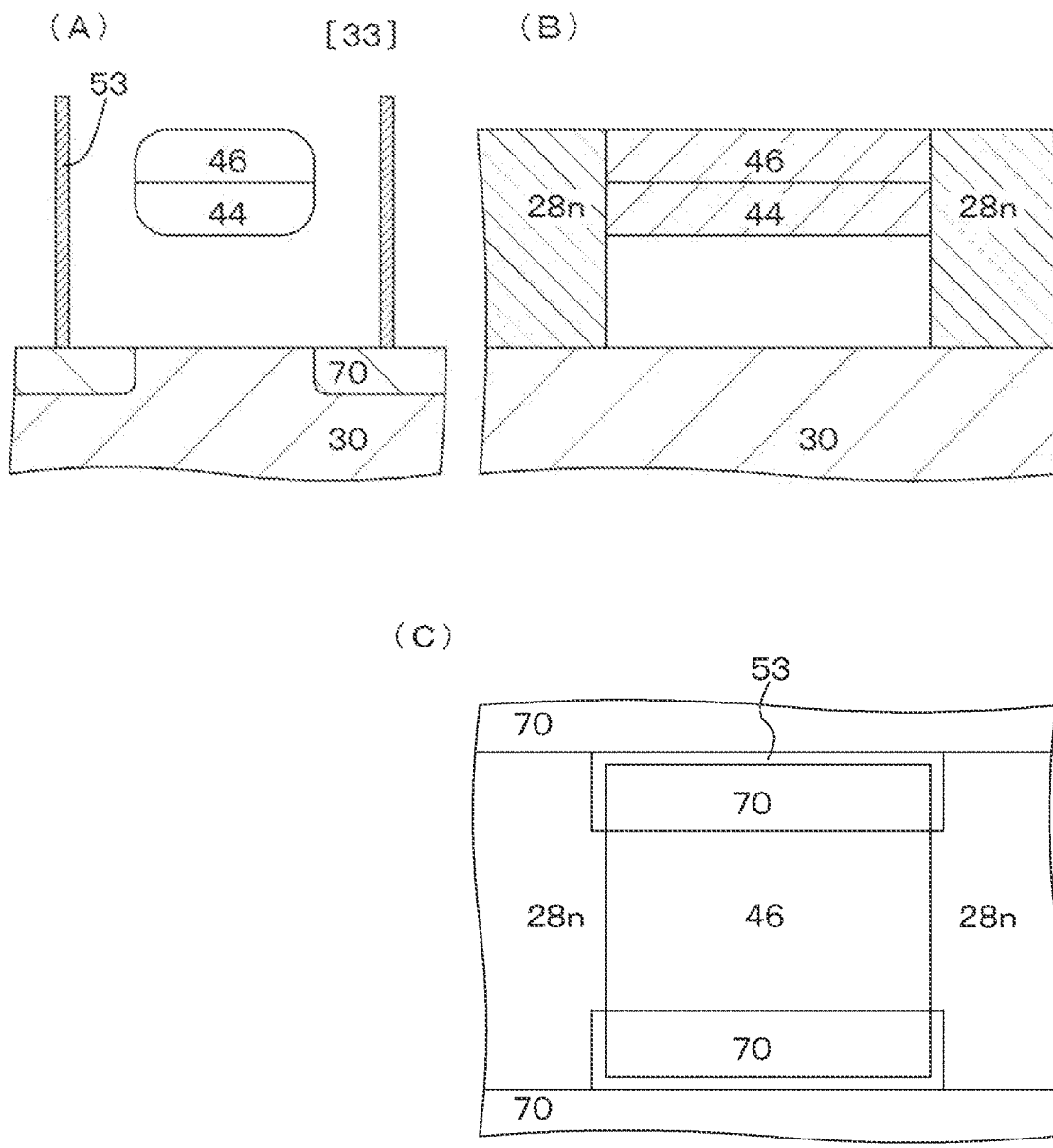
FIG. 34 (A), (B), and (C) of FIG. 34 are schematic partial cross-sectional diagrams and a schematic partial plan diagram continuing from (A), (B), and (C) of FIG. 30 and depicting the second field effect transistor included in the semiconductor device of Embodiment 1 in a midway of a manufacturing step of the semiconductor device of Embodiment 1.

Subsequently, outer peripheries of the third Si layer 46, the second Si layer 44, and the first Si layer 42 each exposed in the first region 31, the third Si—Ge layer 45, the second Si—Ge layer 43, and the first Si—Ge layer 41 each exposed in the second region 32, the second Si layer 44 and the first Si layer 42 each exposed in the third region 33, and the second Si—Ge layer 43 and the first Si—Ge layer 41 each exposed in the fourth region 34 are thermally oxidized to form an oxide film. After this thermal oxidation treatment, a cross-sectional shape of each of the nanowire structures 12n and 12p of the first field effect transistors 10n and 10p having the nanowire structure becomes circular. Note that these oxide films are not depicted in the figures. As a result, a structure depicted in each of (A), (B), and (C) in FIGS. 33 and (A), (B), and (C) in FIG. 34 is obtained. A similar structure is also providable in each of the second region 32 and the fourth region 34.

[Step-170A]

Figure 35:
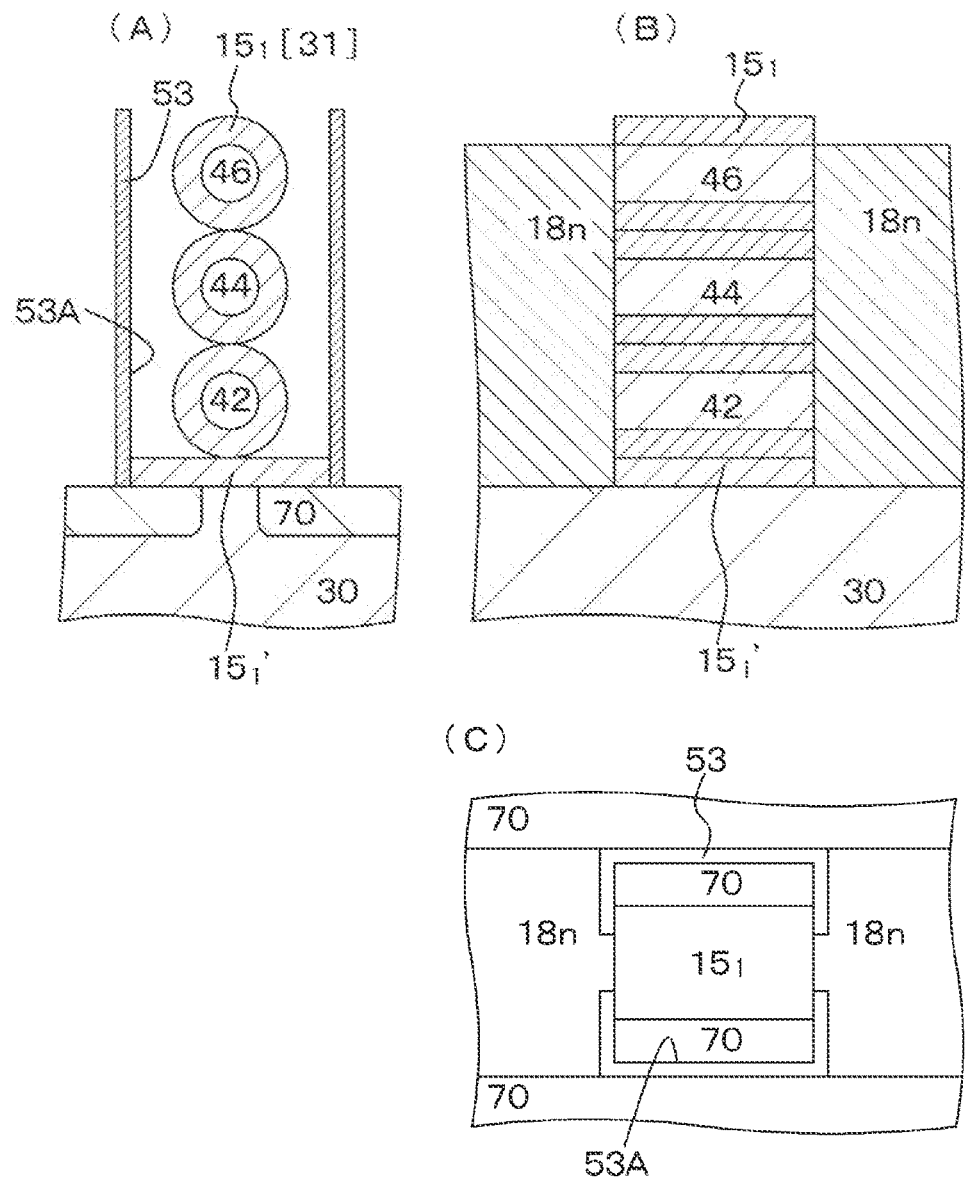
FIG. 35 (A), (B), and (C) of FIG. 35 are schematic partial cross-sectional diagrams and a schematic partial plan diagram continuing from (A), (B), and (C) of FIG. 33 and depicting the first field effect transistor included in the semiconductor device of Embodiment 1 in a midway of a manufacturing step of the semiconductor device of Embodiment 1.
Figure 36:
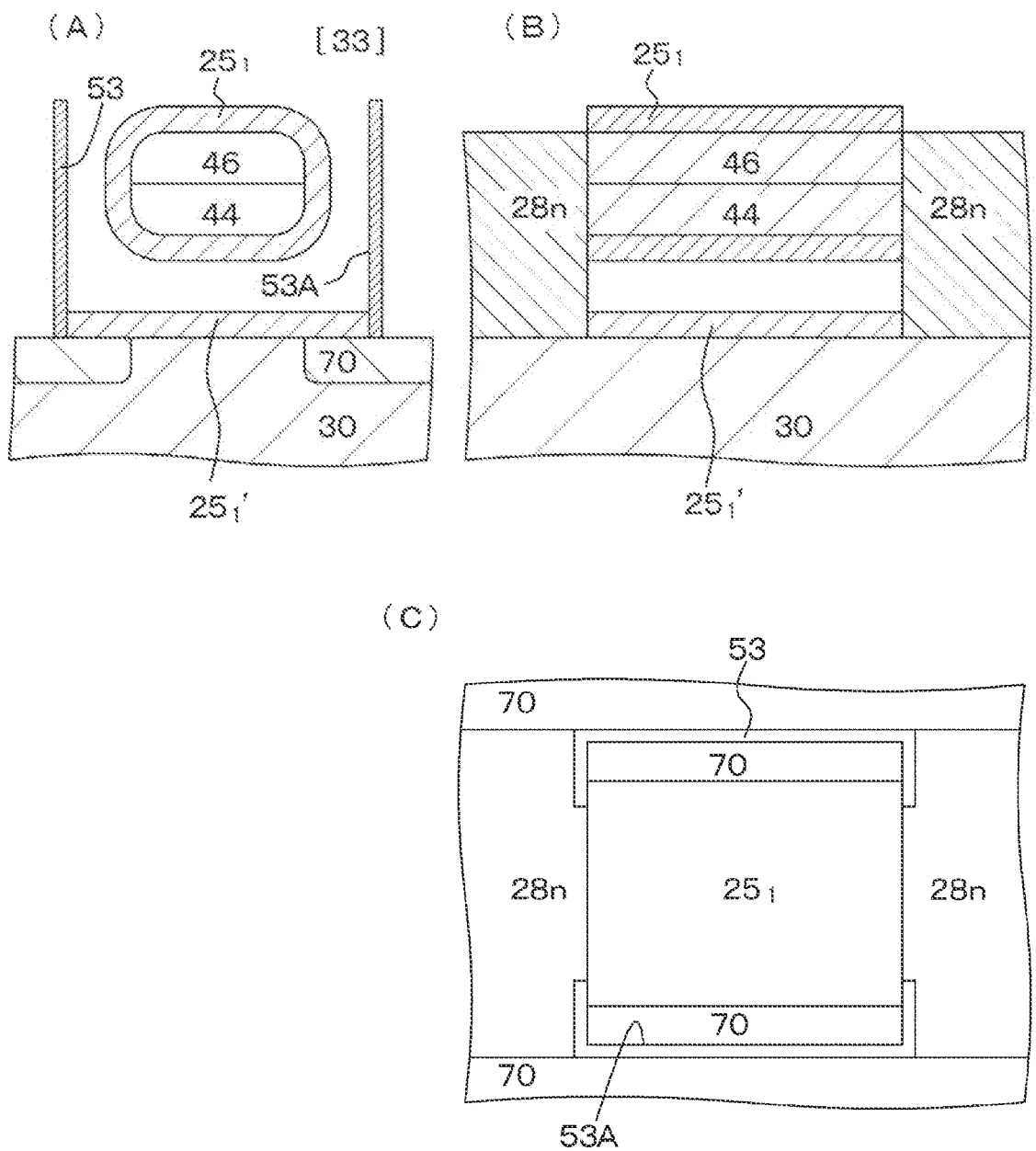
FIG. 36 (A), (B), and (C) of FIG. 36 are schematic partial cross-sectional diagrams and a schematic partial plan diagram continuing from (A), (B), and (C) of FIG. 34 and depicting the second field effect transistor included in the semiconductor device of Embodiment 1 in a midway of a manufacturing step of the semiconductor device of Embodiment 1.

Thereafter, a gate insulation film $15_1$ (made of $SiO_2$) constituting a lower layer of the gate insulation film 14 is formed on the formed oxide film by atomic layer deposition (ALD), and also a gate insulation layer $25_1$ (made of $SiO_2$) constituting a lower layer of the gate insulation layer 24 is formed on the formed oxide film. As a result, a structure depicted in each of (A), (B), and (C) in FIGS. 35 and (A), (B), and (C) in FIG. 36 is obtained. A similar structure is also providable in each of the second region 32 and the fourth region 34. Note that an insulation film similar to the gate insulation film and an insulation layer similar to the gate insulation layer are similarly accumulated on a side surface 53A inside the side wall 53. However, these film and layer are, in principle, not depicted in the figures.

[Step-170B]

Figure 37:
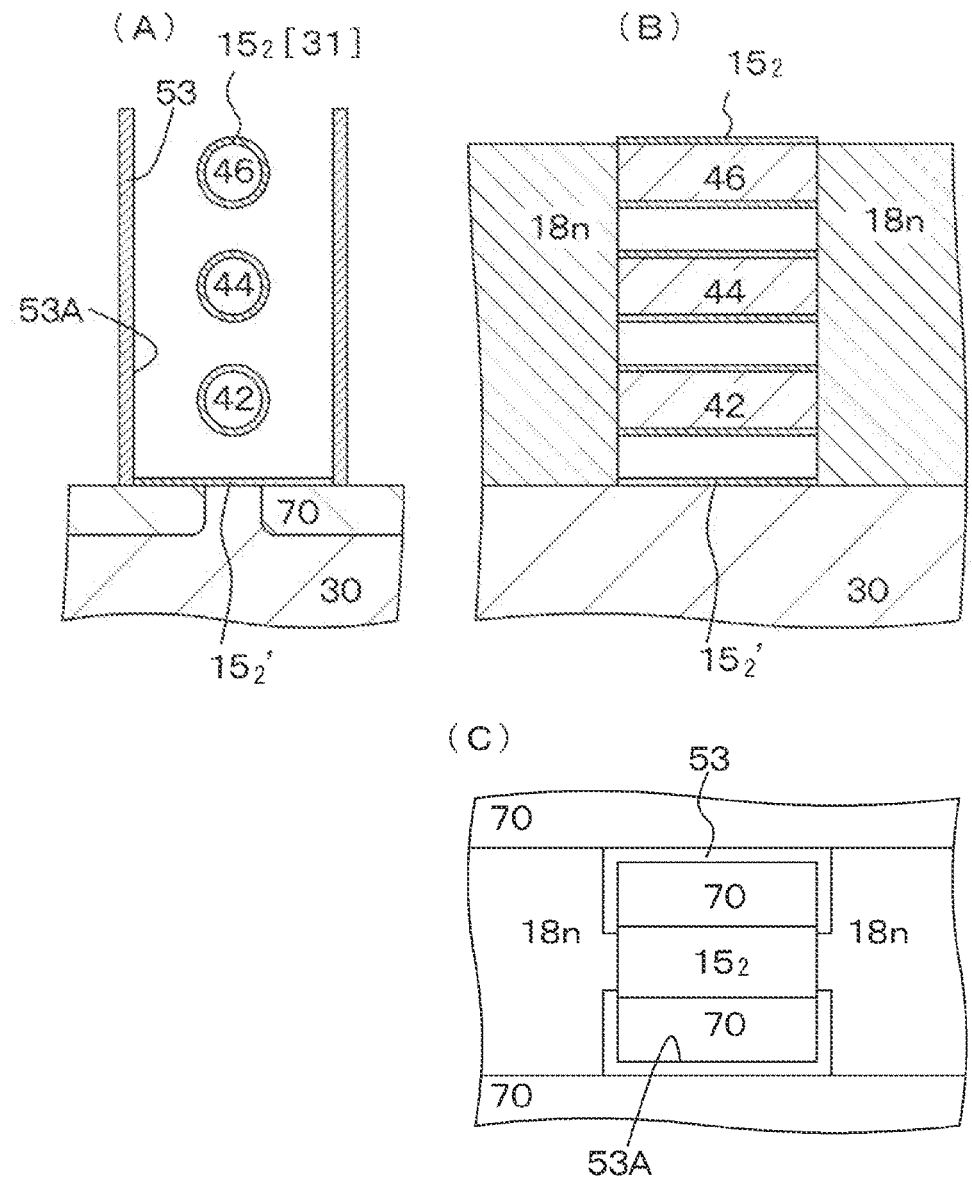
FIG. 37 (A), (B), and (C) of FIG. 37 are schematic partial cross-sectional diagrams and a schematic partial plan diagram continuing from (A), (B), and (C) of FIG. 35 and depicting the first field effect transistor included in the semiconductor device of Embodiment 1 in a midway of a manufacturing step of the semiconductor device of Embodiment 1.
Figure 38:
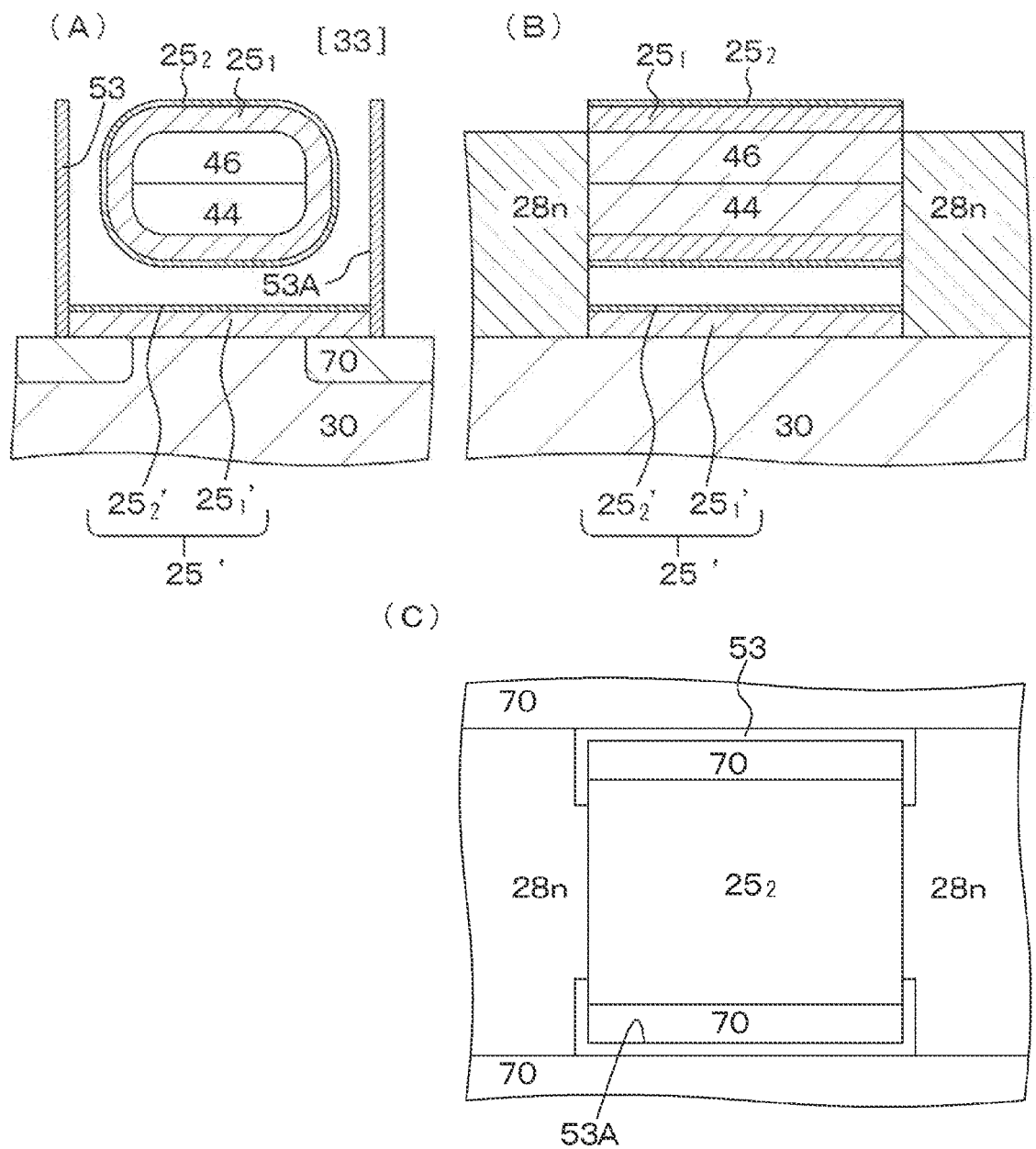
FIG. 38 (A), (B), and (C) of FIG. 38 are schematic partial cross-sectional diagrams and a schematic partial plan diagram continuing from (A), (B), and (C) of FIG. 36 and depicting the second field effect transistor included in the semiconductor device of Embodiment 1 in a midway of a manufacturing step of the semiconductor device of Embodiment 1.
Figure 39:
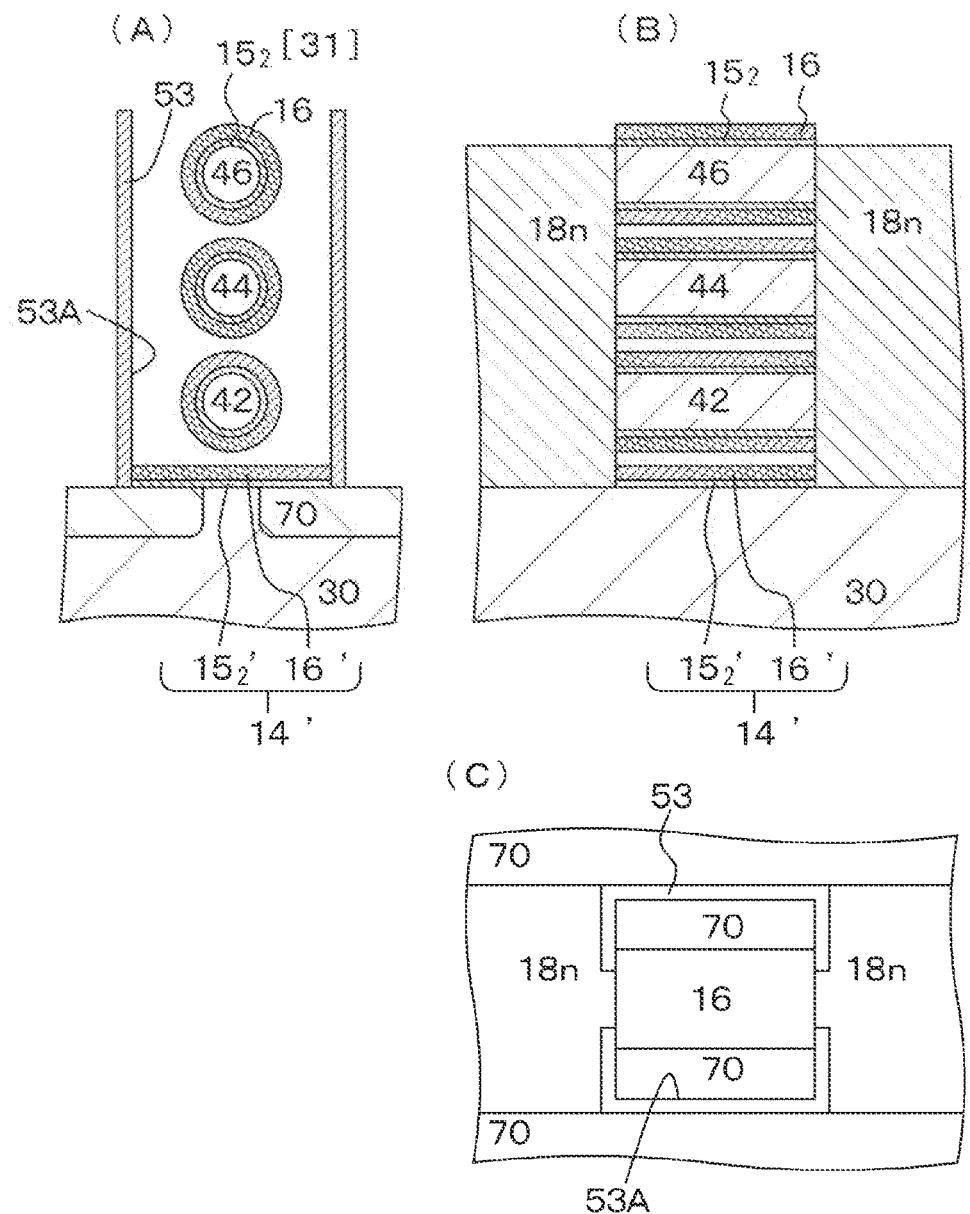
FIG. 39 (A), (B), and (C) of FIG. 39 are schematic partial cross-sectional diagrams and a schematic partial plan diagram continuing from (A), (B), and (C) of FIG. 37 and depicting the first field effect transistor included in the semiconductor device of Embodiment 1 in a midway of a manufacturing step of the semiconductor device of Embodiment 1.

Subsequently, the gate insulation film $15_1$ and a first insulation lower layer 15' of each of the first field effect transistors 10n and 10p are removed by a known method. Thereafter, again by ALD, a gate insulation film $15_2$ (made of $SiO_2$) constituting a lower layer of the gate insulation film 14 is formed on the formed oxide film, and also a gate insulation layer $25_2$ (made of $SiO_2$) constituting a lower layer of the gate insulation layer 24 is formed on the gate insulation layer $25_1$. The gate insulation film of each of the first field effect transistors 10n and 10p is constituted by the gate insulation film $15_2$. On the other hand, the gate insulation layer of each of the second field effect transistors 20n and 20p is constituted by a laminated structure of the gate insulation layer $25_1$ and the gate insulation layer $25_2$. In addition, a second insulation lower layer 25' (second insulation lower layers 25'1 and 25'2) having a thickness larger than a thickness of the first insulation lower layer 15' may be formed on the surface of the base 30. In this case, the first insulation lower layer 15' is formed simultaneously with the gate insulation film $15_2$, while the second insulation lower layer 25' is formed simultaneously with the gate insulation layer $25_1$ and the gate insulation layer $25_2$. As a result, a structure depicted in each of (A), (B), and (C) in FIGS. 37 and (A), (B), and (C) in FIG. 38 is obtained. A similar structure is also providable in each of the second region 32 and the fourth region 34.

Alternatively, the gate insulation layer $25_2$ may be formed on each of the second field effect transistors 20n and 20p without forming the gate insulation film $15_2$ on each of the first field effect transistors 10n and 10p. In this case, the gate insulation film of each of the first field effect transistors 10n and 10p is constituted by the gate insulation film $15_1$. On the other hand, the gate insulation layer of each of the second field effect transistors 20n and 20p is constituted by a laminated structure of the gate insulation layer $25_1$ and the gate insulation layer $25_2$. In this case as well, the second insulation lower layer 25' having a thickness larger than the thickness of the first insulation lower layer 15' may be formed on the surface of the base 30. The first insulation lower layer 15' is formed simultaneously with the gate insulation film $15_1$, while the second insulation lower layer 25' is formed simultaneously with the gate insulation layer $25_1$ and the gate insulation layer $25_2$.

Alternatively, formation of the gate insulation film 15 on each of the first field effect transistors 10n and 10p and formation of the gate insulation layer 25 on each of the second field effect transistors 20n and 20p may be performed independently. In this case, the gate insulation film of each of the first field effect transistors 10n and 10p is constituted by the gate insulation film 15. On the other hand, the gate insulation layer of each of the second field effect transistors 20n and 20p is constituted by the gate insulation layer 25. In this case as well, the second insulation lower layer 25' having a thickness larger than the thickness of the first insulation lower layer 15' may be formed on the surface of the base 30. In this case, the first insulation lower layer 15' is formed simultaneously with the gate insulation film 15, while the second insulation lower layer 25' is formed simultaneously with the gate insulation layer 25.

The gate insulation film 15 constituting each of the first field effect transistors 10n and 10p is formed by either the first ALD or the second ALD, while the gate insulation layer 25 constituting each of the second field effect transistors 20n and 20p is formed by the first and second ALD. Accordingly, the gate insulation film 15 and the gate insulation layer 25 each having a desired thickness can be obtained by controlling a thickness of an $SiO_2$ film or an $SiO_2$ layer formed by the first ALD and a thickness of an $SiO_2$ film or an $SiO_2$ layer formed by the second ALD. Alternatively, the gate insulation film 15 and the gate insulation layer 25 each having a desired thickness may be obtained by forming a single layer of the gate insulation film 15 on each of the first field effect transistors 10n and 10p and forming a plurality of the gate insulation layers 25 on each of the second field effect transistors 20n and 20p, or by independently performing formation of the gate insulation film 15 on each of the first field effect transistors 10n and 10p and formation of the gate insulation layer 25 on each of the second field effect transistors 20n and 20p.

[Step-170C]

Figure 40:
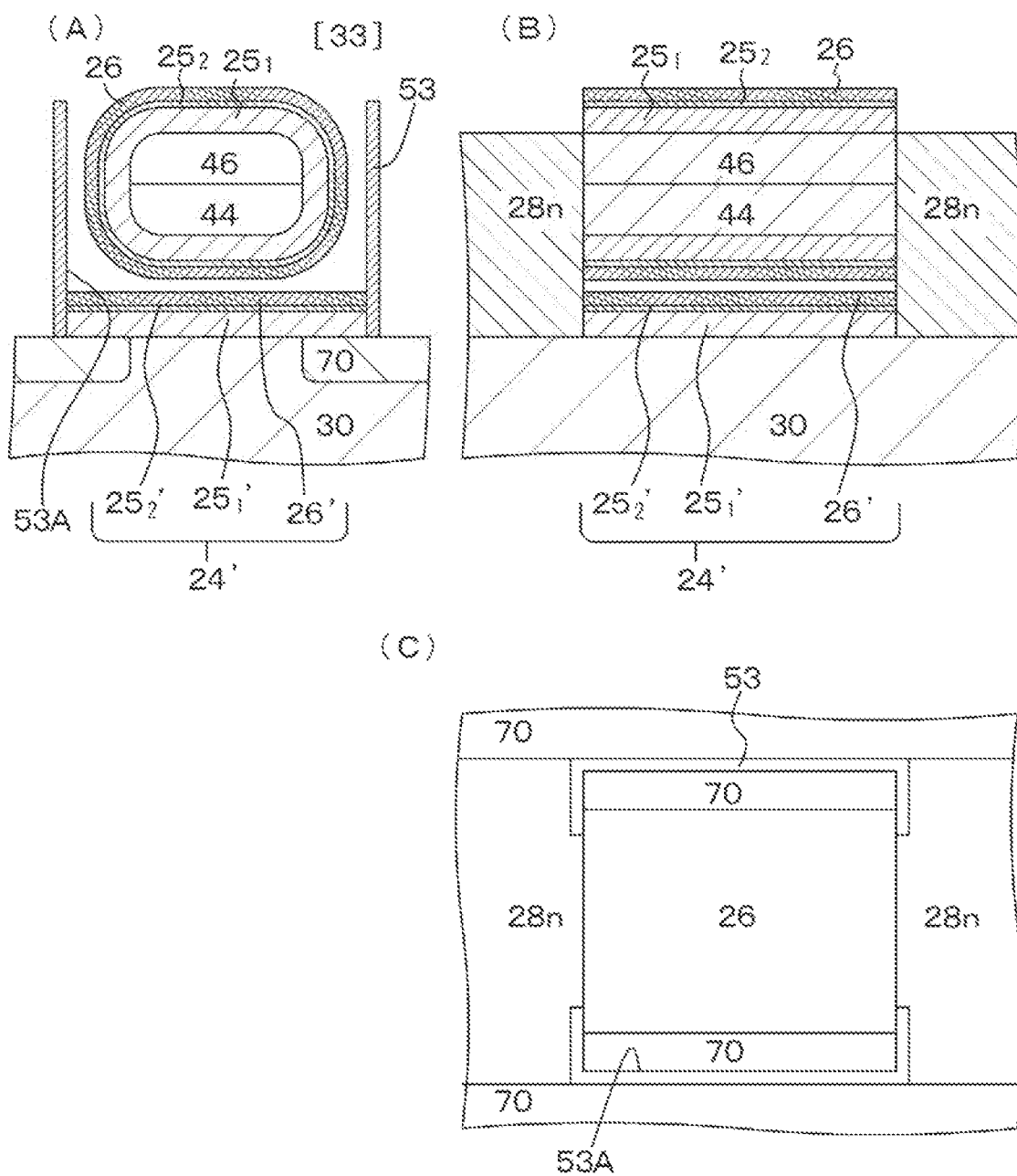
FIG. 40 (A), (B), and (C) of FIG. 40 are schematic partial cross-sectional diagrams and a schematic partial plan diagram continuing from (A), (B), and (C) of FIG. 38 and depicting the second field effect transistor included in the semiconductor device of Embodiment 1 in a midway of a manufacturing step of the semiconductor device of Embodiment 1.
Figure 41:
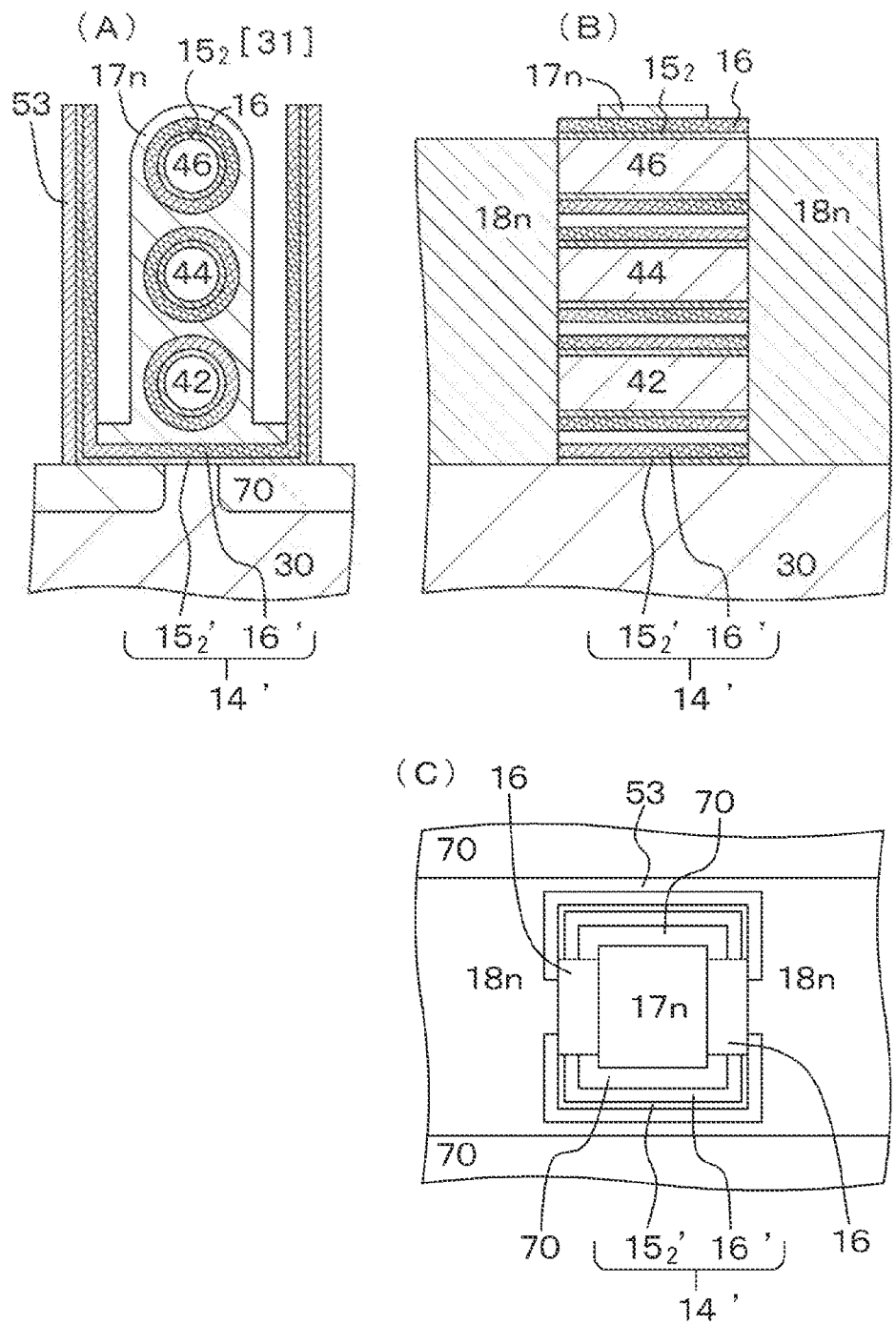
FIG. 41 (A), (B), and (C) of FIG. 41 are schematic partial cross-sectional diagrams and a schematic partial plan diagram continuing from (A), (B), and (C) of FIG. 39 and depicting the first field effect transistor included in the semiconductor device of Embodiment 1 in a midway of a manufacturing step of the semiconductor device of Embodiment 1.

Subsequently, the gate insulation film 16 and the gate insulation layer 26 constituting upper layers of the gate insulation film 14 and the gate insulation layer 24 are formed by ALD on the gate insulation film $15_2$ and the gate insulation layer $25_2$. Each of the gate insulation film 16 and the gate insulation layer 26 is made of $HfO_2$. Moreover, a first insulation upper layer 16' and a second insulation upper layer 26' may be formed on the surface of the base 30. As a result, a structure depicted in each of (A), (B), and (C) in FIGS. 39 and (A), (B), and (C) in FIG. 40 is obtained. A similar structure is also providable in each of the second region 32 and the fourth region 34.

By performing the processes described above, the first insulation layer 14' (having a configuration similar to the laminated configuration of the gate insulation film $15_2$ and the gate insulation film 16) is formed on the surface of the base 30 between the first gate electrode 17n in the lowermost layer and the surface of the base 30, and the second insulation layer 24' (having a configuration similar to the laminated configuration of the gate insulation layer $25_1$, the gate insulation layer $25_2$, and the gate insulation layer 26) is formed on the surface of the base 30 between the gate insulation layer 24 and the surface of the base 30. An insulation layer having a laminated configuration similar to that of the first insulation layer 14' and the second insulation layer 24' is also formed on the side surface of the side wall 53. However, this insulation layer is not depicted in the figures other except for FIGS. 41 and 42.

[Step-180]

Figure 42:
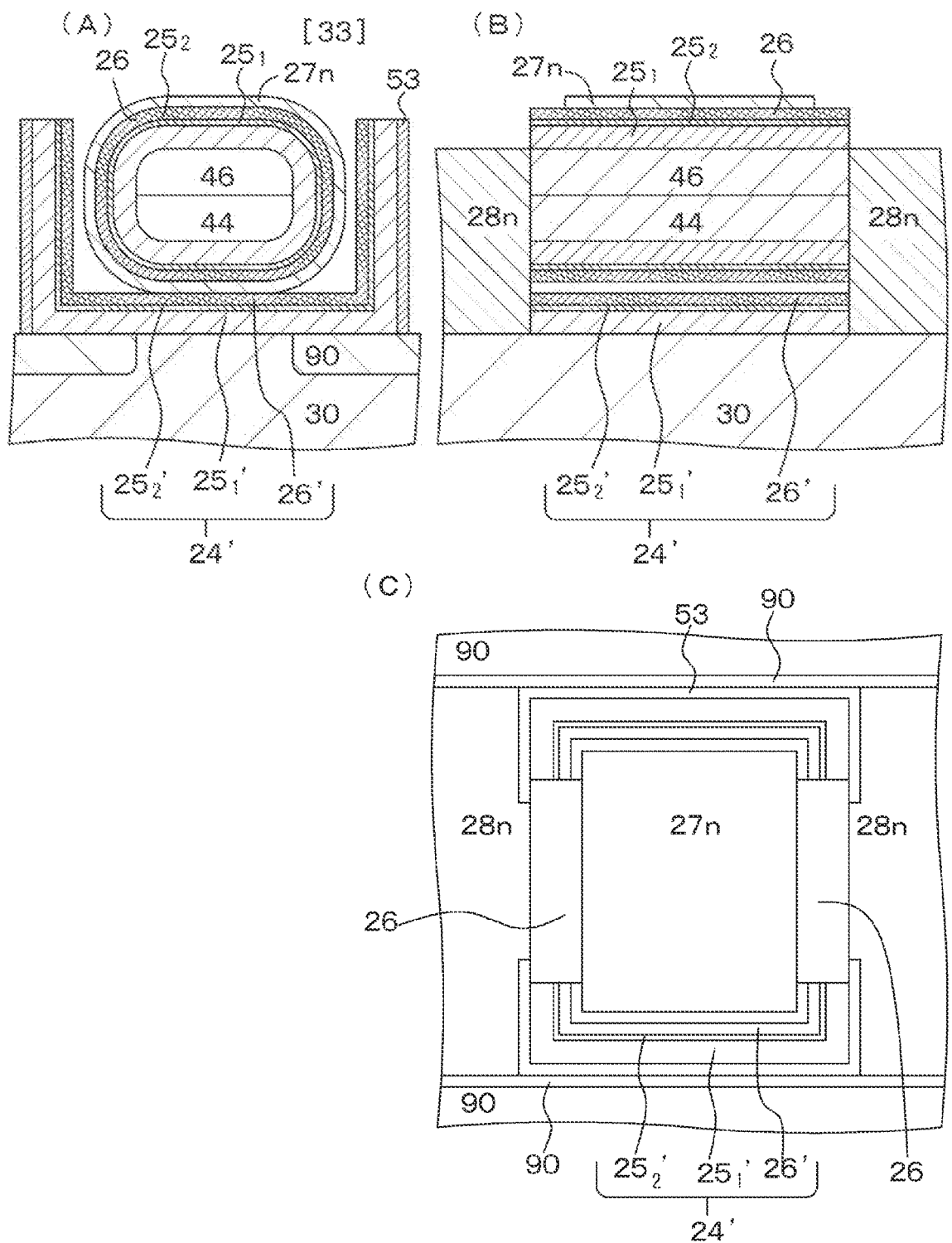
FIG. 42 (A), (B), and (C) of FIG. 42 are schematic partial cross-sectional diagrams and a schematic partial plan diagram continuing from (A), (B), and (C) of FIG. 40 and depicting the second field effect transistor included in the semiconductor device of Embodiment 1 in a midway of a manufacturing step of the semiconductor device of Embodiment 1.

Thereafter, the gate electrodes 17n, 17p, 27n, and 27p made of TiN are provided in regions inside the side wall 53 by a known method. As a result, a structure depicted in each of (A), (B), and (C) in FIGS. 41 and (A), (B), and (C) in FIG. 42 is obtained. A similar structure is also providable in each of the second region 32 and the fourth region 34. Furthermore, conductive material layers 19 and 29 each made of tungsten (W) are formed on the gate electrodes 17n, 17p, 27n, and 27p by a known method. As a result, a structure depicted in a schematic partial cross-sectional diagram of FIGS. 1, 2A, and 2B is obtained.

According to the semiconductor device of Embodiment 1, the relation $T_2 \geq (L_1/2)$ is satisfied. Accordingly, such a semiconductor device which includes both the second field effect transistor having a relatively thick gate insulation film with respect to the first field effect transistor and the first field effect transistor having a nanowire structure or the like is providable. In this case, driving of the first field effect transistor at a low voltage and driving of the second field effect transistor at a high voltage are achievable. Moreover, lowering of resistance of the channel forming layer of the second field effect transistor, raising of transconductance $g_m$, and reduction of parasitic capacitance are achievable. Note that parasitic resistance can be further reduced by enlarging each width of the channel forming layers 23n and 23p of the second field effect transistors 20n and 20p.

According to Modification 1 of Embodiment 1, the gate insulation layer 25 having a large thickness is formed on each of the second field effect transistors 20n and 20p in [Step-170A] described above, and the gate insulation layer 26 is formed between the gate insulation layer 25 and the surface of the base 30 in [Step-170C] described above, i.e., a space between the surface of the base 30 and each of the channel forming layers 23n and 23p is filled with the gate insulation layer 24. As a result, obtained is such a structure where the top surface and the side surface of the gate insulation layer 24 are covered with the gate electrodes (third gate electrodes) 17n and 17p constituting the second field effect transistors 20n and 20p as depicted in a schematic partial cross-sectional diagram in FIG. 4.

Depending on cases, the following structure may be adopted in Modification 2 of Embodiment 1.

A laminated structure including the first Si—Ge layer 41, the first Si layer 42, the second Si—Ge layer 43, the second Si layer 44, the third Si—Ge layer 45, and the third Si layer 46 is formed in each of the first region 31 and the second region 32.

A laminated structure including the first Si—Ge layer 41 (or the second Si—Ge layer 43), the second Si layer 44, and the third Si layer 46 is formed in the third region 33.

A laminated structure including the first Si layer 42 (or the first Si layer 44), the third Si—Ge layer 45, and the fourth Si—Ge layer 47 is formed in the fourth region 34.

Alternatively, depending on cases, the following structure may be adopted in Modification 3 of Embodiment 1.

A laminated structure including the first Si—Ge layer 41, the first Si layer 42, the second Si—Ge layer 43, the second Si layer 44, the third Si—Ge layer 45, and the third Si layer 46 is formed in each of the first region 31 and the second region 32.

A laminated structure including the first Si layer 42 (or the second Si—Ge layer 43) and the second Si layer 44 (or the third Si layer 46) is formed in the third region 33.

A laminated structure including the first Si layer 42 (or the first Si layer 44) and the third Si—Ge layer 45 (or the fourth Si—Ge layer 47) is formed in the fourth region 34.

In these laminated structures of Modification 2 or Modification 3 of Embodiment 1, the thickness $T_{2\text{-}CH}$ of the channel forming layer of the second field effect transistor, the thickness $T_2$ of the gate insulation layer of the second field effect transistor, or the distance $L_2$ from the surface of the base to the channel forming layer of the second field effect transistor is different. However, a structure similar to the structure described in Embodiment 1 can be obtained.

Figure 5:
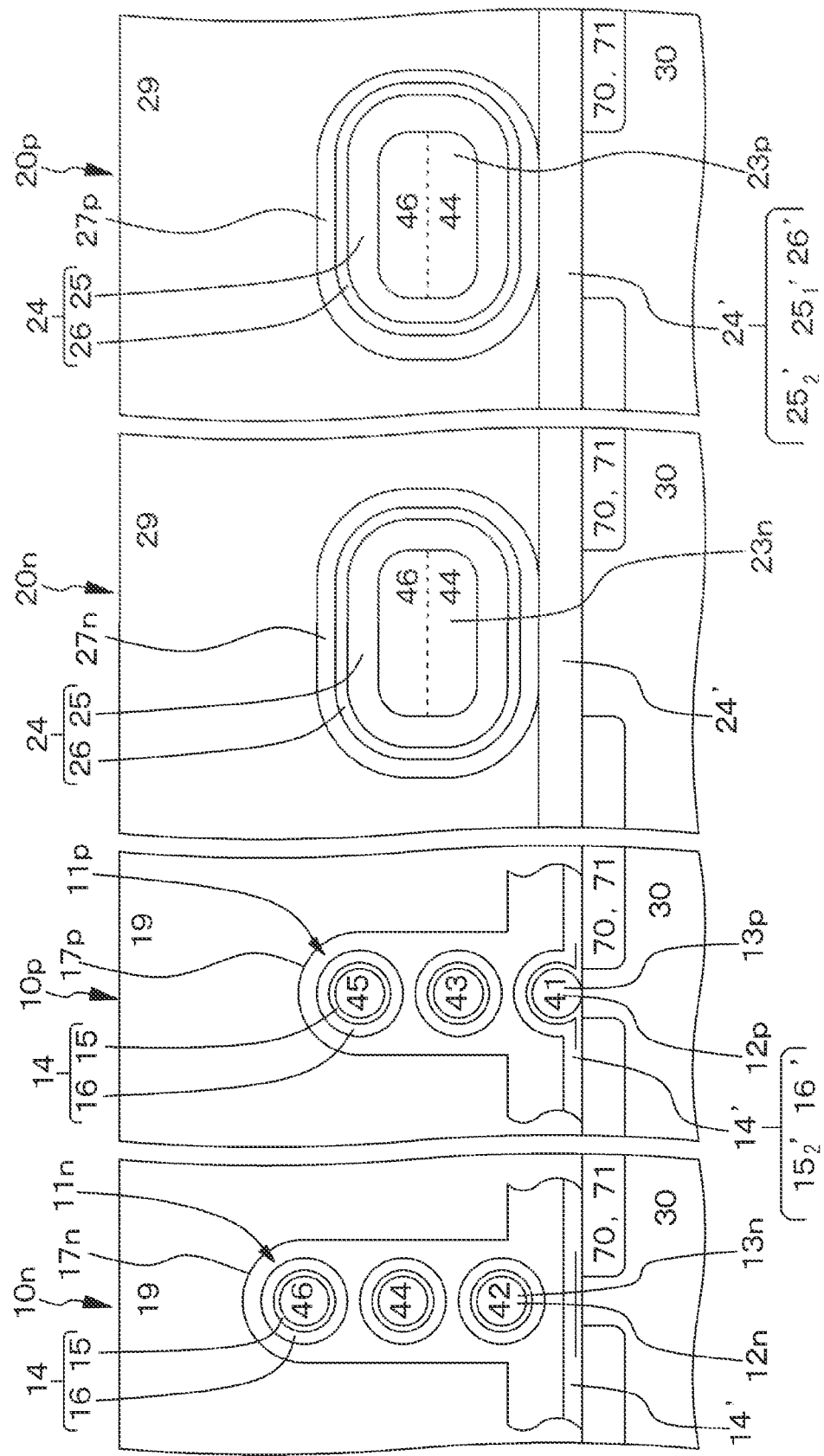
FIG. 5 is a schematic partial cross-sectional diagram of a semiconductor device of a modification (Modification 4) of Embodiment 1.

In addition, in Modification 4 of Embodiment 1, depending on cases, the channel forming layers 23n and 23p of the second field effect transistors 20n and 20p may be made of silicon (Si), for example. In this case, it is sufficient if different materials are used to form the gate electrodes 27n and 27p. Specifically, examples of the material forming the gate electrode 27n include Ti, V, Cr, Zr, Nb, Mo, Hf, Ta, W, and a compound containing these metals, while examples of the material forming the gate electrode 27p include Fe, Co, Ni, Cu, Ru, Rh, Pd, Ag, Os, Ir, Pt, Au, and a compound containing these metals. FIG. 5 is a schematic partial cross-sectional diagram of a modification (Modification 4) of the semiconductor device of Embodiment 1.

Embodiment 2

Embodiment 2 relates to a semiconductor device according to a second aspect of the present disclosure.

Figure 6:
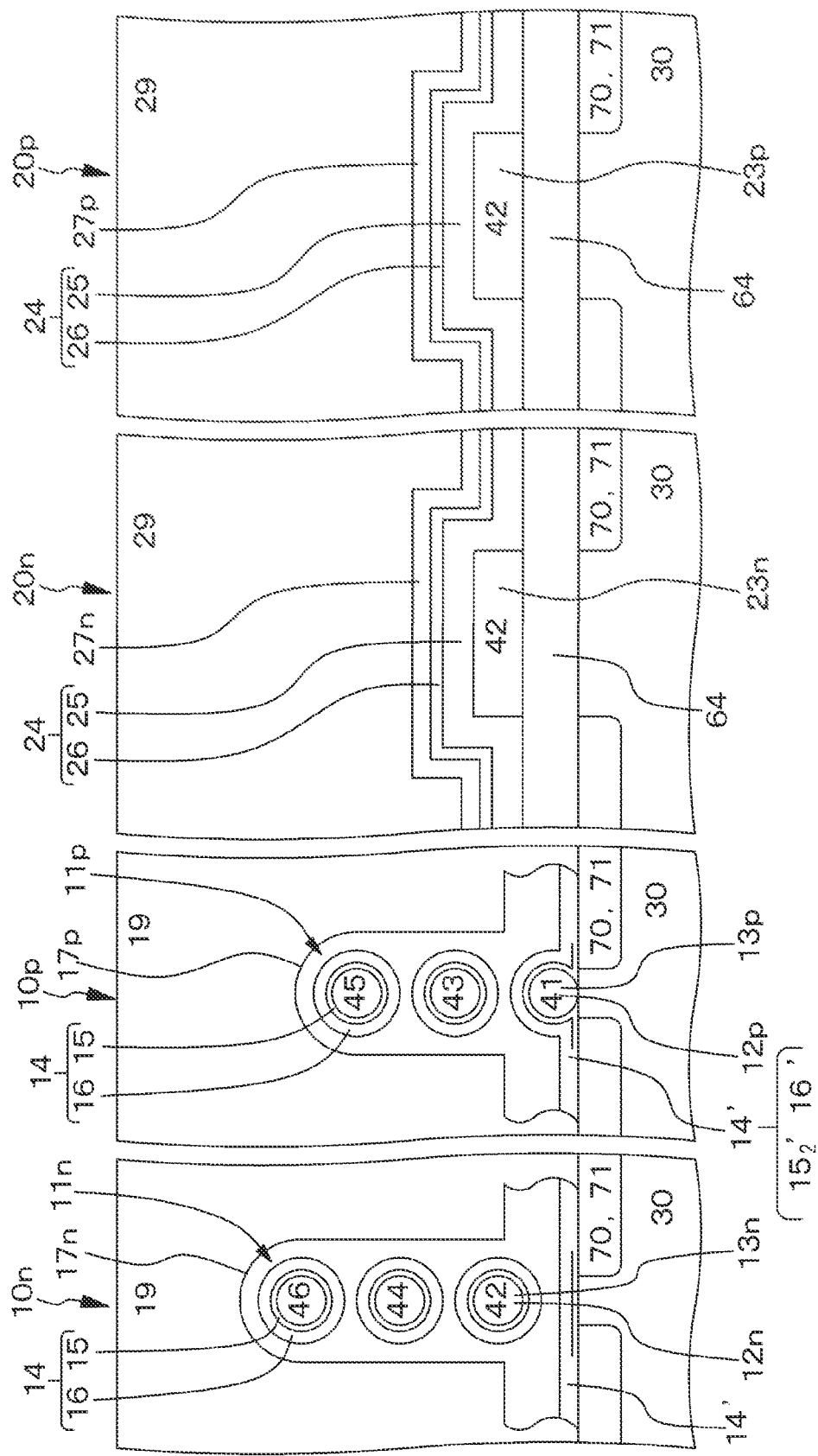
FIG. 6 is a schematic partial cross-sectional diagram of a semiconductor device of Embodiment 2.

FIG. 6 is a schematic partial cross-sectional diagram of the semiconductor device of Embodiment 2. FIG. 6 is a schematic partial cross-sectional diagram similar to the cross-sectional diagram taken along the arrows A-A in FIG. 3A and the arrows B-B in FIG. 3B. FIG. 6 includes a schematic partial cross-sectional diagram of one channel structure portion in an n-channel type first field effect transistor, a schematic partial cross-sectional diagram of one channel structure portion in a p-channel type first field effect transistor, and schematic partial cross-sectional diagrams of an n-channel type second field effect transistor and a p-channel type second field effect transistor. Note that the schematic partial cross-sectional diagram of the n-channel type first field effect transistor and the p-channel type first field effect transistor is similar to the cross-sectional diagrams of FIGS. 1, 2A, and 2B. FIG. 6 is a cross-sectional diagram in which hatching lines are omitted.

The semiconductor device of Embodiment 2 includes
the base 30,
the first field effect transistors 10n and 10p where at least the two channel structure portions 11n and the two channel structure portions 11p (three for each in a laminating direction of the channel structure portions 11n and 11p in the depicted example) are laminated, respectively, each of the channel structure portions 11n and each of the channel structure portions 11p including the channel portion 13n and the channel portion 13p, respectively, the channel portion 13n and the channel portion 13p each having a nanowire structure or a nanosheet structure (having the nanowire structure 12n and the nanowire structure 12p, respectively, in the depicted example), the gate insulation film 14 surrounding the channel portion 13n and the gate insulation film 14 surrounding the channel portion 13p, respectively, and the gate electrode 17n and the gate electrode 17p, respectively, the gate electrode 17n and the gate electrode 17p surrounding at least a part of the gate insulation film 14, and
the second field effect transistors 20n and 20p which include the channel forming layers 23n and 23p, the gate insulation layers 24 formed on the top surfaces and the side surfaces of the channel forming layers 23n and 23p, and the gate electrodes 27n and 27p each formed on at least the top surface of the gate insulation layer 24 (formed on the top surface and the side surface of the gate insulation layer 24 in the depicted figure).

The first field effect transistors 10n and 10p and the second field effect transistors 20n and 20p are provided above the base 30.

The channel portions 13n of the first field effect transistors 10n are disposed apart from each other in the laminating direction of the channel structure portions 11n, and the channel portions 13p of the first field effect transistors 10p are disposed apart from each other in the laminating direction of the channel structure portions 11p.

An insulation material layer 64 is formed between the surface of the base 30 and a bottom surface of the channel forming layer 23n constituting the second field effect transistor 20n and between the surface of the base 30 and a bottom surface of the channel forming layer 23p constituting the second field effect transistor 20p.

In addition, reverse bias is applicable to the base 30 at portions facing the bottom surfaces of the channel forming layers 23n and 23p via the insulation material layers 64. Specifically, an n-type well or a p-type well is formed by ion-implantation, for example, at each of these portions of the base 30 inside the base 30 constituted by a silicon semiconductor substrate, and wiring (not depicted) through which voltage is applicable to the well is connected to the well. By applying bias to the well, reverse bias is applicable to each of the first field effect transistors 10n and 10p and the second field effect transistors 20n and.

In addition, assuming that a thickness of the channel portion is $T_{1\text{-}CH}$ and that a thickness of the insulation material layer is $T_{Ins}$, the following relation is satisfied.

$$0.2 \le T_{1-CH}/T_{Ins} \le 2$$

Specifically, the following value is set.

$$T_{1-CH}/T_{Ins} = 8 \text{ nm}/8 \text{ nm}$$

However, this value is not required to be set.

Figure 43:
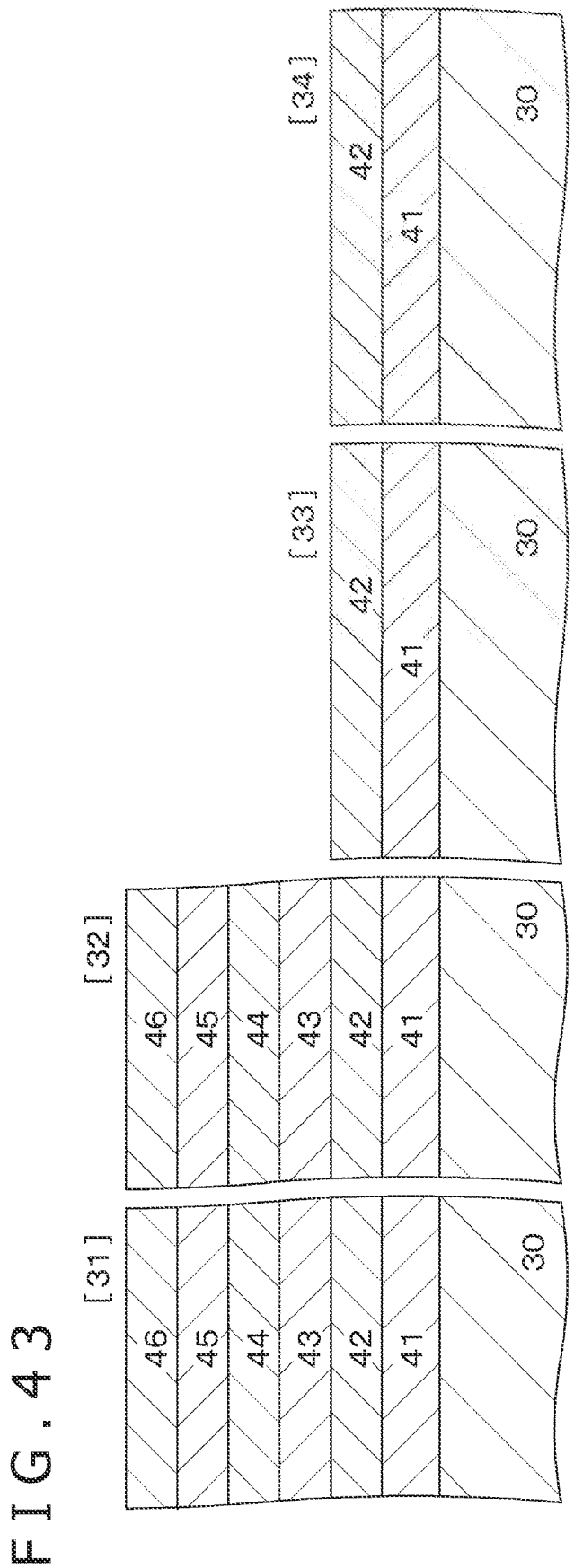
FIG. 43 is a schematic partial cross-sectional diagram of a base and the like for explaining a manufacturing method of a semiconductor device of Embodiment 2, the diagrams being similar to the cross-sectional diagrams taken along the arrows A-A in FIG. 3A and the arrows B-B in FIG. 3B.

A manufacturing method of the semiconductor device of Embodiment 2 will be described with reference to FIG. 43 which is a schematic partial cross-sectional diagram similar to the cross-sectional diagram taken along the arrows A-A in FIG. 3A and the arrows B-B in FIG. 3B, FIGS. 44, 45, 46, 47, 48, 49, and 50 each of which includes a schematic partial cross-sectional diagram of the second field effect transistor similar to the cross-sectional diagram taken along the arrows B-B in FIG. 3B (indicated by (A) in each of the figures; see arrows A-A in (C) of FIG. 20 as well), a schematic partial cross-sectional diagram of the second field effect transistor similar to the cross-sectional diagram taken along the arrows B'-B' in FIG. 3B (indicated by (B) in each of the figures; see arrows B-B in (C) of FIG. 20 as well), and a schematic partial plan diagram (indicated by (C) in each of the figures), together with FIGS. 23, 25, 29, 31, 33, 35, 37, 39, and 41 each of which relates to the first field effect transistor described in Embodiment 1. Note that hatching lines in the first Si—Ge layer 41 and the first Si layer 42 are not omitted in (A) of each of FIGS. 44, 45, 46, 47, 48, 49, and 50.

[Step-200A]

First, the first Si—Ge layer 41 is formed by a known method in each of the first region 31, the second region 32, the third region 33, and the fourth region 34 of the base 30.

[Step-200B]

Next, the first Si layer 42 is formed on the entire surface by a known method.

[Step-200C]

Subsequently, the second Si—Ge layer 43 is formed on the entire surface by a known method, and then the second Si-layer 43 on each of the third region 33 and the fourth region 34 is removed by a known method.

[Step-200D]

Then, the second Si layer 44 is formed on the entire surface by a known method, and then the second Si layer 44 on each of the third region 33 and the fourth region 34 is removed by a known method.

[Step-200E]

Subsequently, the third Si—Ge layer 45 is formed on the entire surface by a known method, and then the third Si—Ge layer 45 on each of the third region 33 and the fourth region 34 is removed by a known method.

[Step-200F]

Subsequently, the third Si layer 46 is formed on the entire surface by a known method, and then the third Si layer 46 on each of the third region 33 and the fourth region 34 is removed by a known method. As a result, a structure depicted in FIG. 43 is obtained.

In this manner, a laminated structure including the first Si—Ge layer 41, the first Si layer 42, the second Si—Ge layer 43, the second Si layer 44, the third Si—Ge layer 45, and the third Si layer 46 is formed on each of the first region 31 and the second region 32, and a laminated structure including the first Si—Ge layer 41 and the first Si layer 42 is formed on the third region 33 and the fourth region 34.

[Step-210]

Thereafter, to form the channel structure portions 11n and 11p, a mask layer 51 made of SiN is formed by a known method on the third Si layer 46 of each of the first region 31 and the second region 32 and on the first Si layer 42 of each of the third region 33 and the fourth region 34, the laminated structure in each of the first region 31, the second region 32, the third region 33, and the fourth region 34 is etched using the mask layer 51 as an etching mask, and further a part of the exposed base 30 in a thickness direction is etched. A groove for forming the element separation region 70 having a shallow-trench structure is formed in the base 30. Subsequently, a film of the insulation material 71 made of $SiO_2$ is formed on the entire surface, and a top surface is smoothed by CMP. Thereafter, the insulation material 71 is etched and left in the groove to form the element separation region 70 having the shallow-trench structure. Note that formation of the element separation regions 70 in the first field effect transistors 10n and 10p and formation of the element separation regions 70 in the second field effect transistors 20n and 20p may be performed either simultaneously or independently.

[Step-220]

Subsequently, the mask layer 51 is removed, and then thermal oxidation treatment is performed to form an unillustrated dummy oxide layer on a surface of the laminated structure on each of the first region 31, the second region 32, the third region 33, and the fourth region 34. Thereafter, a dummy gate portion covering the laminated structure of the first region 31, a dummy gate portion covering the laminated structure of the second region 32, a dummy gate portion covering the laminated structure of the third region 33, and a dummy gate portion covering the laminated structure of the fourth region 34 are formed by a known method. Each of the dummy gate portions is indicated by a reference number 52. Each of the dummy gate portions 52 is made of polysilicon. Subsequently, the laminated structure on each of the first region 31, the second region 32, the third region 33, and the fourth region 34 each in an exposed state is etched using the dummy gate portion 52 as an etching mask.

[Step-230]

Thereafter, an SiN layer is formed on the entire surface. This Sin layer is etched back to form a side wall 53 made of SiN on a side surface of the dummy gate portion 52. However, the side wall 53 is not formed on portions corresponding to both ends of the channel portions 13n and 13p and both ends of the channel forming layers 23n and 23p. As a result, a structure depicted in each of (A), (B), and (C) in FIGS. 23 and (A), (B), and (C) in FIG. 44 is obtained.

[Step-240]

Thereafter, a phosphor-doped SiC layer 54n for forming the source/drain region 18n constituting the first field effect transistor 10n and the source/drain region 28n constituting the second field effect transistor 20n is epitaxially grown from the surface of the exposed base 30 by a known method, and then patterned by a known method. As a result, the source/drain region 18n constituting the first field effect transistor 10n and the source/drain region 28n constituting the second field effect transistor 20n are obtained. Similarly, a boron-doped Si—Ge layer 54p for forming the source/drain region 18p constituting the first field effect transistor 10p and the source/drain region 28p constituting the second field effect transistor 20p is epitaxially grown from the surface of the exposed base 30 by a known method, and then patterned by a known method. In this manner, the source/drain region 18p constituting the first field effect transistor 10p and the source/drain region 28p constituting the second field effect transistor 20p are obtained.

Figure 45:
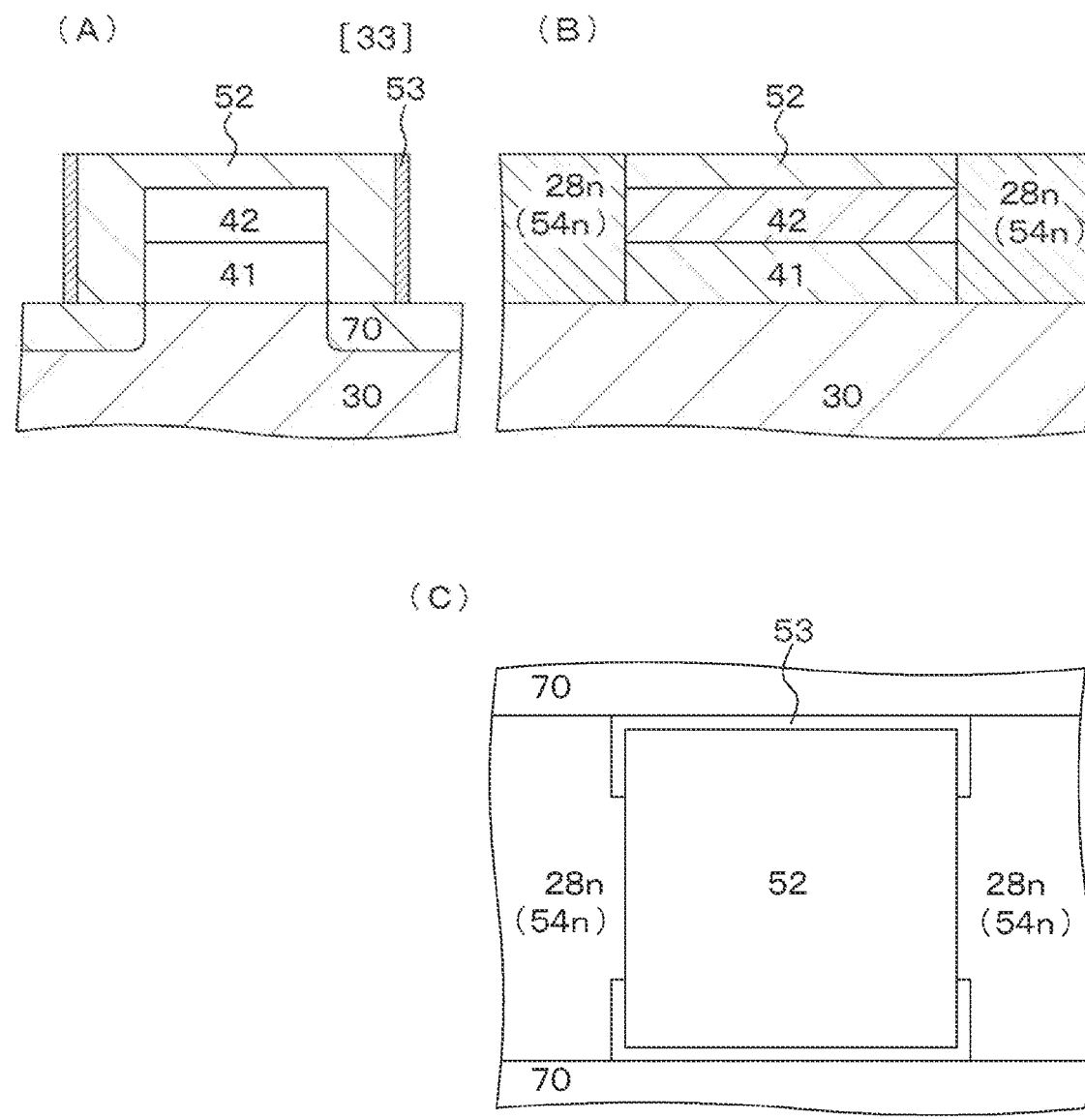
FIGS. 45(A), (B), and (C) of FIG. 45 are schematic partial cross-sectional diagrams and a schematic partial plan diagram continuing from (A), (B), and (C) of FIG. 44 and depicting the second field effect transistor included in the semiconductor device of Embodiment 2 in a midway of a manufacturing step of the semiconductor device of Embodiment 2.

As a result, a structure depicted in each of (A), (B), and (C) in FIGS. 25 and (A), (B), and (C) in FIG. 45 is obtained. A similar structure is also providable in each of the second region 32 and the fourth region 34. A part of the source/drain region 18n is in contact with the side surface of the laminated structure in the first region 31, while the remaining part is in contact with the side wall 53. Similarly, a part of the source/drain region 18p is in contact with the side surface of the laminated structure in the second region 32, while the remaining part is in contact with the side wall. A part of the source/drain region 28n is in contact with the side surface of the laminated structure in the third region 33, while the remaining part is in contact with the side wall 53. A part of the source/drain region 28p is in contact with the side surface of the laminated structure in the fourth region 34, while the remaining part is in contact with the side wall.

[Step-250]

Figure 46:
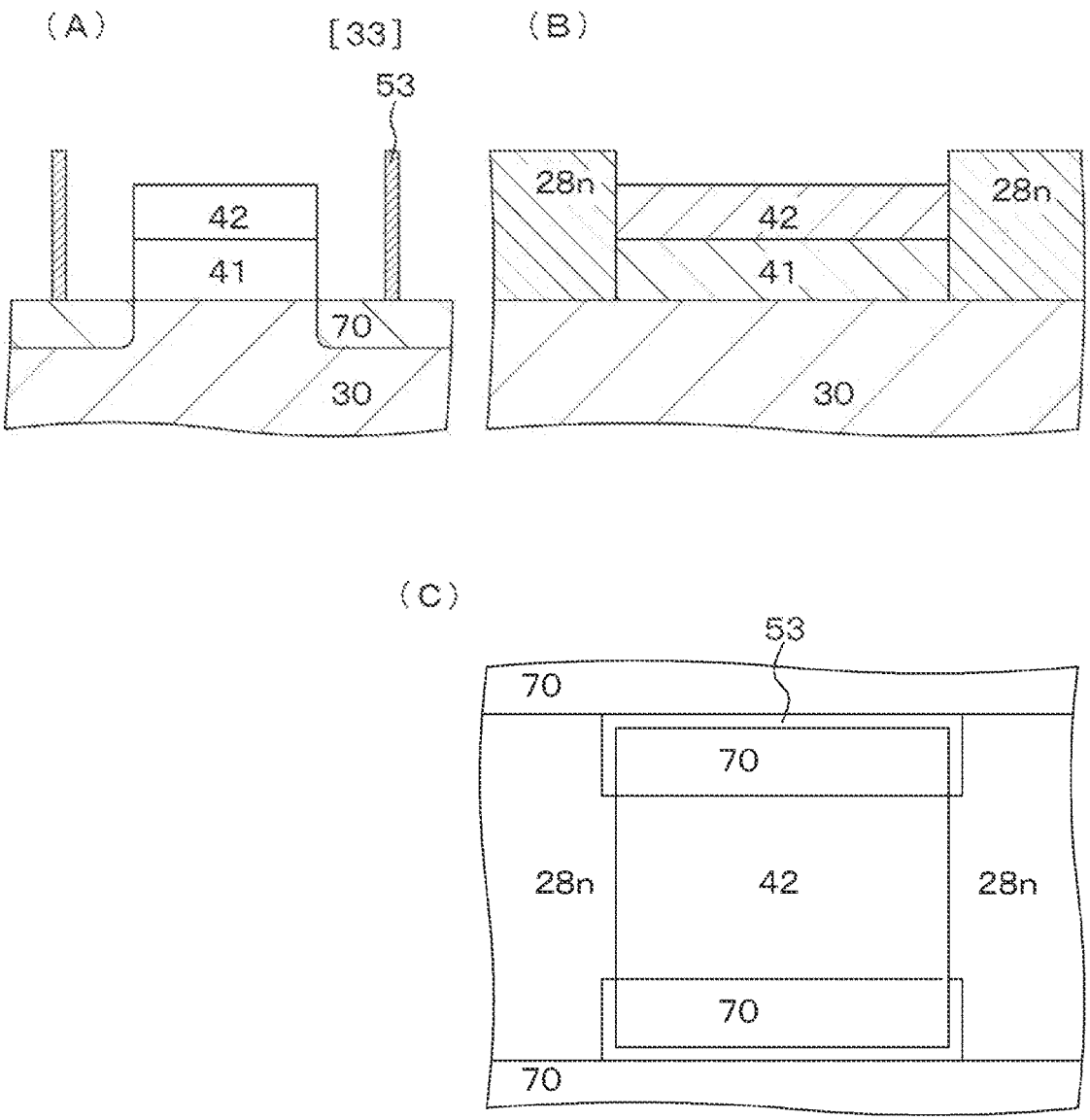
FIG. 46 (A), (B), and (C) of FIG. 46 are schematic partial cross-sectional diagrams and a schematic partial plan diagram continuing from (A), (B), and (C) of FIG. 45 and depicting the second field effect transistor included in the semiconductor device of Embodiment 2 in a midway of a manufacturing step of the semiconductor device of Embodiment 2.
Figure 47:
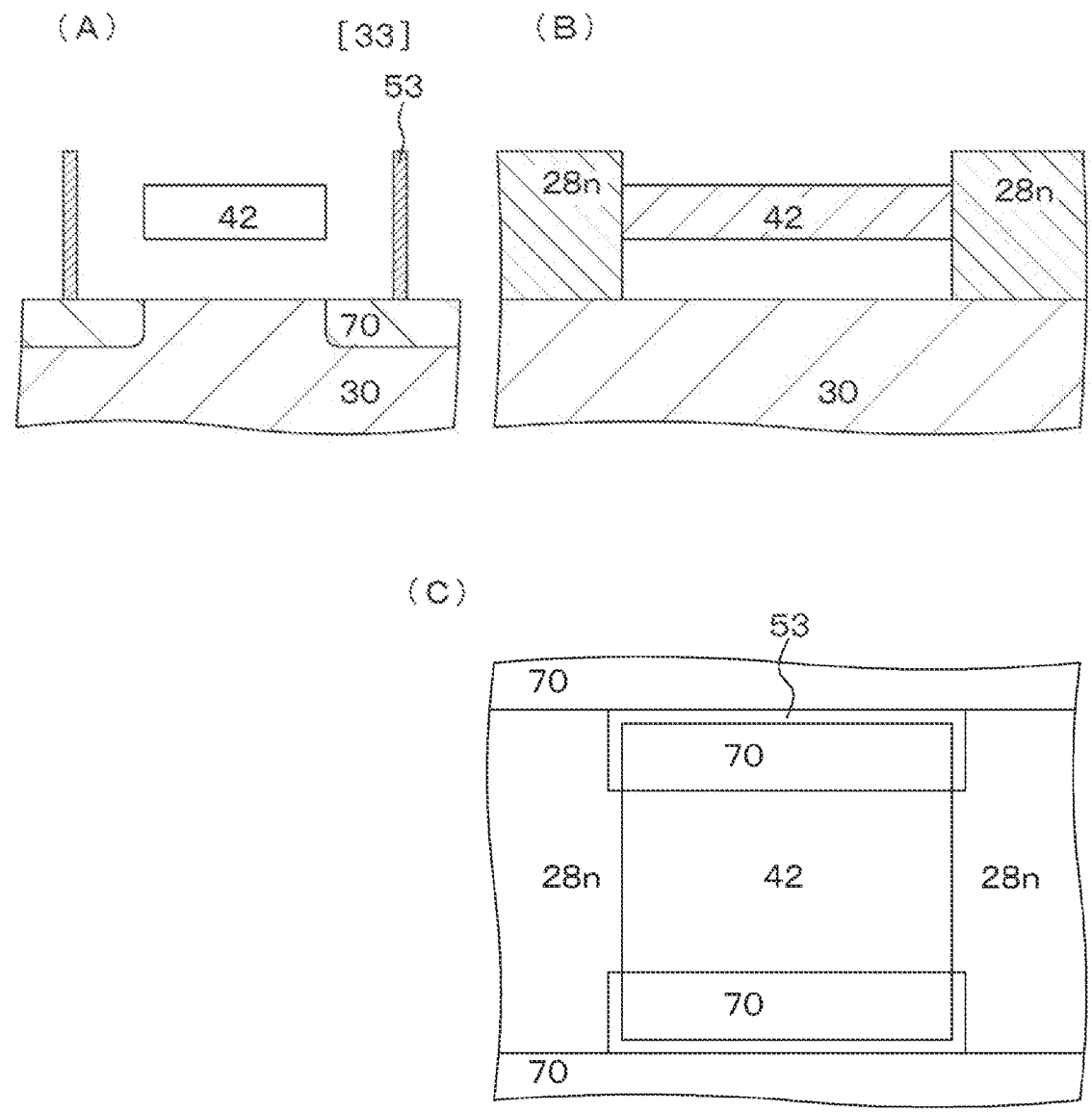
FIG. 47 (A), (B), and (C) of FIG. 47 are schematic partial cross-sectional diagrams and a schematic partial plan diagram continuing from (A), (B), and (C) of FIG. 46 and depicting the second field effect transistor included in the semiconductor device of Embodiment 2 in a midway of a manufacturing step of the semiconductor device of Embodiment 2.
Figure 48:
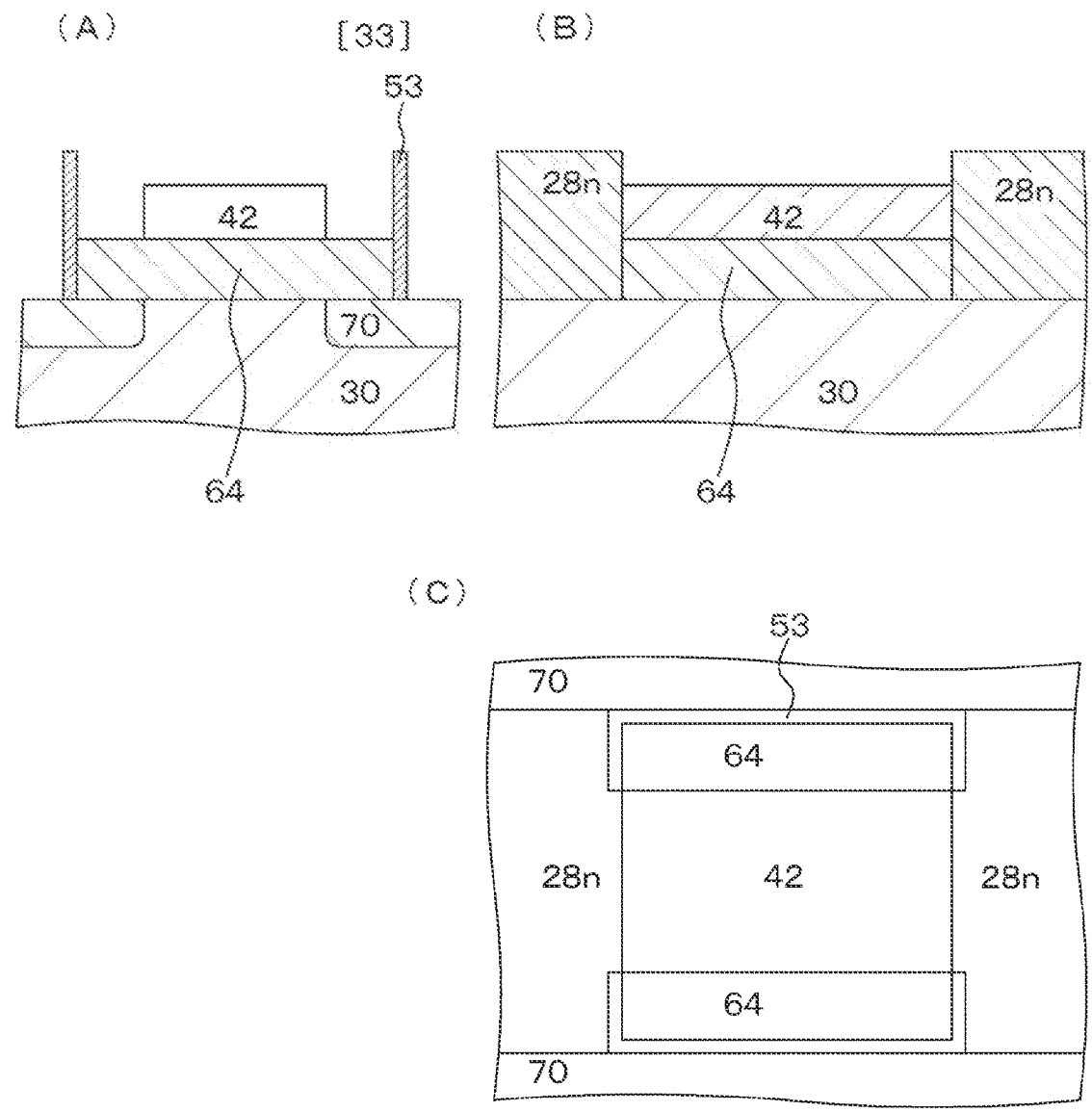
FIG. 48 (A), (B), and (C) of FIG. 48 are schematic partial cross-sectional diagrams and a schematic partial plan diagram continuing from (A), (B), and (C) of FIG. 47 and depicting the second field effect transistor included in the semiconductor device of Embodiment 2 in a midway of a manufacturing step of the semiconductor device of Embodiment 2.

Thereafter, the dummy gate portion 52 on each of the third region 33 and the fourth region 34 is removed by a known method (see (A), (B), and (C) of FIG. 46). The dummy gate portion 52 on each of the first region 31 and the second region 32 is left. Subsequently, the unillustrated dummy oxide layer on each of the third region 33 and the fourth region 34 is removed by a known method, and then the first Si—Ge layer 41 of the laminated structure in each of the third region 33 and the fourth region 34 is selectively removed (see (A), (B), and (C) of FIG. 47). Thereafter, the insulation material layer 64 is formed on the entire surface and then etched back. As a result, the insulation material layer 64 is formed between the surface of the base 30 and each of the first Si layers 42 of the laminated structures on the third region 33 and the fourth region 34. The insulation material layer 64 extends from a portion below each of the first Si layers 42 on the third region 33 and the fourth region 34 toward the surface of the base 30. As a result, a structure depicted in each of (A), (B), and (C) in FIG. 48 is obtained.

[Step-260]

Subsequently, the dummy gate portion 52 on each of the first region 31 and the second region 32 is removed by a known method, and the unillustrated dummy oxide layer is further removed by a known method. Then, the third Si—Ge layer 45, the second Si—Ge layer 43, and the first Si—Ge layer 41 in the laminated structure of the first region 31 are selectively removed (see (A), (B), and (C) of FIG. 29). Moreover, the third Si layer 46, the second Si layer 44, and the first Si layer 42 in the laminated structure of the second region 32 are selectively removed (see (A), (B), and (C) of FIG. 31). In addition, outer peripheries of the third Si layer 46, the second Si layer 44, and the first Si layer 42 exposed in the first region 31, the third Si—Ge layer 45, the second Si—Ge layer 43, and the first Si—Ge layer 41 exposed in the second region 32, the first Si layer 42 exposed in the third region 33, and the first Si layer 42 exposed in the fourth region 34 are thermally oxidized to form an oxide film. After this thermal oxidation treatment, a cross-sectional shape of each of the nanowire structures 12n and 12p of the first field effect transistors 10n and 10p having the nanowire structure becomes circular. Note that these oxide films are not depicted in the figures. As a result, a structure depicted in each of (A), (B), and (C) in FIG. 33 is obtained. A similar structure is also obtained in the second region 32.

[Step-270A]

Thereafter, the gate insulation film $15_1$ (made of $SiO_2$) constituting a lower layer of the gate insulation film 14 is formed on the formed oxide film by atomic layer deposition (ALD), and also the gate insulation layer $25_1$ (made of $SiO_2$) constituting a lower layer of the gate insulation layer 24 is formed on the formed oxide film. As a result, a structure depicted in each of (A), (B), and (C) in FIG. 35 is obtained. A similar structure is also providable in the second region 32.

[Step-270B]

Subsequently, the gate insulation film $15_1$ and the first insulation lower layer 15' of each of the first field effect transistors 10n and 10p are removed by a known method. Thereafter, again by using ALD, the gate insulation film $15_2$ (made of $SiO_2$) constituting a lower layer of the gate insulation film 14 is formed on the formed oxide film, and also the gate insulation layer $25_2$ (made of $SiO_2$) constituting a lower layer of the gate insulation layer 24 is formed on the gate insulation layer $25_1$. The gate insulation film of each of the first field effect transistors 10n and 10p is constituted by the gate insulation film $15_2$. On the other hand, the gate insulation layer of each of the second field effect transistors 20n and 20p is constituted by a laminated structure of the gate insulation layer $25_1$ and the gate insulation layer $25_2$. The first insulation lower layer 15' is formed simultaneously with the gate insulation film $15_2$. As a result, a structure depicted in each of (A), (B), and (C) in FIG. 37 is obtained. A similar structure is also providable in the second region 32.

Alternatively, the gate insulation layer $25_2$ may be formed on each of the second field effect transistors 20n and 20p without forming the gate insulation film $15_2$ on each of the first field effect transistors 10n and 10p. In this case, the gate insulation film of each of the first field effect transistors 10n and 10p is constituted by the gate insulation film $15_1$. On the other hand, the gate insulation layer of each of the second field effect transistors 20n and 20p is constituted by a laminated structure of the gate insulation layer $25_1$ and the gate insulation layer $25_2$. In this case, the first insulation lower layer 15' is also formed simultaneously with the gate insulation film $15_1$.

Alternatively, formation of the gate insulation film 15 on each of the first field effect transistors 10n and 10p and formation of the gate insulation layer 25 on each of the second field effect transistors 20n and 20p may be performed independently. In this case, the gate insulation film of each of the first field effect transistors 10n and 10p is constituted by the gate insulation film 15. On the other hand, the gate insulation layer of each of the first field effect transistors 20n and 20p is constituted by the gate insulation layer 25. In this case, the first insulation lower layer 15' is also formed simultaneously with the gate insulation film 15.

The gate insulation film 15 constituting each of the first field effect transistors 10n and 10p is formed by either the first ALD or the second ALD, while the gate insulation layer 25 constituting each of the second field effect transistors 20n and 20p is formed by the first and second ALD. Accordingly, the gate insulation film 15 and the gate insulation layer 25 each having a desired thickness can be obtained by controlling a thickness of an $SiO_2$ film or an $SiO_2$ layer formed by the first ALD and a thickness of an $SiO_2$ film or an $SiO_2$ layer formed by the second ALD. Alternatively, the gate insulation film 15 and the gate insulation layer 25 each having a desired thickness may be obtained by forming a single layer of the gate insulation film 15 on each of the first field effect transistors 10n and 10p and forming a plurality of the gate insulation layers 25 on each of the second field effect transistors 20n and 20p, or by independently performing formation of the gate insulation film 15 on each of the first field effect transistors 10n and 10p and formation of the gate insulation layer 25 on each of the second field effect transistors 20n and 20p.

[Step-270C]

Figure 49:
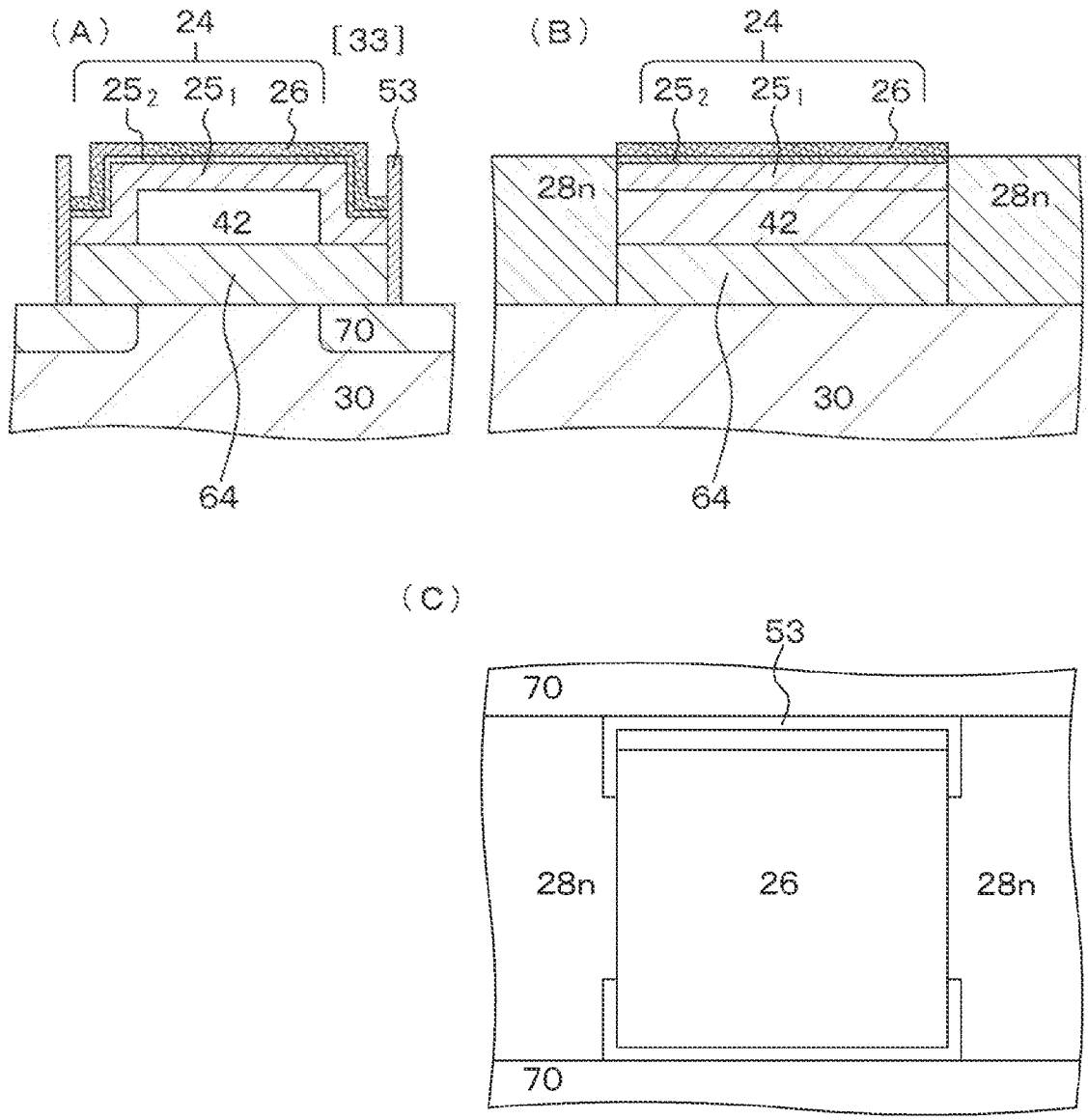
FIG. 49 (A), (B), and (C) of FIG. 49 are schematic partial cross-sectional diagrams and a schematic partial plan diagram continuing from (A), (B), and (C) of FIG. 48 and depicting the second field effect transistor included in the semiconductor device of Embodiment 2 in a midway of a manufacturing step of the semiconductor device of Embodiment 2.

Subsequently, the gate insulation film 16 and the gate insulation layer 26 constituting upper layers of the gate insulation film 14 and the gate insulation layer 24 are formed by ALD on the gate insulation film 15₂ and the gate insulation layer 25₂. Each of the gate insulation film 16 and the gate insulation layer 26 is made of $HfO_2$. Moreover, the first insulation upper layer 16' may be formed on the surface of the base 30. As a result, a structure depicted in each of (A), (B), and (C) in FIGS. 39 and (A), (B), and (C) in FIG. 49 is obtained. A similar structure is also providable in each of the second region 32 and the fourth region 34.

By performing the processes described above, the first insulation layer 14' (having a configuration similar to the laminated configuration of the gate insulation film 15₂ and the gate insulation film 16) is formed on the surface of the base 30 between the first gate electrode 17n in the lowermost layer and the surface of the base 30. An insulation layer having a laminated configuration similar to that of the first insulation layer 14' and the second insulation layer 24' is also formed on the side surface of the side wall 53. However, this insulation layer is not depicted in the figures except for FIG. 41.

[Step-280]

Figure 50:
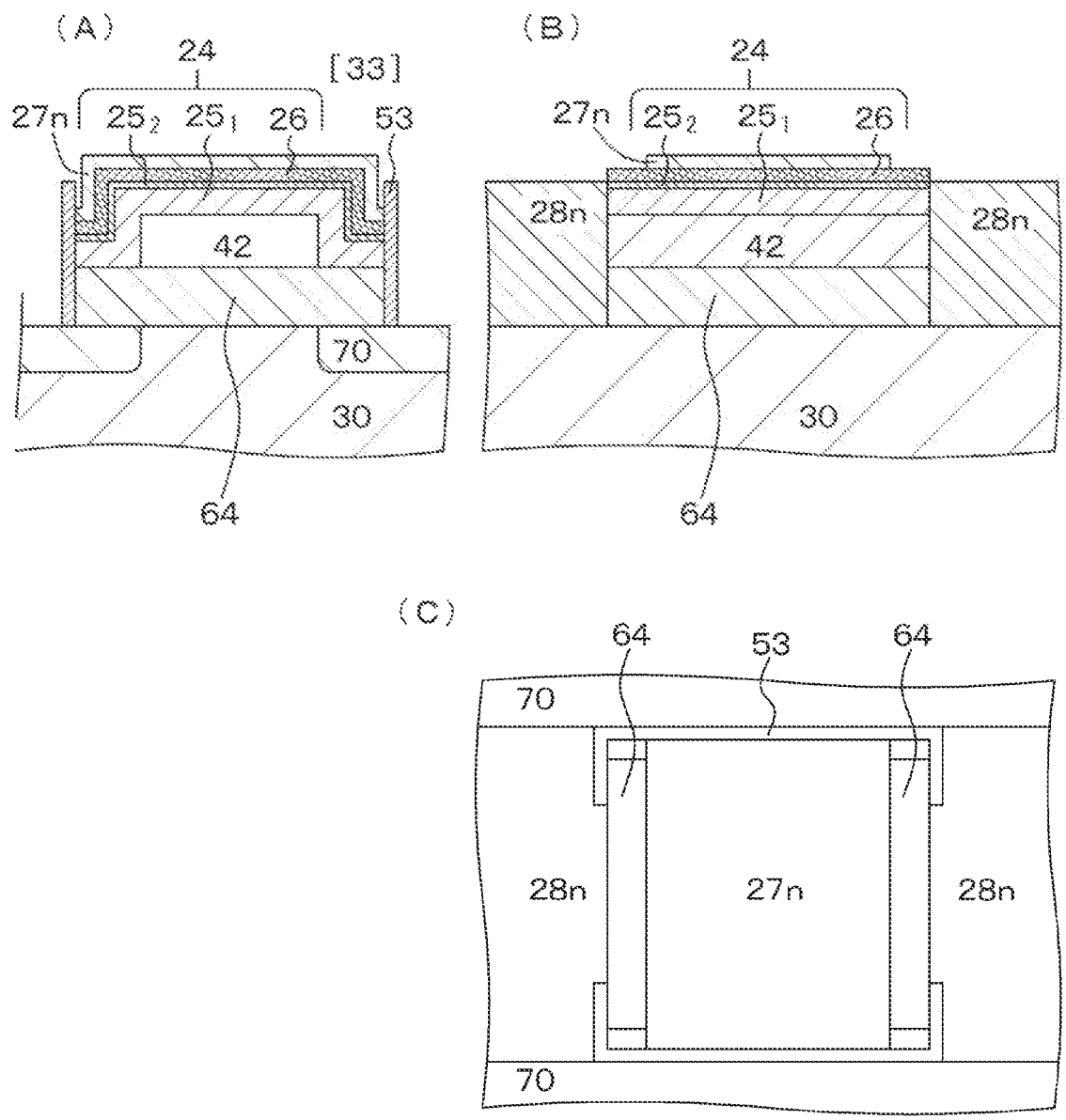
FIG. 50 (A), (B), and (C) of FIG. 50 are schematic partial cross-sectional diagrams and a schematic partial plan diagram continuing from (A), (B), and (C) of FIG. 49 and depicting the second field effect transistor included in the semiconductor device of Embodiment 2 in a midway of a manufacturing step of the semiconductor device of Embodiment 2.

Thereafter, the gate electrodes 17n, 17p, 27n, and 27p made of TiN are provided in regions inside the side wall 53 by a known method. As a result, a structure depicted in each of (A), (B), and (C) in FIGS. 41 and (A), (B), and (C) in FIG. 50 is obtained. A similar structure is also providable in each of the second region 32 and the fourth region 34. Furthermore, conductive material layers 19 and 29 each made of tungsten (W) are formed on the gate electrodes 17n, 17p, 27n, and 27p by a known method. As a result, a structure depicted in a schematic partial cross-sectional diagram of FIG. 6 is obtained.

According to the semiconductor device of Embodiment 2, the gate electrode constituting the second field effect transistor is provided at least on the top surface of each of the channel forming layers. In addition, the insulation material layer having a small thickness (e.g., a thickness identical or similar to the thickness of the channel portion) is formed between the surface of the base and the bottom surface of each of the channel forming layers constituting the second field effect transistor. Accordingly, a semiconductor device which includes both the second field effect transistor capable of controlling the threshold voltage $V_{th}$ by application of reverse bias and the first field effect transistor having a nanowire structure or the like is providable.

Depending on cases, at least one semiconductor layer 61 may be formed between the insulation material layer 64 and each of the channel forming layers 23n and 23p as depicted in a schematic partial cross-sectional diagram of the second field effect transistors 20n and 20p in FIG. 7. According to the depicted example, two layers of the semiconductor layer 61 are formed. Reverse bias is applicable to the semiconductor layers 61 by connecting the semiconductor layers 61 to wiring layers (not depicted) formed below the source/drain regions 28n and 28p. An interlayer insulation layer 65 is formed between the semiconductor layers 61 and each of the channel forming layers 23n and 23p and between the semiconductor layers 61.

Such structure can be manufactured by the following method. Specifically, a laminated structure including the first Si—Ge layer 41, the first Si layer 42, the second Si—Ge layer 43, the second Si layer 44, the third Si—Ge layer 45, and the third Si layer 46 is formed on each of the third region 33 and the fourth region 34, and the third Si—Ge layer 45, the second Si—Ge layer 43, and the first Si—Ge layer 41 are selectively removed by a step similar to [Step-250]. In addition, the insulation material layer 64 is formed on the entire surface and then etched back. As a result, the insulation material layer 64 is formed between the surface of the base 30 and each of the first Si layers 42 of the laminated structures in the third region 33 and the fourth region 34, and the interlayer insulation layer 65 is formed between the semiconductor layers 61.

Moreover, depending on cases, the semiconductor layer 61 in the third region 33 may have a conductivity type (p-type) opposite to the conductivity type (n-type) of the channel forming layer 23n, while the semiconductor layer 61 in the fourth region 34 may have a conductivity type (n-type) opposite to the conductivity type (p-type) of the channel forming layer 23p. It is sufficient if the semiconductor layer 61 thus configured is formed by introducing appropriate impurities into the semiconductor layer 61 by ion implantation, or by collectively implanting ions into the semiconductor layer 61. Alternatively, formation of the semiconductor layer 61 and execution of ion implantation may be performed repeatedly by the number of layers of the semiconductor layer.

Alternatively, depending on cases, the following structure may be adopted.

A laminated structure including the first Si—Ge layer 41, the first Si layer 42, the second Si—Ge layer 43, the second Si layer 44, the third Si—Ge layer 45, and the third Si layer 46 is formed in each of the first region 31 and the second region 32.

A laminated structure including two or a larger number of an Si—Ge layer or an Si layer may be formed in each of the third region 33 and the fourth region.

While the present disclosure has been described on the basis of the preferred embodiments, the configuration and the structure of the semiconductor device, the material constituting the semiconductor device, and the manufacturing method of the semiconductor device described in the embodiments are presented by way of example, and may be modified in appropriate manners.

Moreover, the order of steps in the manufacturing method of the semiconductor device in each of the embodiments may appropriately be changed according to demands. While the channel structure portion exclusively has the nanowire structure in the embodiments described above, the channel structure portion may have a nanosheet structure. The base may be constituted by an SOI substrate instead of the silicon semiconductor substrate. Depending on cases, the element separation region may be formed in an initial step of the manufacturing method of the semiconductor device.

According to the embodiments, the laminated structure includes the first Si—Ge layer 41, the first Si layer 42, the second Si—Ge layer 43, the second Si layer 44, the third Si—Ge layer 45, the third Si layer 46, and the fourth Si—Ge layer 47. Alternatively, the laminated structure may include the first Si layer 42, the first Si—Ge layer 41, the second Si layer 44, the second Si—Ge layer 43, the third Si layer 46, the third Si—Ge layer 45, and the fourth Si layer 47. In addition, it is sufficient if the number of the laminated channel structure portions is two or larger.

The SiGe layer may be obtained by processes of forming an upper layer made of SiGe on a lower layer made of Si and performing oxidation treatment to convert the upper layer made of SiGe into an SiO$_2$ layer and the lower layer made of Si into an SiGe layer.

Note that the present disclosure may also have following configurations.

[A01]<<Semiconductor Device: First Aspect>>
A semiconductor device including:
a base;
a first field effect transistor that includes at least two channel structure portions laminated, the channel structure portions each including a channel portion that has a nanowire structure or a nanosheet structure, a gate insulation film that surrounds the channel portion, and a gate electrode that surrounds at least a part of the gate insulation film; and
a second field effect transistor that includes a channel forming layer, a gate insulation layer surrounding the channel forming layer, and a gate electrode surrounding at least a part of the gate insulation layer, in which
the first field effect transistor and the second field effect transistor are provided above the base,
the channel portions of the first field effect transistor are disposed apart from each other in a laminating direction of the channel structure portions, and
assuming that each of a distance between the channel portions of the first field effect transistor is a distance $L_1$ and that a thickness of the gate insulation layer of the second field effect transistor is a thickness $T_2$, $$T_2 \geq (L_1/2)$$

is satisfied.

[A02]
The semiconductor device according to [A01], in which $T_2 \geq 1.1 \times (L_1/2)$, preferably $T_2 \geq 1.2 \times (L_1/2)$, is satisfied.

[A03]
The semiconductor device according to [A01] or [A02], in which, assuming that a distance between a surface of the base and the channel forming layer of the second field effect transistor is a distance $L_2$, $$L_2 \geq L_1,$$
and
$$L_2 \geq T_2$$

are satisfied.

[A04]
The semiconductor device according to [A03], in which $L_2 \geq 2 \times L_1$ is satisfied.

[A05]
The semiconductor device according to any one of [A01] to [A04], in which, assuming that a thickness of each of the gate insulation films of the first field effect transistor is a thickness $T_1$, $$T_2 \geq 2 \times T_1$$

is satisfied.

[A06]
The semiconductor device according to any one of [A01] to [A05], in which, assuming that a thickness of each of the channel portions is $T_{1\text{-}CH}$ and that a thickness of the channel forming layer is $T_{2\text{-}CH}$, $$T_{2\text{-}CH} \geq 2 \times T_{1\text{-}CH}$$

is satisfied.

[A07]
The semiconductor device according to any one of [A01] to [A06], in which at least a part of a channel portion in a lowermost layer constituting the first field effect transistor is surrounded by a first gate electrode, and a channel portion other than the channel portion in the lowermost layer is surrounded by a second gate electrode.

[A08]
The semiconductor device according to any one of [A01] to [A07], in which the second field effect transistor includes an n-channel type field effect transistor and a p-channel type field effect transistor,
a channel forming layer of the n-channel type field effect transistor includes silicon, and
a channel forming layer of the p-channel type field effect transistor includes silicon or silicon-germanium.

[A09]
The semiconductor device according to any one of [A01] to [A08], in which
the first field effect transistor includes an n-channel type field effect transistor and a p-channel type field effect transistor,
a channel portion of the n-channel type field effect transistor includes silicon, and
a channel portion of the p-channel type field effect transistor includes silicon-germanium, germanium, or InGaAs.

[B01]<<Semiconductor Device: Second Aspect>>
A semiconductor device including:
a base;
a first field effect transistor that includes at least two channel structure portions laminated, the channel structure portions each including a channel portion that has a nanowire structure or a nanosheet structure, a gate insulation film that surrounds the channel portion, and a gate electrode that surrounds at least a part of the gate insulation film; and a second field effect transistor that includes a channel forming layer, a gate insulation layer formed on a top surface and a side surface of the channel forming layer, and a gate electrode formed on at least a top surface of the gate insulation layer, in which the first field effect transistor and the second field effect transistor are provided above the base, the channel portions of the first field effect transistor are disposed apart from each other in a laminating direction of the channel structure portions, and an insulation material layer is formed between a surface of the base and a bottom surface of the channel forming layer constituting the second field effect transistor.

[B02]

The semiconductor device according to [B01], in which reverse bias is applied to the base at a portion facing the bottom surface of the channel forming layer via the insulation material layer.

[B03]

The semiconductor device according to [B01] or [B02], in which, assuming that a thickness of each of the channel portions is $T_{1-CH}$ and that a thickness of the insulation material layer is $T_{Ins}$, $$0.2 \le T_{1-CH}/T_{Ins} \le 2$$

is satisfied.

[B04]

The semiconductor device according to any one of [B01] to [B03], in which at least one semiconductor layer is formed between the channel forming layer and the insulation material layer in the second field effect transistor.

[B05]

The semiconductor device according to [B04], in which an interlayer insulation layer is formed between the channel forming layer and the semiconductor layer and between the semiconductor layers.

[B06]

The semiconductor device according to [B04] or [B05], in which the semiconductor layer has a conductivity type opposite to a conductivity type of the channel forming layer.

REFERENCE SIGNS LIST 10n, 10p First field effect transistor, 11n, 11p Channel structure portion, 12n, 12p Nanowire structure, 13n, 13p Channel portion, 14 Gate insulation film, 14' First insulation layer, 15, 15₁, 15₂ Part of gate insulation film (lower layer of gate insulation film), 15' First insulation lower layer, 16 Remaining part of gate insulation film (upper layer of gate insulation film), 16' First insulation upper layer, 17n, 17p Gate electrode, 18n 18p Source/drain region, 19 Conductive material layer, 20n, 20p Second field effect transistor, 23n, 23p Channel forming layer, 24 Gate insulation layer, 24' Second insulation layer, 25, 25₁, 25₂ Part of gate insulation layer (lower layer of gate insulation layer), 25' Second insulation lower layer, 26 Remaining part of gate insulation layer (upper layer of gate insulation layer), 26' Second insulation upper layer, 27n, 27p Gate electrode, 28n, 28p Source/drain region, 29 Conductive material layer, 30 Base, 31 First region, 32 Second region, 33 Third region, 34 Fourth region, 41 First Si—Ge layer, 42 First Si layer, 43 Second Si—Ge layer, 44 Second Si layer, 45 Third Si—Ge layer, 46 Third Si layer, 47 Fourth Si—Ge layer, 51 Mask layer, 52 Dummy gate portion, 53 Side wall, 54n Phosphor-doped SiC layer, 54p Boron-doped Si—Ge layer, 61 Semiconductor layer, 64 Insulation material layer, 65 Interlayer insulation layer, 70 Element separation region, 71 Insulation material

What is claimed is:

1. A semiconductor device, comprising:
a base;
a first field effect transistor that includes at least two laminated channel structure portions, each laminated channel structure portion including a channel portion; and
a second field effect transistor that includes a channel forming layer, a gate insulation layer formed on a top surface and a side surface of the channel forming layer, and a gate electrode formed on at least a top surface of the gate insulation layer,
wherein the first field effect transistor and the second field effect transistor are provided above the base,
wherein each channel portion of the first field effect transistor is disposed apart from one another in a laminating direction of the at least two laminated channel structure portions,
wherein an insulation material layer is formed between a surface of the base and a bottom surface of the channel forming layer constituting the second field effect transistor, and
wherein assuming that a thickness of each channel portion of the first field effect transistor is T1-CH and that a thickness of the insulation material layer is TIns, $$0.5 \le T1-CH/TIns \le 1$$

is satisfied.

2. The semiconductor device according to claim 1, wherein at least one semiconductor layer is formed between the channel forming layer and the insulation material layer in the second field effect transistor.

3. The semiconductor device according to claim 2, wherein an interlayer insulation layer is formed between the channel forming layer and the at least one semiconductor layer.

4. The semiconductor device according to claim 2, wherein the at least one semiconductor layer has a conductivity type opposite to a conductivity type of the channel forming layer.

5. The semiconductor device according to claim 1, wherein each channel portion of the first field effect transistor is at least partially surrounded by a corresponding gate insulation film.

6. The semiconductor device according to claim 1, wherein each channel portion of the first field effect transistor has a nanowire structure.

7. The semiconductor device according to claim 1, wherein each channel portion of the first field effect transistor is at least partially surrounded by a corresponding gate insulation film.

8. The semiconductor device according to claim 7, wherein a gate electrode surrounds at least a part of each corresponding gate insulation film.

9. A semiconductor device, comprising:

a base;

a first field effect transistor that includes at least two laminated channel structure portions, each laminated channel structure portion including a channel portion that has a nanowire structure or a nanosheet structure, a gate insulation film that surrounds the channel portion, and a gate electrode that surrounds at least a part of the gate insulation film; and a second field effect transistor that includes a channel forming layer, a gate insulation layer surrounding the channel forming layer, and a gate electrode surrounding at least a part of the gate insulation layer, wherein the first field effect transistor and the second field effect transistor are provided above the base, wherein each channel portion of the first field effect transistor are disposed apart from each other in a laminating direction of the at least two laminated channel structure portions, and wherein assuming that each of a distance between the channel portions of the first field effect transistor is a distance L1 and that a distance between a surface of the base and the channel forming layer of the second field effect transistor is a distance L2, $$L2 \geq L1$$

is satisfied.

10. The semiconductor device according to claim 9, wherein assuming that a thickness of the gate insulation layer of the second field effect transistor is a thickness T2, $$T2 \geq (L1/2)$$

is satisfied.

11. The semiconductor device according to claim 10, wherein $T2 \geq 1.1 \times (L1/2)$ is satisfied.

12. The semiconductor device according to claim 10, wherein $L2 \geq T2$ is satisfied.

13. The semiconductor device according to claim 9, wherein the second field effect transistor includes an n-channel type field effect transistor and a p-channel type field effect transistor, wherein a channel forming layer of the n-channel type field effect transistor includes silicon, and wherein a channel forming layer of the p-channel type field effect transistor includes silicon or silicon-germanium.

14. The semiconductor device according to claim 9, wherein the first field effect transistor includes an n-channel type field effect transistor and a p-channel type field effect transistor, wherein a channel portion of the n-channel type field effect transistor includes silicon, and wherein a channel portion of the p-channel type field effect transistor includes silicon-germanium, germanium, or InGaAs.

15. A semiconductor device, comprising:

a base;

a first field effect transistor including at least two laminated channel structure portions, each laminated channel structure portion including a channel portion that has a nanowire structure or a nanosheet structure, a gate insulation film that surrounds the channel portion, and a gate electrode that surrounds at least a part of the gate insulation film; and a second field effect transistor including a channel forming layer, a gate insulation layer formed on a top surface and side surfaces of the channel forming layer, and a gate electrode formed on at least a top surface of the gate insulation layer; and an insulation material layer formed between the base and a bottom surface of the channel forming layer of the second field effect transistor, wherein reverse bias is applied to the base at a portion facing the bottom surface of the channel forming layer of the second field effect transistor via the insulation material layer.

* * * * *